(12) United States Patent
Shimizu et al.

(10) Patent No.: US 8,299,507 B2
(45) Date of Patent: Oct. 30, 2012

(54) SEMICONDUCTOR DEVICE

(75) Inventors: Tatsuo Shimizu, Tokyo (JP); Atsuhiro Kinoshita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 12/714,841

(22) Filed: Mar. 1, 2010

(65) Prior Publication Data

US 2010/0224916 A1    Sep. 9, 2010

(30) Foreign Application Priority Data

Mar. 9, 2009 (JP) ................................. 2009-055183

(51) Int. Cl.
  H01L 29/78  (2006.01)
(52) U.S. Cl. ........ 257/288; 257/368; 257/532; 257/734; 257/E29.343
(58) Field of Classification Search .................. 257/288, 257/368, 532, 734, E29.343, E29.116
See application file for complete search history.

(56) References Cited

U.S. PATENT DOCUMENTS

| | | | |
|---|---|---|---|
| 2007/0049054 A1* | 3/2007 | Ahn et al. ..................... | 438/785 |
| 2008/0217680 A1 | 9/2008 | Shimizu et al. | |
| 2008/0237697 A1 | 10/2008 | Shimizu et al. | |
| 2008/0237699 A1 | 10/2008 | Shimizu et al. | |
| 2009/0166710 A1 | 7/2009 | Shimizu et al. | |
| 2009/0200616 A1 | 8/2009 | Shimizu et al. | |
| 2009/0242970 A1 | 10/2009 | Shimizu et al. | |

FOREIGN PATENT DOCUMENTS

JP    2006-100387    4/2006

OTHER PUBLICATIONS

Tomonori Nishimura, et al., "Control of Fermi-Level Pinning at Metal/Germanium Interface by Inserting Ultra-thin Oxides", Ext. Abst. International Symposium on Control of Semiconductor Interface 2007, pp. 67-68.

* cited by examiner

*Primary Examiner* — Cuong Q Nguyen
*Assistant Examiner* — Tran Tran
(74) *Attorney, Agent, or Firm* — Oblon, Spivak, McClelland, Maier & Neustadt, L.L.P.

(57) ABSTRACT

It is made possible to optimize the effective work function of the metal for a junction and suppress the resistance as far as possible at the interface between a semiconductor or a dielectric material and a metal. A semiconductor device includes: a semiconductor film; a Ti oxide film formed on the semiconductor film, and including at least one element selected from the group consisting of V, Cr, Mn, Fe, Co, Ni, Nb, Mo, Tc, Ru, Rh, Pd, Ta, W, Re, Os, Ir, and Pt; and a metal film formed on the Ti oxide film.

17 Claims, 44 Drawing Sheets

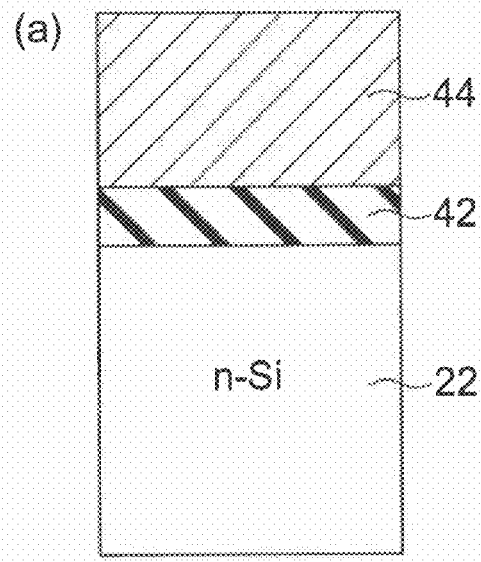
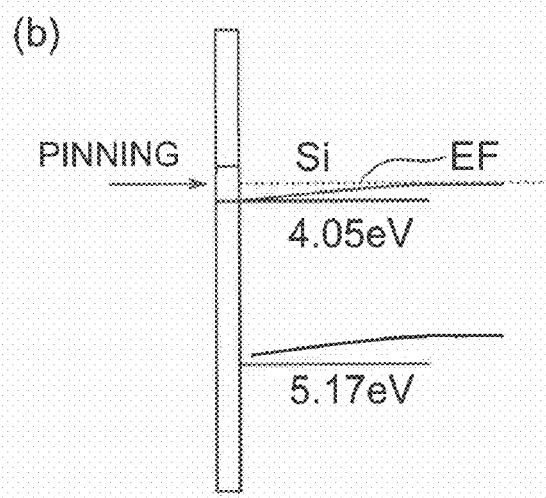
FIG. 22

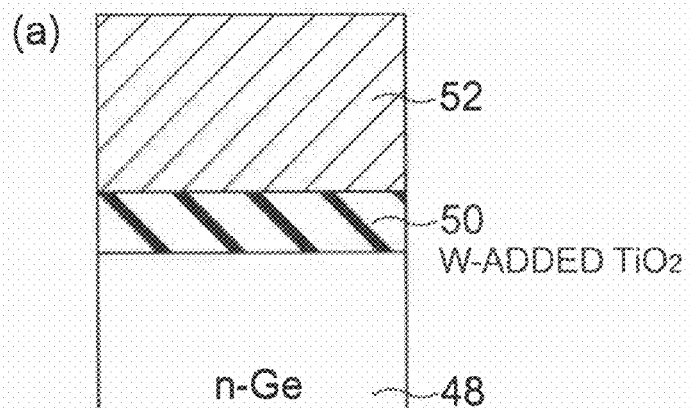
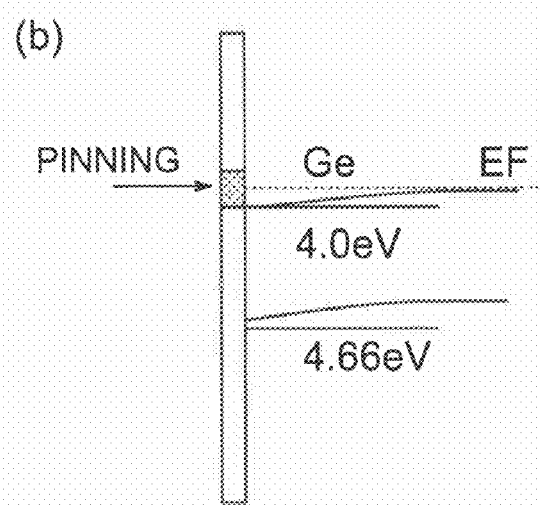
FIG. 25

(a) WITHOUT INTERFACIAL CONTROL OXIDE FILMS
⇒ POOR RETENTION PROPERTIES
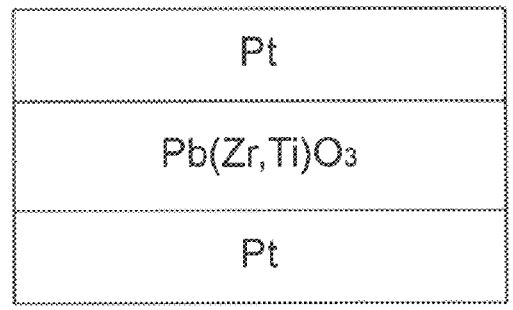
(b)
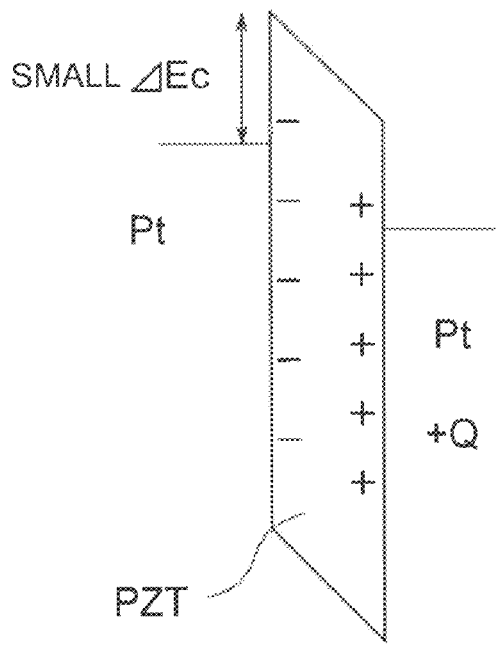
FIG. 44

WITH INTERFACIAL CONTROL OXIDE FILMS
⇒ GREATLY-IMPROVED RETENTION PROPERTIES
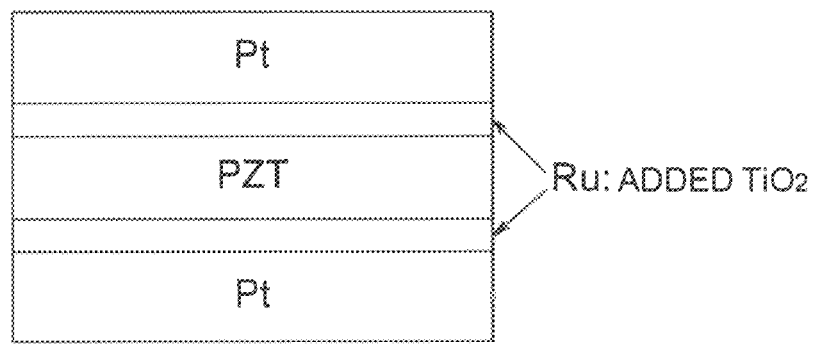
(a)
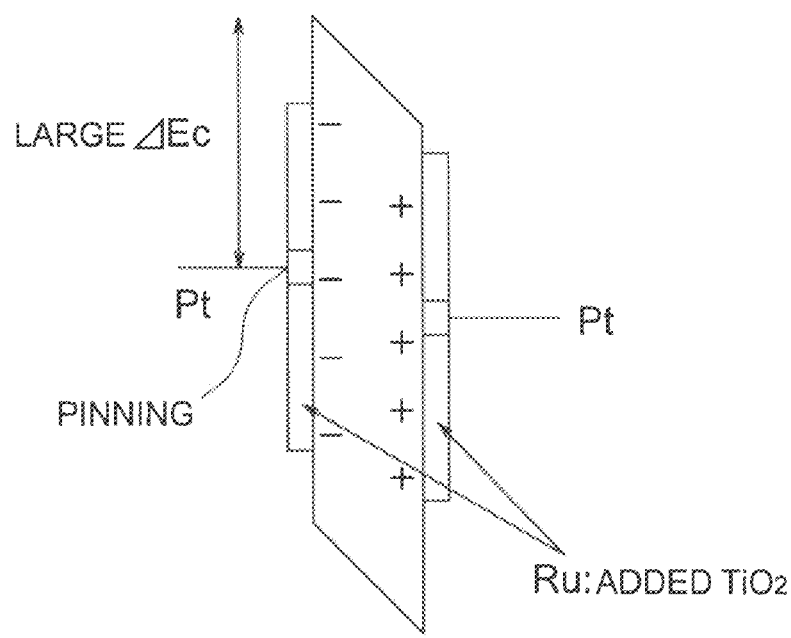
(b)
FIG. 45

WITHOUT INTERFACIAL CONTROL OXIDE FILMS
(a) 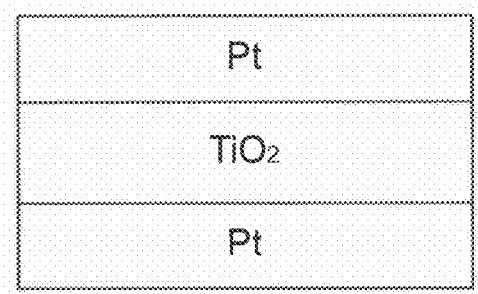
(b) 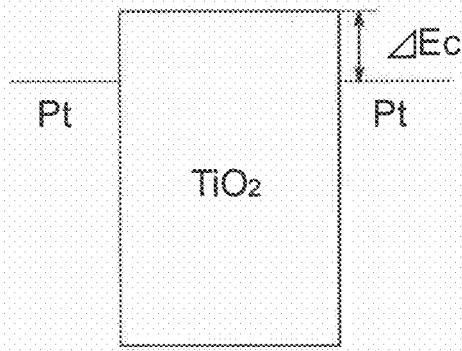
FIG. 46

WITH INTERFACIAL CONTROL OXIDE FILMS
(a) 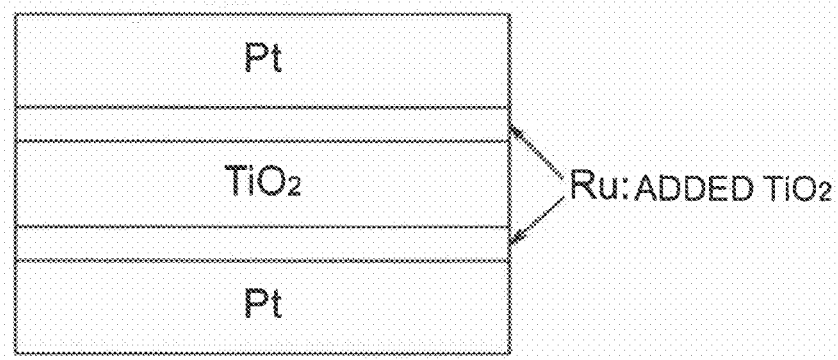
(b) 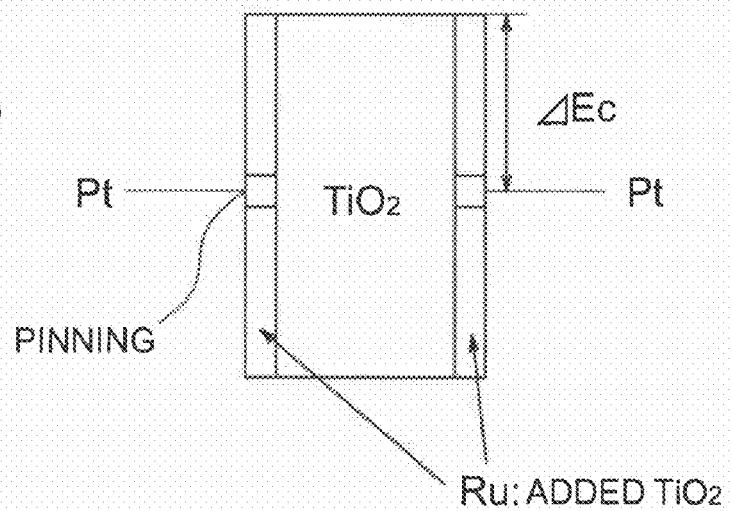
FIG. 47

SEMICONDUCTOR DEVICE

CROSS-REFERENCE TO RELATED APPLICATION

This application is based upon and claims the benefit of priority from prior Japanese Patent Application No. 2009-55183 filed on Mar. 9, 2009 in Japan, the entire contents of which are incorporated herein by reference.

BACKGROUND

1. Technical Field

The present invention relates to a semiconductor device.

2. Related Art

The major portion of power consumption in a MISFET (metal insulator semiconductor field effect transistor) is caused by the contact resistance between a source/drain and a metal. This is because a Schottky barrier is formed at the interface between the semiconductor and the metal, and the barrier becomes electric resistance. In recent years, the contact resistance accounts for a large proportion of the power consumption by a MISFET, and a decrease of the contact resistance is required.

To solve this problem, a thin insulating film of 2 nm or less made of silicon nitride, silicon oxide, silicon oxynitride, HfO, HfSiO, HfSiON, or the like is inserted to the interface between a Si substrate and the metal formed on the Si substrate, so that the interaction between the Si and the metal is reduced, thereby the Schottky barrier being lowered (see JP-A 2006-100387 (KOKAI), for example). In such a case, the resistance generated by the Schottky barrier becomes lower, but carriers tunnel through the thin insulating film. As a result, the tunnel barrier becomes new resistance.

Even though the pinning by MIGS (metal induced gap states) is eliminated by the thin insulating film at the interface, the new resistance generated by the tunnel barrier is added, and because of that, realization of low contact resistance is restricted. Furthermore, since the work function of a metal is determined by the type of the metal, the work function cannot be flexibly controlled.

Likewise, a thin insulating film such as a germanium oxide film of 0.6 nm in thickness or an aluminum oxide film of 2.2 nm in thickness is inserted to the interface between a Ge substrate and the metal formed above the Ge substrate, so that the interaction between the Ge and the metal is reduced, the Schottky barrier being lowered (as disclosed by T. Nishimura et al., in "Ext. Abst. International symposium on control of semiconductor interface (p.p. 67-68), 2007", for example). By virtue of this thin insulating film, the position of the pinning by the MIGS (metal induced gap states) is successfully changed. However, the effective work function is adjusted only to 4.2 eV, as opposed to the target value of 4.0 eV. In this case, the resistance generated by the Schottky barrier becomes lower, but carrier electrons tunnel through the thin insulating film. As a result, the tunnel barrier forms new resistance. By the technique disclosed by T. Nishimura et al., in "Ext. Abst. International symposium on control of semiconductor interface (p.p. 67-68), 2007", the position of pinning can be changed, but the work function cannot be flexibly controlled. As a result, an optimum work function cannot be achieved. Furthermore, although the Schottky barrier is lowered, the resistance due to the tunnel barrier is added. Therefore, there is a limit to realization of low contact resistance.

As described above, by the conventional techniques, the Schottky barrier is lowered by inserting a thin insulating film to the interface between a semiconductor and a metal. However, a high tunnel barrier is newly formed at the interface. This can be classified into the following two problems.

The first problem is that the junction effect between a semiconductor and a metal cannot be completely eliminated, and the position of pinning shifts. In such a case, the position of pinning does not necessarily shift toward the position of an optimum work function. For example, as disclosed in JP-A 2006-100387 (KOKAI), an effective work function of approximately 4.2 eV is obtained in a case where an oxide film is inserted to the interface between an n-type Ge and a metal. The effective work function should ideally be 4.0 eV or less, or even as small as 3.9 eV or less. However, the effective work function is fixed to 4.2 eV by this method. This value cannot be significantly changed, even if the film thickness of the oxide film to be inserted is changed, or the metal is changed. Therefore, there are no measures for improvement.

The second problem is that electrons need to tunnel through an inserted insulating thin film to let current flow. The tunnel barrier newly generates high resistance, and as a result, the power consumption becomes larger. If the insulating thin film is made too thin, the effect of shifting the position of pinning becomes smaller.

To sum up, in semiconductor devices of the next and later generations such as MOSFETs with lower power consumption, a new technique is required to optimize the effective work function and suppress generation of new resistance as far as possible.

SUMMARY

Possible embodiments of this invention are made in view of these circumstances, and some embodiments of this invention may provide a semiconductor device that can optimize the effective work function of the metal for a junction and suppress the resistance as far as possible at the interface between a semiconductor or a dielectric material and a metal.

A semiconductor device according a first aspect of the present invention includes: a semiconductor film; a Ti oxide film formed on the semiconductor film, and including at least one element selected from the group consisting of V, Cr, Mn, Fe, Co, Ni, Nb, Mo, Tc, Ru, Rh, Pd, Ta, W, Re, Os, Ir, and Pt; and a metal film formed on the Ti oxide film.

A semiconductor device according a second aspect of the present invention includes: a semiconductor film; a semiconductor source region and a semiconductor drain region formed at a distance from each other in the semiconductor film, and having a different conductivity type from the semiconductor film; a gate insulating film formed on a portion of the semiconductor film, the portion being located between the semiconductor source region and the semiconductor drain region; a gate electrode formed on the gate insulating film; a first and second Ti oxide films formed on the semiconductor source region and the semiconductor drain region respectively, and including at least one element selected from the group consisting of V, Cr, Mn, Fe, Co, Ni, Nb, Mo, Tc, Ru, Rh, Pd, Ta, W, Re, Os, Ir, and Pt; and a metal source and metal drain electrodes formed on the first and second Ti oxide films respectively.

A semiconductor device according a third aspect of the present invention includes: a semiconductor film; a metal source region and a metal drain region formed at a distance from each other in the semiconductor film; a gate insulating film formed on a portion of the semiconductor film, the portion being located between the metal source region and the metal drain region; a gate electrode formed on the gate insulating film; a first Ti oxide film formed between the portion and the metal source region, and including at least one element selected from the group consisting of V, Cr, Mn, Fe, Co, Ni, Nb, Mo, Tc, Ru, Rh, Pd, Ta, W, Re, Os, Ir, and Pt; and a second Ti oxide film formed between the portion and the metal drain region, and including at least one element selected from the group consisting of V, Cr, Mn, Fe, Co, Ni, Nb, Mo, Tc, Ru, Rh, Pd, Ta, W, Re, Os, Ir, and Pt.

A semiconductor device according a fourth aspect of the present invention includes: a capacitor that includes: a first metal film; a first Ti oxide film formed on the first metal film, and including at least one element selected from the group consisting of V, Cr, Mn, Fe, Co, Ni, Nb, Mo, Tc, Ru, Rh, Pd, Ta, W, Re, Os, Ir, and Pt; a dielectric film formed on the first Ti oxide film; a second Ti oxide film formed on the dielectric film, and including at least one element selected from the group consisting of V, Cr, Mn, Fe, Co, Ni, Nb, Mo, Tc, Ru, Rh, Pd, Ta, W, Re, Os, Ir, and Pt; and a second metal film formed on the second Ti oxide film.

DESCRIPTION OF THE DRAWINGS

FIGS. 7(a) to 12(b) are diagrams showing a semiconductor device according to an embodiment;

FIGS. 22(a) and 22(b) are diagrams showing a semiconductor device according to Example 1;

FIGS. 25(a) and 25(b) are diagrams showing a semiconductor device according to Example 2;

FIGS. 36(a) to 37(b) are cross-sectional views illustrating a procedure for manufacturing a semiconductor device according to Modification 1 of Example 5;

FIGS. 44(a) and 44(b) are diagrams for explaining a ferroelectric capacitor having no interfacial control oxide films;

FIGS. 45(a) and 45(b) are diagrams for explaining a ferroelectric capacitor according to an embodiment;

FIGS. 46(a) and 46(b) are diagrams for explaining a high-dielectric capacitor having no interfacial control oxide films; and FIGS. 47(a) and 47(b) are diagrams for explaining a high-dielectric capacitor according to an embodiment.

DETAILED DESCRIPTION

Hereafter, an embodiment of the present invention will be described more specifically with reference to the drawings.

First, the summary of an embodiment of the present invention is described in comparison to a conventional technique. More particularly, the following is a description of a technique for lowering the resistance at the junction between each source/drain region of a MIS (metal insulator semiconductor) transistor and each metal electrode connected to the source/drain regions (hereinafter also referred to as the source/drain connected metal or the source/drain metal electrode).

Figure 1:
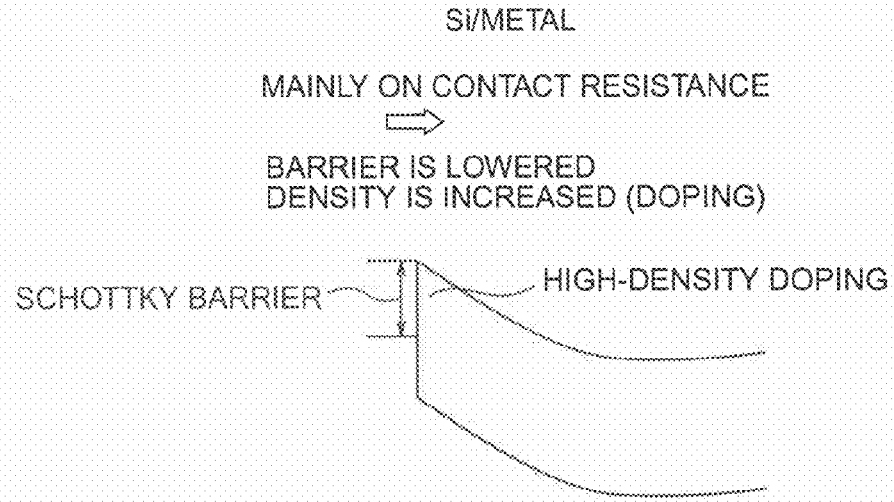
FIG. 1 is a diagram showing the general characteristics of an interface between a semiconductor and a metal.
Figure 2:
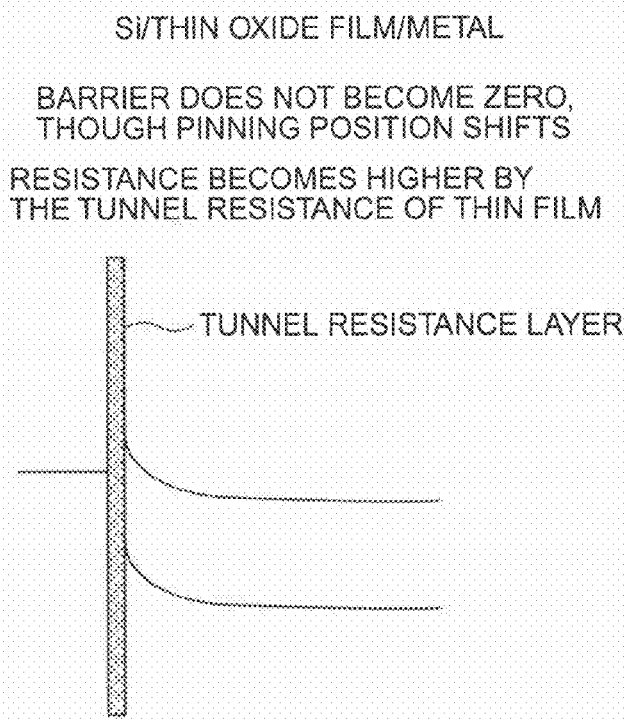
FIG. 2 is a diagram showing a conventional technique related to an interface between a semiconductor and a metal.
Figure 3:
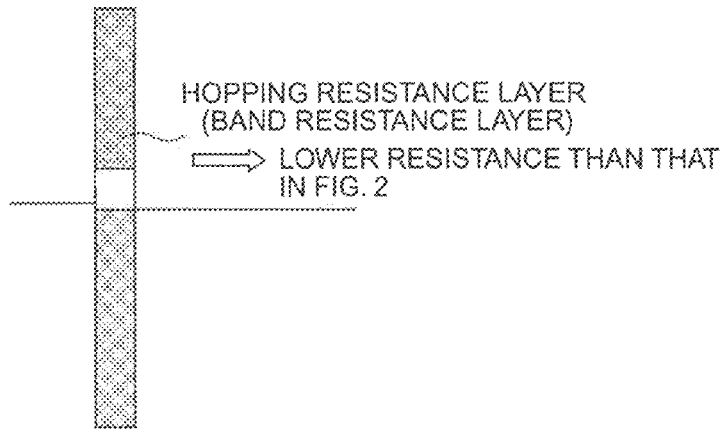
FIG. 3 is a diagram showing a technique according to an embodiment of the present invention related to an interface between a semiconductor and a metal.

FIG. 1 shows the general characteristics of the interface between a semiconductor and a metal. FIG. 2 shows the characteristics observed in a case where a thin insulating film (oxide film) is inserted to the interface between a semiconductor and a metal, as disclosed in JP-A 2006-100387 (KOKAI) or by T. Nishimura et al., in "Ext. Abst. International symposium on control of semiconductor interface (p.p. 67-68), 2007". FIG. 3 shows the characteristics observed in the embodiment of the present invention.

First, as shown in FIG. 1, a Schottky barrier appears at the interface between a semiconductor and a metal. By a suggested method, the height and thickness of the Schottky barrier are adjusted by changing the type of the metal or the type and density of the dopant in the semiconductor. Although this method is effective, it is extremely difficult to eliminate the barrier or form an ohmic junction. On the other hand, it is also difficult to increase the height of the barrier. A representative example of the junction is the junction between a source/drain region made of semiconductor Si (or Ge) and a source/drain connected metal. With this junction, a large Schottky barrier remains, and control cannot be performed freely. At present, there has been a demand for a technique by which the height of a barrier or the thickness of a barrier or the like can be controlled freely.

According to the technique by which a thin oxide film is inserted to the interface as illustrated in FIG. 2, the position of the barrier is fixed, regardless of the type of the metal. In other words, the barrier is pinned. It is considered that the pinning is caused by the bulk effect of the semiconductor. Where a thin oxide film is provided at the interface, the position of the pinning can be changed. Since the bulk effect of the semiconductor is prevented from transmitting toward the metal side by providing a thin oxide film at the interface, the position of the pinning is moved. As already disclosed by T. Nishimura et al., in "Ext. Abst. International symposium on control of semiconductor interface (p.p. 67-68), 2007", however, the position of the pinning cannot be moved freely by this method. In other words, an optimum barrier cannot be freely formed. Furthermore, a thin oxide film provided at the interface forms another barrier against electrons and holes. Such a new barrier also serves as new electric resistance (tunnel resistance), and becomes the cause of a further increase in power consumption. Therefore, a film that does not have a very small thickness cannot be used. Actually, the thickness of the oxide film used in JP-A 2006-100387 (KOKAI) is 2 nm or less, and the thickness of the oxide film used in "Ext. Abst. International symposium on control of semiconductor interface by T. Nishimura et al., (p.p. 67-68), 2007" is 2.2 nm or less.

By the technique according to this embodiment, on the other hand, a thin film made of an oxide (an oxide film) is inserted between a semiconductor and a metal, and a first additional material is introduced into this oxide film, to create a state in the energy gap, as shown in FIG. 3. A second additional material is further introduced, so as to move the energy position of the state to a desired position in the gap. The Fermi energy (the work function) of the joined metal is then pinned to the state in the gap (see FIGS. 4(a) and 4(b)). This pinning is caused by an artificially-formed interfacial state (the energy position of the state in the gap or the like). As can be seen from the formation of this interfacial state, the work function can be freely adjusted to a desired value. This is the first feature of the technique according to the embodiment of the present invention. In that sense, the oxide film having the additional materials added thereto is also referred to as an interfacial control oxide film in this specification.

In this embodiment, electrons and holes pass through the levels in the gap of the interfacial control oxide film. Since the levels in this gap form a narrow band having a certain number of states, conduction is caused in the narrow band (hopping conduction to be received in a short range). In other words, a hopping current using the overlapping of the wave functions of the levels in the gap flows. Accordingly, new and high tunnel resistance is not caused by the embodiment of the present invention, but is caused by the technique disclosed by T. Nishimura et al., in "Ext. Abst. International symposium on control of semiconductor interface (p.p. 67-68), 2007" or JP-A 2006-100387 (KOKAI).

In this embodiment, the new barrier against the carriers to pass through the interfacial control oxide film is the hopping resistance (band resistance). In comparison with the tunnel resistance shown in FIG. 2, the carrier barrier is much smaller and is almost zero. Therefore, it is safe to say that a new barrier is not formed. This aspect is the second feature of the technique according to this embodiment. According to the method by which the tunnel insulating film is sandwiched as shown in FIG. 2, the upper limit of the film thickness is considered to be 2 nm to 2.2 nm. In the embodiment, on the other hand, there is hardly a limit on film thickness. As a result, a wider process window can be secured, compared with the process window secured by the method illustrated in FIG. 2.

In this embodiment, the new barrier against the carriers to pass through the interfacial control oxide film is naturally expected to be low with a titanium-based (Ti-based) oxide film. This is because the band offset of a titanium oxide with respect to the band edge of Si (or some other semiconductor such as Ge) is originally small with respect to electrons and holes. This aspect is the third feature of the technique according to this embodiment.

The difference between tunnel resistance and hopping resistance is now supplementarily described. Tunnel resistance represents passing (tunneling) of carriers through an oxide film by virtue of overlapping of the wave functions of the states located on both sides (the semiconductor side and the metal side) of the oxide film. On the other hand, hopping resistance represents passing (hopping) of carriers through an oxide film by virtue of overlapping of the wave functions of the states located inside the oxide film (the states in the gap). When the states in the gap have large overlapping, a band is formed, and band conduction is caused. The resistance that causes band conduction will be hereinafter referred to as the band resistance. In this specification, the band conduction is regarded as a form of hopping conduction.

Figure 4:
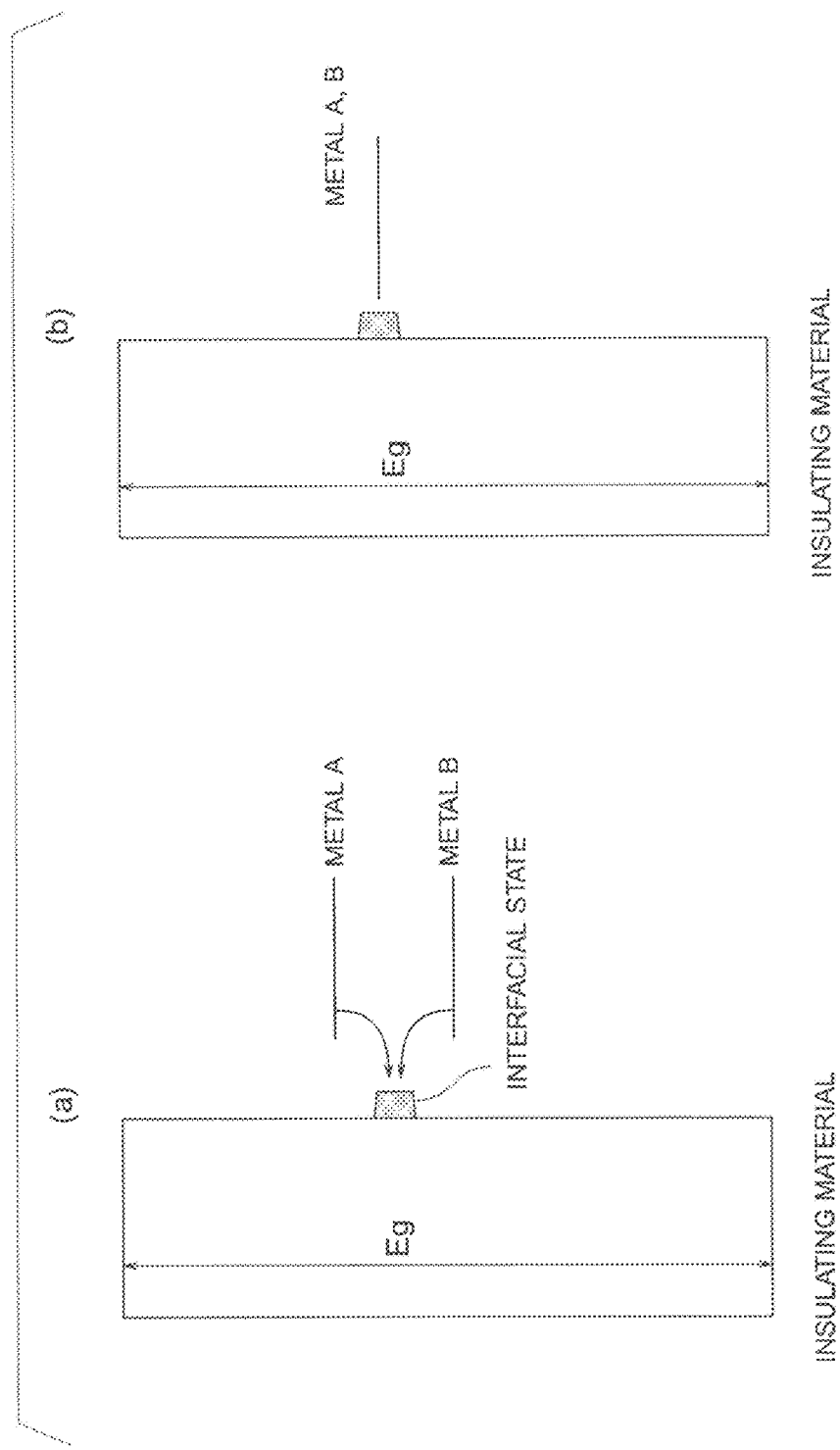
FIGS. 4(a) and 4(b) are diagrams for explaining Fermi level pinning.

Referring now to FIGS. 4(a) and 4(b), the work function control by the interfacial control oxide film is briefly described. FIGS. 4(a) and 4(b) illustrate Fermi level pinning by an interfacial state. If there is an interfacial state in the interface between an insulator and a metal, the work function of the metal is drawn to the position in which the interfacial state exists, as electrons are exchanged between the interfacial state and the contact metal. This phenomenon (caused by the interfacial state) is called "Fermi level pinning". In the case of a metal A illustrated in FIGS. 4(a) and 4(b), electrons flow from the metal side into the interfacial state, and the energy level of the metal A becomes lower. As a result, the effective work function of the metal A becomes larger. In the case of a metal B, on the other hand, electrons move from the interfacial state toward the metal B side, and the energy level of the metal B becomes higher. As a result, the effective work function of the metal B becomes smaller. In this manner, the effective work function is determined by the energy position of the interfacial state, regardless of the metal, as shown in FIG. 4(b).

Figure 5:
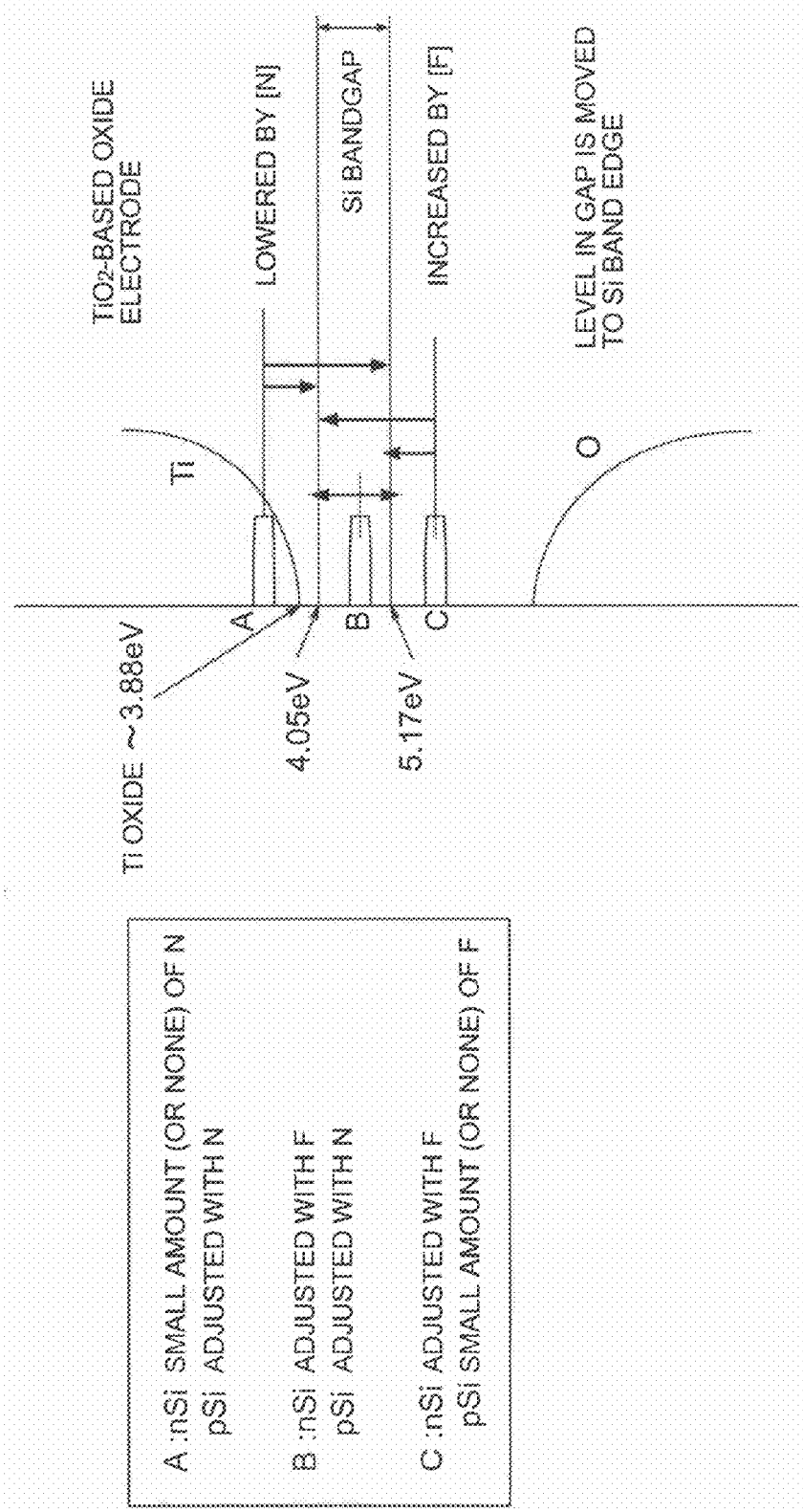
FIG. 5 is a diagram showing the energy band of a $TiO_2$-based oxide electrode.

In this embodiment, this interfacial state is artificially created in the interfacial control oxide film, and the effective work function is optimized by adjusting the energy level of the interfacial state. Referring to FIG. 5, this process is described. FIG. 5 shows the energy band of a $TiO_2$-based oxide electrode. In FIG. 5, the abscissa axis indicates the state density, and the ordinate axis indicates the energy. As shown in FIG. 5, states can be created in the gap by introducing a first additional material into $TiO_2$, which is an oxide of a first metal Ti (or some other Ti oxide such as $La_2Ti_2O_7$ or $SrTiO_3$). The first additional material is a high valence material that is pentavalent to decivalent (a second metal that has higher valency than the first metal, or at least one element selected from the group consisting of V, Cr, Mn, Fe, Co, Ni, Nb, Mo, Tc, Ru, Rh, Pd, Ta, W, Re, Os, Ir, and Pt).

As for $SrTiO_3$, however, some attention is required. The results obtained through the introduction of a high valence material are the same as the results obtained with $TiO_2$ or the like. When Sr is substituted by a trivalent element such as Sc, Y, or La, states appear at locations of 3.88 eV to 4.05 eV (the locations equivalent to the conduction band of Ti). This is equivalent to a case where Nb is added to $TiO_2$, for example. The Sr in $SrTiO_3$ is divalent, while Sc, Y, and La are each trivalent. Therefore, such electron states are formed. As for $SrTiO_3$, states can be formed at the locations of 3.88 eV to 4.05 eV, even when Sc, Y, or La is added instead of a high valence material that is pentavalent to decivalent. In other words, the range of selection of the first additional material can be made wider with a Ti oxide by the amount equivalent to Sc, Y, or La.

Furthermore, as will be described later, the energy positions of states in the gap can be changed by introducing the second additional material. More specifically, an oxide film having a desired work function can be created by artificially controlling the high valence material (the first additional material) and the second additional material. FIG. 5 shows the gap position of Si.

For a Ti oxide (such as $TiO_2$, $La_2Ti_2O_7$, or Ti silicate), at least one element selected from the group consisting of F, H, Ta, N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is the second additional material. Although Ta can be used as the first additional material, it can also be used as the second additional material for injecting electrons.

In $SrTiO_3$, on the other hand, Sc, Y, or La is the first additional material, and does not affect the states in the gap even if Sr is substituted by Ca, Sr, or Ba. Sr might be added as SrO. With such a case being inclusive, the second additional material is at least one element selected from the group consisting of F, H, Ta, N, C, B, Mg, Al, Ce, Pr, Nd, Pm, Sm, Eu, Gd, Tb, Dy, Ho, Er, Tm, Yb, and Lu, excluding Sc, Y, La, Ca, Sr, and Ba from the second additional materials for Ti oxides such as $TiO_2$.

Figure 6:
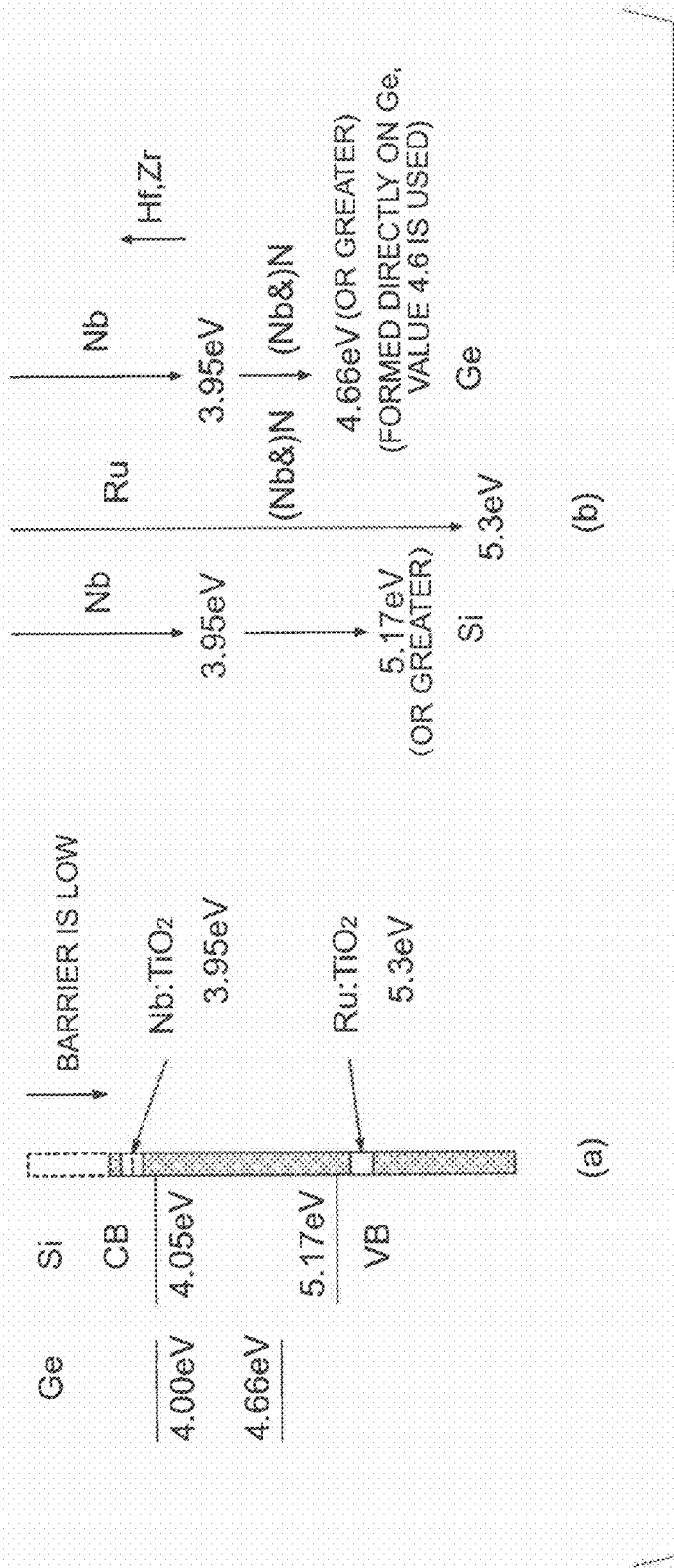
FIGS. 6(a) and 6(b) are diagrams showing the band lineup of a stacked structure formed with a semiconductor substrate and an interfacial control oxide film.

FIGS. 6(a) and 6(b) show the band lineup that has a stacked structure formed with a Si substrate or a Ge substrate and an interfacial control oxide film. For example, Nb-added $TiO_2$ is used as the interfacial control oxide film, and a state can be formed in the energy position of 3.95 eV in the work function. As shown in FIG. 6(a), the minimum of the conduction band (CB) of Si is 4.05 eV, and the minimum of the conduction band of Ge is 4.00 eV.

As shown in FIG. 6(b), a state can be formed in an energy position of 3.95 eV or lower in the work function by using $TiO_2$ having Nb and Hf (or Zr) added thereto as the interfacial control oxide film. In a Ti oxide, a conduction band originating from Ti is formed, and, when Nb is added to the Ti oxide, a state originating from Nb is formed in the neighborhood of the conduction band bottom. At this point, the states of Ti and Nb are mixed with each other, to form the conduction band bottom. The extra electrons are then introduced into the conduction band bottom formed with Ti and Nb, and a state appears at the energy position of 3.95 eV in the work function. In other words, by introducing electrons into the bottom of the conduction band, a state where electrons can be introduced and discharged is formed. When Hf or Zr is introduced here, the bottom of this conduction band becomes higher. As a result, a state appears in an energy position of 3.95 eV or lower in the work function. In this manner, the work function can be adjusted.

As shown in FIG. 6(b), when $TiO_2$ having both Nb and nitrogen (N) added thereto is used, a state in the gap can be formed in a position of 4.66 eV or higher (equivalent to the maximum of the valence band of p-type Ge) in a case where the interfacial control oxide film is formed on a Ge substrate, or in a position of 5.17 eV or higher (equivalent to the maximum of the valence band of p-type Si) in a case where the interfacial control oxide film is formed on a Si substrate, depending on the nitrogen amount. In this manner, the work function can be adjusted.

Further, as shown in FIG. 6(b), when $TiO_2$ having Ru added thereto is used, a state in the gap can be formed in a position of 4.66 eV or higher (equivalent to the maximum of the valence band of p-type Ge) in a case where the interfacial control oxide film is formed on a Ge substrate, or in a position of 5.17 eV or higher (equivalent to the maximum of the valence band of p-type Si) in a case where the interfacial control oxide film is formed on a Si substrate, depending on the nitrogen amount. In this manner, states in the gap can be formed in positions of approximately 5.3 eV in the work function.

Connection Between Source/Drain Regions of Semiconductor and Source/Drain Metal Electrodes Next, a case where the above described interfacial control oxide film is provided between each source/drain region of a semiconductor and each source/drain metal electrode is described.

n-MISFET

If an oxide film having a smaller work function than the bottom (the minimum) of the conduction band (CB) of Si can be formed, the height of the Schottky barrier at the interface can be made zero by inserting the oxide film between the n-type Si and each metal electrode. In this manner, an ohmic connection is established. Therefore, a work function of 4.05 eV or lower should be achieved. In a case where the oxide film exhibits electric conduction properties, this thin film can be used as a part of the source/drain metal electrodes. With this arrangement, an n-MISFET where the contact resistance between the source/drain regions of n-type Si and the source/drain metal electrodes is lowered, i.e. ohmic connections are established, is formed.

Figure 7:
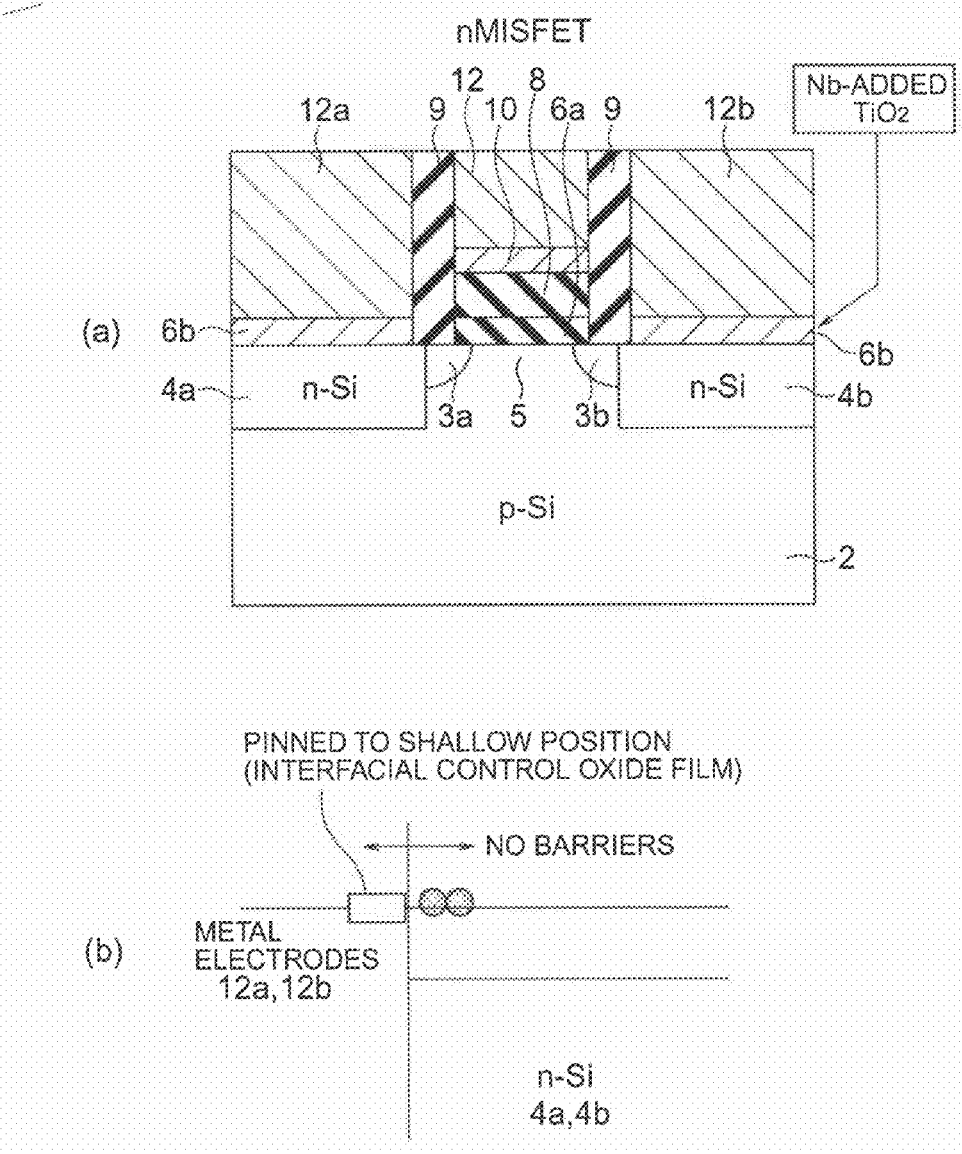

FIGS. 7(a) and 7(b) show an n-MISFET formed in the above manner. This n-MISFET includes: n-type extension regions 3a and 3b that sandwich a channel region 5 in a p-type silicon substrate 2; and n-type impurity regions 4a and 4b that have deeper junctions than the extension regions 3a and 3b. The extension region 3a and the impurity region 4a form a source region, and the extension region 3b and the impurity region 4b form a drain region. A thin $TiO_2$ film 6a, for example, is formed on the channel region 5, and a gate insulating film 8 made of $HfO_2$, for example, is formed on the $TiO_2$ film 6a. A $TiO_2$ film 10 having Nb added thereto is formed on the gate insulating film 8, and a gate electrode 12 made of W is formed on the Nb-added $TiO_2$ film 10. A $TiO_2$ film (an interfacial control oxide film) 6b having Nb added thereto is formed on each of the source/drain regions, and source/drain electrodes 12a and 12b made of W are formed on the Nb-added $TiO_2$ films 6b. The gate electrode 12 is electrically insulated from the source/drain electrodes 12a and 12b by sidewalls 9 made of an insulating material.

The $TiO_2$ film 6a and the $TiO_2$ films 6b not having Nb added yet thereto are formed at the same time, and have substantially the same film thicknesses. The addition of Nb to the $TiO_2$ films 6b is performed by forming a thin film of Nb and causing the Nb to diffuse into the $TiO_2$ films 6b prior to the formation of the source/drain electrodes 12a and 12b made of W. The $TiO_2$ film 10 having Nb added thereto may be formed by forming a thin film of Nb after the formation of the $TiO_2$ film 10 and causing the Nb to diffuse into the $TiO_2$ film 10 prior to the formation of the gate electrode 12 made of W on the $HfO_2$ gate insulating film 8. In such a case, the diffusion of Nb can be caused at the same time as the Nb diffusion into the $TiO_2$ films 6b. Alternatively, the formation of the $TiO_2$ films 6b not having Nb added thereto on the source/drain regions may not be performed at the same time as the formation of the $TiO_2$ film 6a, but may be performed at the same time as the formation of the $TiO_2$ film 10 having Nb added thereto.

In a modification, a $HfO_2$ film having Nb added thereto may be used in place of the $TiO_2$ film 10 having Nb added thereto. Further, Nb may not be added, and W may diffuse from the electrodes. More specifically, $TiO_2$ films having W added thereto may be used in place of the $TiO_2$ films 6b having Nb added thereto, and a $TiO_2$ film having W added thereto may be used in place of the $TiO_2$ film 10 having Nb added thereto. In such a case, the formation of Nb films can be omitted, and accordingly, the manufacturing process can be simplified.

As explained with reference to FIGS. 6(a) and 6(b), the Nb-added $TiO_2$ films 6b serving as the interfacial control oxide films are oxide films each having a smaller work function than the lower edge of the conduction band. Accordingly, the height of the Schottky barriers at the interfaces between the source/drain regions of n-type Si and the source/drain metal electrodes 12a and 12b can be made zero (FIG. 7(b)).

Also, the Nb-added $TiO_2$ films 6b may not be formed, but the $HfO_2$ gate insulating film 8 may be nitrided, to form a HfON gate insulating film 8. With the use of the HfON gate insulating film 8, nitrogen is introduced into the interfacial control oxide films, so that the effective work function can shift toward the larger side. In this manner, various modifications can be made with the use of the materials mentioned in this embodiment of the present invention, based on the mechanism according to this embodiment of the present invention. It suffices only to select optimum materials from those materials.

In a case where HfON is used for the gate insulating film 8, and a $TiO_2$ film is not formed on the HfON, a HfON film 10 having Nb added thereto is formed at the interface between the gate insulating film 8 and the gate electrode 12. Here, by controlling the nitrogen amount, the work function of the gate electrode 12 can be reset to a larger value. Although this is merely an example, shifting the work function of the gate electrode 12 is effective in optimizing the threshold value of the transistor.

p-MISFET

Likewise, if an oxide film having a larger work function than the top (the maximum) of the valence band (VB) of Si can be formed, the height of the Schottky barrier at the interface can be made zero by inserting the oxide film between the p-type Si and each metal electrode. In this manner, an ohmic connection is established. Therefore, it suffices only to achieve a work function of 5.17 eV or higher. In a case where the oxide film exhibits electric conduction properties, this thin film can be regarded as part of the source/drain metal electrodes. With this arrangement, a p-MISFET of which the contact resistance between the source/drain regions of p-type Si is greatly lowered, i.e. ohmic connections are established, is formed.

Figure 8:
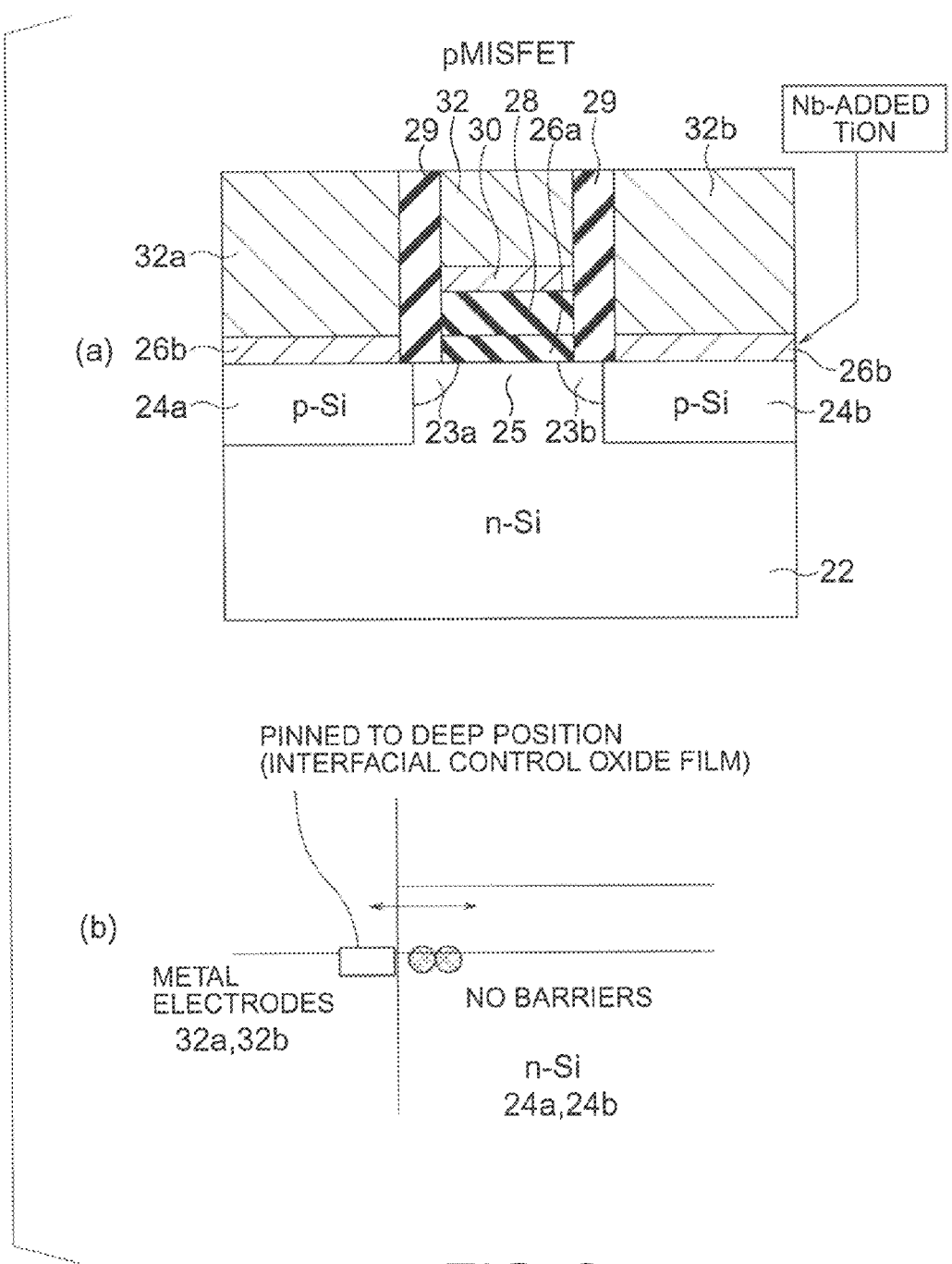

FIGS. 8(a) and 8(b) show a p-MISFET formed in the above manner. This p-MISFET includes: p-type extension regions 23a and 23b that sandwich a channel region 25 in an n-type silicon substrate 22; and p-type impurity regions 24a and 24b that have deeper junctions than the extension regions 23a and 23b. The extension region 23a and the impurity region 24a form a source region, and the extension region 23b and the impurity region 24b form a drain region. A thin TiON film 26a, for example, is formed on the channel region 25, and a gate insulating film 28 made of HfON, for example, is formed on the TiON film 26a. A TiON film 30 having Nb added thereto is formed on the gate insulating film 28, and a gate electrode 32 made of W is formed on the Nb-added TiON film 30. A TiON film (an interfacial control oxide film) 26b having Nb added thereto is formed on each of the source/drain regions, and source/drain electrodes 32a and 32b made of W are formed on the Nb-added TiON films 26b. The gate electrode 32 is electrically insulated from the source/drain electrodes 32a and 32b by sidewalls 29 made of an insulating material.

The TiON film 26a and the TiON films 26b not having Nb added yet thereto are formed substantially at the same time, and have substantially the same film thicknesses. As for the TiON films 26b not having Nb added yet thereto, nitrogen ions may be implanted only into the TiON films 26b with the use of a resist having openings at the regions of the source/drain, or a large amount of nitrogen may be introduced into the TiON films 26b through diffusion of nitrogen from a nitrogen atmosphere or the like. Alternatively, a stacked structure formed with a NbN electrode and a W electrode may be used as each of the source/drain electrodes 32a and 32b, so as to introduce a larger amount of nitrogen. The amount of nitrogen is adjusted so that the connections with the source/drain regions 24a and 24b become Schottky junctions. The addition of Nb to the TiON films 26b is performed by forming a thin film of Nb and causing the Nb to diffuse into the TiON film 26b prior to the formation of the source/drain electrodes 32a and 32b made of W.

The TiON film 30 having Nb added thereto is formed prior to the formation of the W gate electrode 32 on the HfON gate insulating film 28. As explained with reference to FIGS. 6(a) and 6(b), the Nb-added TiON films 26b serving as the interfacial control oxide films are oxide films each having a larger work function than the maximum of the valence band. Accordingly, the height of the Schottky barriers at the interfaces between the source/drain regions of p-type Si and the source/drain metal electrodes 32a and 32b can be made zero (FIG. 8(b)).

If a TiON film having Nb nitrided by a large amount and added thereto is formed as an interfacial layer on the gate insulating film, a TiON film 30 having Nb added thereto is formed at the interface between the gate insulating film 28 and the gate electrode 32. Here, by controlling the amount of nitrogen, the work function of the gate electrode 32 can be freely set. Although this is merely an example, shifting the work function of the gate electrode 32 is effective in optimizing the threshold value of the transistor.

As a modification of the above described process, only the gate insulating film may be formed first, and a Nb-added TiON film may be formed on the gate insulating film. In such a case, the TiON film between the gate insulating film and the channel is unnecessary.

As the interfacial control oxide film between the gate insulating film and the gate electrode, it is effective to use a HfO$_2$-based interfacial layer. In such a case, the interfacial control oxide films used for adjusting the source/drain portions and the interfacial control oxide film for adjusting the effective work function of the gate metal do not need to have the same base material. A Hf-based oxide or a Zr-based oxide is supposedly effective as the gate insulating film portion. Therefore, a gate insulating film can be effectively used as the interfacial control oxide film for adjusting the effective work function of the gate electrode. On the other hand, a TiO$_2$-based oxide is expected to form a low barrier against electrons and holes originally. Because of this, using a TiO$_2$-based oxide is beneficial in lowering the resistance.

Although the addition of Nb has been described so far, other materials may be used to achieve the same effects. Particularly, a material suitable as an electrode material, such as W, TaN, HfN, RuO, NiSi, PtSi, PdSi, NiPtSi, or NiPdSi, can create a state having an appropriate work function value by causing W, Ta, Hf, Ru, Ni, Pt, or Pd to diffuse into the TiO$_2$ film or TiON film. In short, it suffices only to form a structure formed with a semiconductor, TiON, and an electrode and reform the thin TiO$_2$ film at the interface through a thermal process. For example, in the case of TiON having W added thereto, an electrode formed with Si, TiON, and W is prepared, and a structure having an electrode formed with TiON having Si and W added thereto and W is simply created through a thermal process.

As described above, the contact resistance between the source/drain regions of a semiconductor and the source/drain metal electrodes can be greatly lowered in an n-MISFET and a p-MISFET. This technique may be applied to one of the n-MISFET and the p-MISFET, or may be applied to a CMIS structure.

Application to Memory Cell Structure

This technique can be applied to a floating gate (FG) memory having a NAND string formed by arranging MISFETs of one of the two types as the basic cells in a row, or to a MONOS (Metal-Oxide-Nitride-Oxide-Semiconductor) memory having such a NAND string. This technique can also be applied to a FG memory having a NOR structure and a MONOS memory having a NOR structure. Here, there is hardly a limit on the respective films forming each basic cell in FG memories or MONOS memories. For example, a silicon nitride film is normally used as the charge storage film in which the charges of the basic cells of a MONOS memory are stored, but a SrTiO$_3$ film or the like having Ru added thereto may be used. Although a SiO$_2$ film is normally used as the tunnel film through which electrons tunnel, a SiON film or a stacked film formed with a SiO$_2$ film, a Si$_3$N$_4$ film, and a SiO$_2$ film may be used instead, for example. In other words, a structure according to the embodiment of the present invention is used to form the source/drain regions of a semiconductor and the source/drain metal electrodes of each basic cell of a MISFET type. In this manner, the contact resistance at the connecting portions can be greatly lowered, and a memory that consumes less electric power can be realized.

The NAND string includes a structure that does not need to connect the source/drain regions of the semiconductor to the source/drain metal in each basic cell. Therefore, this technique should be applied only to relevant portions. NOR and NAND memories having different structures can be considered, as long as the contact resistance between the source/drain regions of the semiconductor and the source/drain metal is low, regardless of the power consumption of those portions. With this development being into consideration, controlling the contact resistance is beneficial. For example, two memory cells are aligned to share a source region. A right-side drain and a left-side drain are formed on both sides, and data is stored in both the right-side memory cell and the left-side memory cell. Those two cells may form one cell holding four values. In such a case, it is necessary to detect a drain current. However, since low-resistance contact is already realized, memory cells that consume less electric power can be formed. This structure can be formed not only by holding the four value of two bits on the left side and two bits on the right side, but also by storing data in four directions (16 values, two bits in each direction) or stacking values in a vertical direction.

Ge Substrate

This embodiment is a technique for controlling the junctions at the interface between a semiconductor and a metal. A case where this technique is applied to a CMIS structure having a Ge substrate is now described. At present, the work function is pinned to 4.6 eV when Ge and a metal are connected. Ideally, the work function should be 4.66 eV or greater in the case of p-type Ge, and should be 4.0 eV or less in the case of n-type Ge. For p-type Ge, this pinning position (4.6 eV) is used. For an n-type Ge substrate, the work function is pinned to 4.0 eV or lower by the technique according to the embodiment of the present invention. In this manner, applying this technique only to the n-MISFET side is also effective. For example, as shown in FIGS. 6(a) and 6(b), with the use of TiO$_2$ having Nb added thereto, the effective work function can be pinned to a work function position in the neighborhood of 3.95 eV. When an n-MISFET having n-type Ge source and drain is formed, a TiO$_2$ film having Nb added thereto is inserted as an interfacial control oxide film into each junction with the source/drain electrodes made of W. In a p-MISFET having p-type Ge source and drain regions, without inserting interfacial control oxide films, the effect to pin the work function to 4.6 eV can be utilized as it is.

In a modification of the p-MISFET having the p-type Ge source/drain regions, TiO$_2$ films having both Nb and N added thereto are used as the interfacial control oxide films, and it becomes possible to form source/drain metal electrodes having a larger effective work function than the effective work function (4.6 eV) obtained in a case where interfacial control oxide films are not inserted. Although the addition of N has been described as an example here, the same effect as above to make the effective work function greater can be achieved by adding an element selected from the group consisting of C, B, Mg, Ca, Sr, Ba, Al, Sc, Y, La, and lanthanoids (Ce, Pr, Nd, Pm, Sm, Eu, Gd, Tb, Dy, Ho, Er, Tm, Yb, and Lu), as will be described later.

Summary of n-MIS

In a modification of the n-MISFET having the n-type Ge source/drain regions, the effective work function can be pinned to a work function position in the neighborhood of 3.95 eV by using TiO$_2$ films having at least one of Nb, Ta, and W added thereto as the interfacial control oxide films. The effective work function can be made even smaller by adding at least one material selected from the group consisting of F, H, and Ta. As will be described later, the work function might be too small in cases where an effective work function of 4.05 eV to 4.15 eV is required between the gate insulating film and the gate electrode, or the optimum effective work function is approximately 4.05 eV when a different substrate is used, for example. In such cases, the effective work function can be made greater by adding an element selected from the group consisting of N, C, B, Mg, Ca, Sr, Ba, Al, Sc, Y, La, and lanthanoids (Ce, Pr, Nd, Pm, Sm, Eu, Gd, Tb, Dy, Ho, Er, Tm, Yb, and Lu).

In a modification of the n-MISFET having the n-type Ge source/drain regions, at least one element selected from the group consisting of V, Cr, Mn, Fe, Co, Ni, Mo, Tc, Ru, Rh, Pd, Re, Os, Ir, and Pt, and at least one element selected from the group consisting of F, H, and Ta are added to the $TiO_2$ films serving as the interfacial control oxide films. The effective work function might become too large only with the former element. Therefore, the effective work function can be made smaller by introducing the latter element as needed.

Although Ti-based oxides such as $TiO_2$, $La_2Ti_2O_7$, and TiSiO (Ti silicate) have been described so far, $SrTiO_3$ can be used in place of a Ti-based oxide. In such a case, the addition of La, Y, or Sc differs from the addition performed in a case where a Ti-based oxide is used, and therefore, it is explained in the following.

A case of the above described n-MISFET having the n-type Ge source/drain regions is described. The effective work function can be pinned to a work function position in the neighborhood of 3.95 eV with the use of interfacial control oxide films that are $SrTiO_3$ films to which at least one element selected from the group consisting of La, Y, Sc, Nb, Ta, and W is added.

Here, the effective work function can be made even smaller by adding at least one material selected from the group consisting of F, H, and Ta. Also, as will be described later, the work function might be too small in cases where an effective work function of 4.05 eV to 4.15 eV is required between the gate insulating film and the gate electrode, or the optimum effective work function is approximately 4.05 eV when a different substrate is used, for example. In such cases, the effective work function may be made greater by adding an element selected from the group consisting of N, C, B, Mg, Al, and lanthanoids (Ce, Pr, Nd, Pm, Sm, Eu, Gd, Tb, Dy, Ho, Er, Tm, Yb, and Lu).

In some cases, at least one element selected from the group consisting of V, Cr, Mn, Fe, Co, Ni, Mo, Tc, Ru, Rh, Pd, Re, Os, Ir, and Pt, and at least one element selected from the group consisting of La, Y, Sc, F, H, and Ta may be added to the $SrTiO_3$ films serving as the interfacial control oxide films. The effective work function might become too large only with the former element. Therefore, the effective work function can be made smaller by introducing the latter element as needed.

The connections between the source/drain regions made of semiconductor n-type Ge and the source/drain metal electrodes in an n-MISFET have been summed up above. However, the above concept can be applied not only to a Ge substrate but also to semiconductor substrates of various materials (such as Si, Ge, SiGe, SiC, GaAs, InP, InAs, GaInAs, GaN, and GaInN), and have high extensibility.

The above concept can also be applied to the junctions between the channel region and metal source/drain regions of a semiconductor described later. More specifically, in an n-MISFET, the above described interfacial control oxide films can be used at the connection interfaces between the p-type Ge channel and the metal source/drain regions. The p-type channel region is connected to the metal, and the effective work function is made sufficiently smaller by virtue of the above-described interfacial control oxide films. When the channel region is in a closed state (an OFF state), the barrier against holes is high, whereby the off-leakage becomes extremely small. When the channel region is in an open state (an ON state), or when a reversal to an n-type is caused, a barrier against electrons hardly exists and the resistance at the connection is lowered, whereby ohmic connections are realized with low resistance.

Summary of p-MIS

In a modification of the above described p-MISFET having the p-type Ge source/drain regions, the interfacial control oxide films are $TiO_2$ films to which at least one element selected from the group consisting of Ta, Nb, W, and Mo, and at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu are both added. With this arrangement, it is possible to form source/drain metal electrodes having a larger effective work function than the effective work function (4.6 eV) achieved in a case where interfacial control oxide films are not inserted.

Alternatively, $TiO_2$ films to which at least one element selected from the group consisting of V, Cr, Mn, Fe, Co, Ni, Tc, Ru, Rh, Pd, Re, Os, Ir, and Pt is added may be used as the interfacial control oxide films. With this arrangement, it is possible to form source/drain metal electrodes having a larger effective work function than the effective work function (4.6 eV) achieved in a case where interfacial control oxide films are not inserted.

In a case where the effective work function becomes too large with the use of the above interfacial control oxide films that are $TiO_2$ films to which at least one element selected from the group consisting of V, Cr, Mn, Fe, Co, Ni, Tc, Ru, Rh, Pd, Re, Os, Ir, and Pt is added, the effective work function can be made smaller by adding at least one element selected from the group consisting of F, H, and Ta as needed.

Although Ti-based oxides such as $TiO_2$, $La_2Ti_2O_7$, and TiSiO (Ti silicate) have been described so far, $SrTiO_3$ can be used in place of a Ti-based oxide. In such a case, the addition of La, Y, or Sc differs from the addition performed in a case where a Ti-based oxide is used, and therefore, it is explained in the following.

A case of the above described p-MISFET having the p-type Ge source/drain regions is described.

With the use of interfacial control oxide films that are $SrTiO_3$ films to which at least one element selected from the group consisting of La, Y, Sc, Ta, Nb, W, and Mo, and at least one element selected from the group consisting of N, C, B, Mg, Al, Ce, Pr, Nd, Pm, Sm, Eu, Gd, Tb, Dy, Ho, Er, Tm, Yb, and Lu are both added, it is possible to form source/drain metal electrodes having a larger effective work function than the effective work function (4.6 eV) achieved in a case where interfacial control oxide films are not inserted.

Alternatively, $SrTiO_3$ films to which at least one element selected from the group consisting of V, Cr, Mn, Fe, Co, Ni, Tc, Ru, Rh, Pd, Re, Os, Ir, and Pt is added may be used as the interfacial control oxide films. With this arrangement, it is possible to form source/drain metal electrodes having a larger effective work function than the effective work function (4.6 eV) achieved in a case where interfacial control oxide films are not inserted.

In a case where the effective work function becomes too large with the use of the above interfacial control oxide films that are $SrTiO_3$ films to which at least one element selected from the group consisting of V, Cr, Mn, Fe, Co, Ni, Tc, Ru, Rh, Pd, Re, Os, Ir, and Pt is added, the effective work function can be made smaller by adding at least one element selected from the group consisting of La, Y, Sc, F, H, and Ta as needed.

The connections between the source/drain regions made of semiconductor p-type Ge and the source/drain metal electrodes in a p-MISFET have been summed up above. However, the above concept can be applied not only to a Ge substrate but also to semiconductor substrates of various materials (such as Si, Ge, SiGe, SiC, GaAs, InP, InAs, GaInAs, GaN, and GaInN), and have high extensibility.

The above concept can also be applied to the junctions between the channel region and metal source/drain regions of a semiconductor described later. More specifically, in a p-MISFET, the above described interfacial control oxide films can be used at the connection interfaces between the n-type Ge channel and the metal source/drain regions. The n-type channel region is connected to the metal, and the effective work function is made sufficiently larger by virtue of the above-described interfacial control oxide films. When the channel region is in a closed state (an OFF state), the barrier against electrons is high, whereby the off-leakage becomes extremely small. When the channel region is in an open state (an ON state), or when a reversal to a p-type is caused, a barrier against holes hardly exists and the resistance at the connection is lowered, whereby ohmic connections are realized with low resistance.

Figure 9:
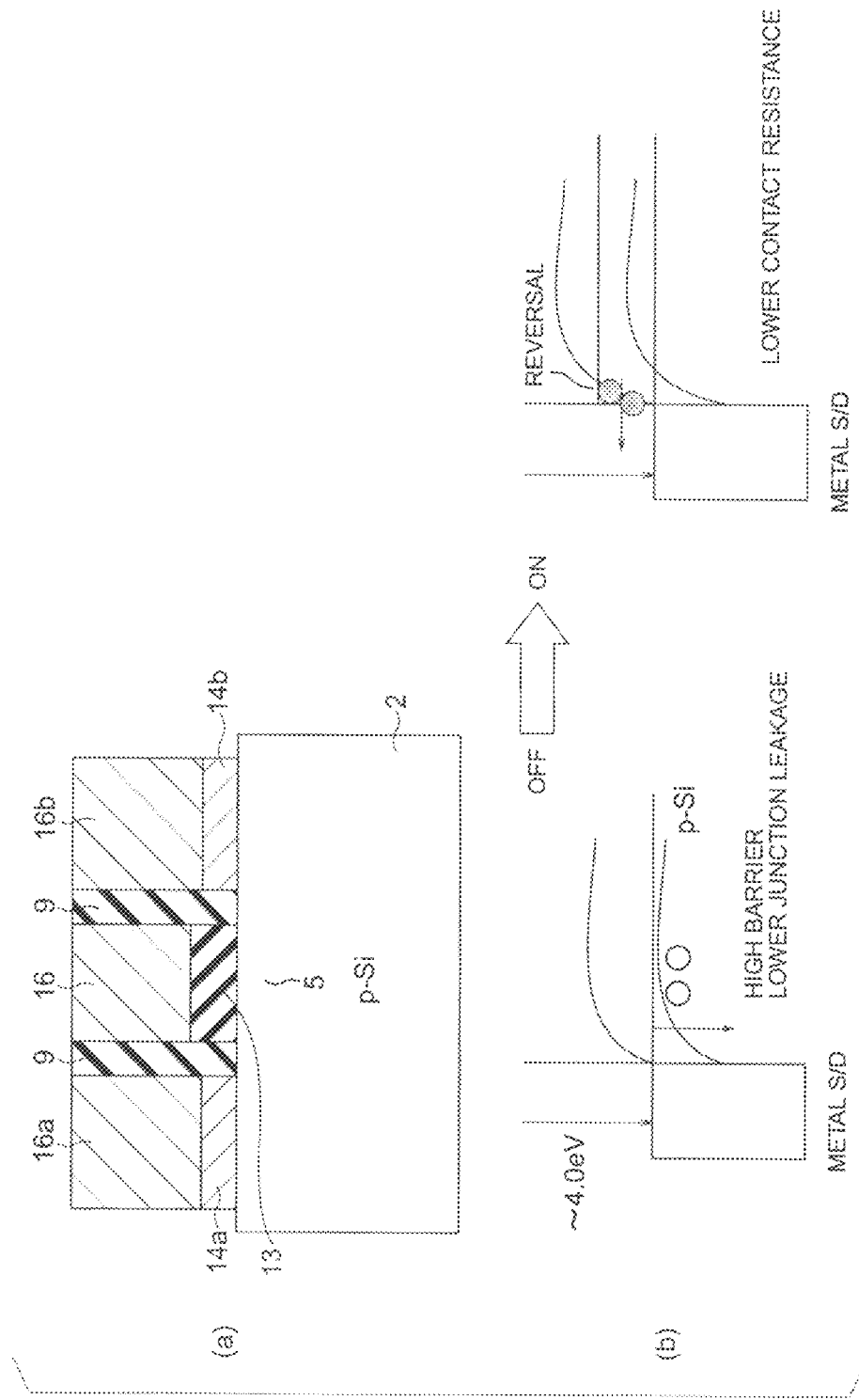

Connections Between Metal Source/Drain Regions and Semiconductor Channel Region n-MISFET If an oxide film having a smaller work function than the bottom (the lower edge) of the conduction band (CB) of Si can be formed, the Schottky barrier at the interface can be made 1.1 eV (equivalent to the bandgap of Si) or greater in a channel-off state, and can be made zero in a channel-on state by inserting the oxide film between the p-type Si channel region and metal source/drain regions. In this manner, it is possible to form an n-MISFET that has a leakage current (hereinafter also referred to as the junction leakage) that becomes smaller in an OFF state, and has ohmic connections in an ON state. FIGS. 9($a$) and 9($b$) show a first example of such an n-MISFET, and FIGS. 10($a$) and 10($b$) show a second example of such an n-MISFET. The n-MISFET of the first example includes a gate insulating film 13 formed on the channel region 5 on the surface of the p-type silicon substrate 2, and a gate electrode 16 that is formed on the gate insulating film 13 and is made of a metal selected from the group including TiN, W, TaN, TaC, HfN, RuO, NiSi, PtSi, PdSi, NiPtSi, and NiPdSi, for example. Interfacial control oxide films 14$a$ and 14$b$ are formed on the channel region 5 at both sides of the gate electrode 16. A source electrode 16$a$ and a drain electrode 16$b$ that are made of a metal selected from the group including TiN, W, TaN, TaC, HfN, RuO, NiSi, PtSi, PdSi, NiPtSi, and NiPdSi are formed on the interfacial control oxide film 14$a$ and the interfacial control oxide film 14$b$, respectively. The gate electrode 16 is electrically insulated from the source electrode 16$a$ and the drain electrode 16$b$ by the sidewalls 9 made of an insulating material formed on the side faces of the gate electrode 16.

In the n-MISFET of the first example, the interfacial control oxide film 14$a$ and the interfacial control oxide film 14$b$ are provided between the channel region 5 made of p-type Si and the source electrode 16$a$ and the drain electrode 16$b$ that are made of a metal. A smaller work function than the lower edge of the conduction band of Si can be obtained by selecting the Nb-added $TiO_2$ for the interfacial control oxide films 14$a$ and 14$b$ as described with reference to FIGS. 6($a$) and 6($b$), for example. Accordingly, the Schottky barrier at each interface can be made 1.1 eV (equivalent to the bandgap of Si) or greater in a channel-off state, and can be made zero (or less than zero) in a channel-on state (FIG. 9($b$)). In this manner, a MISFET that has small junction leakage in an OFF state and has ohmic connections established in an ON state can be formed.

Figure 10:
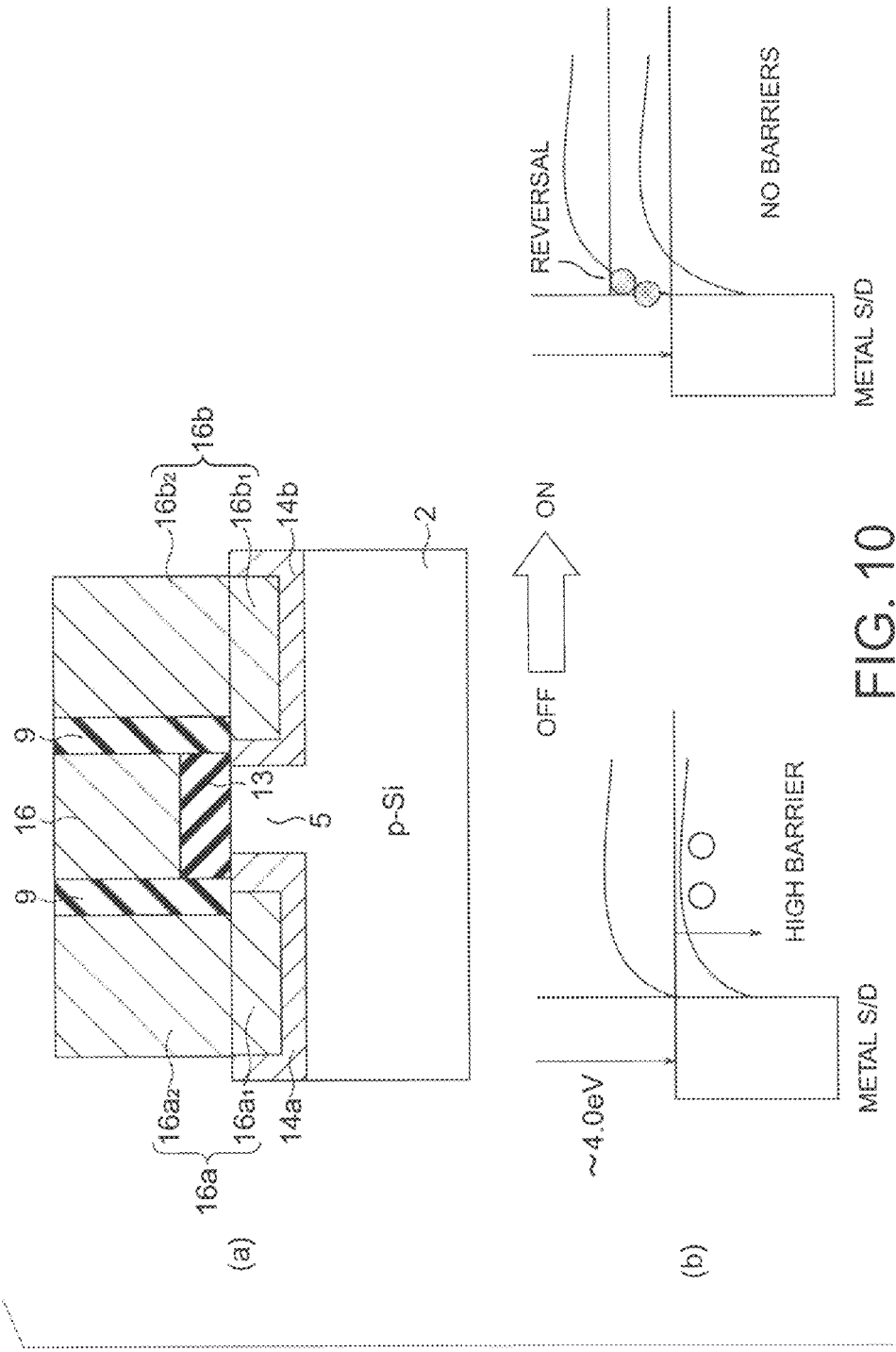

As shown in FIGS. 10($a$) and 10($b$), the n-MISFET of the second example includes a gate insulating film 13 formed on the channel region 5 on the surface of the p-type silicon substrate 2, and a gate electrode 16 that is formed on the gate insulating film 13 and is made of a metal selected from the group including TiN, W, TaN, TaC, HfN, RuO, NiSi, PtSi, PdSi, NiPtSi, and NiPdSi, for example. A first source electrode 16$a_1$ and a first drain electrode 16$b_1$ that are made of a metal selected from the group including TiN, W, TaN, TaC, HfN, RuO, NiSi, PtSi, PdSi, NiPtSi, and NiPdSi, for example, are buried in the silicon substrate 2 at both sides of the gate electrode 16. An interfacial control oxide film 14$a$ and an interfacial control oxide film 14$b$ are provided between the silicon substrate 2 and the first source electrode 16$a_1$ and the first drain electrode 16$b_1$, or between the channel region 5 and the first source electrode 16$a_1$ and the first drain electrode 16$b_1$, respectively. A second source electrode 16$a_2$ and a second drain electrode 16$b_2$ are further provided on the first source electrode 16$a_1$ and the first drain electrode 16$b_1$, respectively. The first source electrode 16$a_1$ and the second source electrode 16$a_2$ form a source electrode 16$a$, and the first drain electrode 16$b_1$ and the second drain electrode 16$b_2$ form a drain electrode 16$b$.

In the n-MISFET of the second example, the interfacial control oxide film 14$a$ and the interfacial control oxide film 14$b$ are provided between the channel region 5 made of p-type Si and the first source electrode 16$a_1$ and the first drain electrode 16$b_1$ that are made of a metal. A smaller work function than the minimum of the conduction band of Si can be obtained by selecting the Nb-added $TiO_2$ for the interfacial control oxide films 14$a$ and 14$b$ as described with reference to FIGS. 6($a$) and 6($b$), for example. Accordingly, the Schottky barrier at each interface can be made 1.1 eV (equivalent to the bandgap of Si) or greater in a channel-off state, and can be made zero in a channel-on state (FIG. 10($b$)). In this manner, an n-MISFET that has small junction leakage in an OFF state and has ohmic connections established in an ON state can be formed.

In a case where a Si substrate is used, the energy level of the interfacial control oxide films to be inserted should be 4.05 eV or less in the work function. If the oxide films exhibit metallic electric conduction properties, the thin films can be regarded as (part of) the metal source and drain. In this manner, the contact resistance between the p-type Si channel and the metal source and drain can be greatly increased in an OFF state, and can be greatly lowered in an ON state in an n-MISFET. Such a feature cannot be obtained by the technique illustrated in FIGS. 1 and 2.

Although not shown in the drawings, the work function of the gate electrode 16 can be optimized by inserting a second interfacial control oxide film between the gate insulating film 13 and the gate electrode 16 in each of the structures illustrated in FIGS. 9($a$) and 9($b$) and FIGS. 10($a$) and 10($b$). The second interfacial control oxide film differs from the above-described interfacial control oxide films in the amount of additional material and the likes, and normally has a greater value (4.05 eV or greater) than the bottom of the conduction band of Si. It is of course possible to design a structure in which the optimum effective work function of the interfacial control oxide film interposed between the gate insulating film and the gate electrode is the same as the optimum effective work function of the interfacial control oxide films interposed between the source/drain regions of the semiconductor and the source/drain electrode of the metal (or between the substrate channel region and the source/drain electrodes of the metal). For example, fine adjustment may be made with the use of a channel dopant. This aspect can be observed in both an n-MISFET and a p-MISFET.

In the structure illustrated in FIGS. 10($a$) and 10($b$), the first source electrode 16$a_1$ and the first drain electrode 16$b_1$ may be silicided by a salicide process. The work functions are optimized by using Nb-added $TiO_2$ films on the gate insulating film and the channel side faces. After that, the upper portion of the gate insulating film and the source/drain portions are buried with polycrystalline silicon, and Ni is introduced into the polycrystalline silicon to form NiSi. In this manner, a salicide process can be used. Instead of the Nb-added $TiO_2$ films, W-added $TiO_2$ films may be used, for example. Also, a salicide process involving WSi may be performed after the formation of $TiO_2$ films, so that the W of WSi diffuses into the $TiO_2$ films. Such $TiO_2$ films having W added thereto can also be effectively used.

Of the interfacial control oxide films shown in FIGS. 10(a) and 10(b), only the channel side face portions may be left. FIGS. 36(a) through 37(b) illustrate such an example. The process used in that example will be described later in detail. There are many variations of the structures and processes involving interfacial control oxide films between the channel and the metal electrodes. Although a SOI (Silicon On Insulator) substrate is used in the structure illustrated in FIGS. 36(a) through 37(b), the same concept as above can be applied to a regular Si substrate and any other semiconductor substrate.

p-MISFET

Likewise, if an oxide film having a larger work function than the top of the valence band (VB) of Si can be formed, the Schottky barrier at the interface can be made 1.1 eV (equivalent to the bandgap of Si) or greater in a channel-off state, and can be made zero in a channel-on state by inserting the oxide film between the n-type Si channel and metal source/drain regions. In this manner, it is possible to form a p-MISFET that has the junction leakage that becomes smaller in an OFF state, and has ohmic connections in an ON state.

Figure 11:
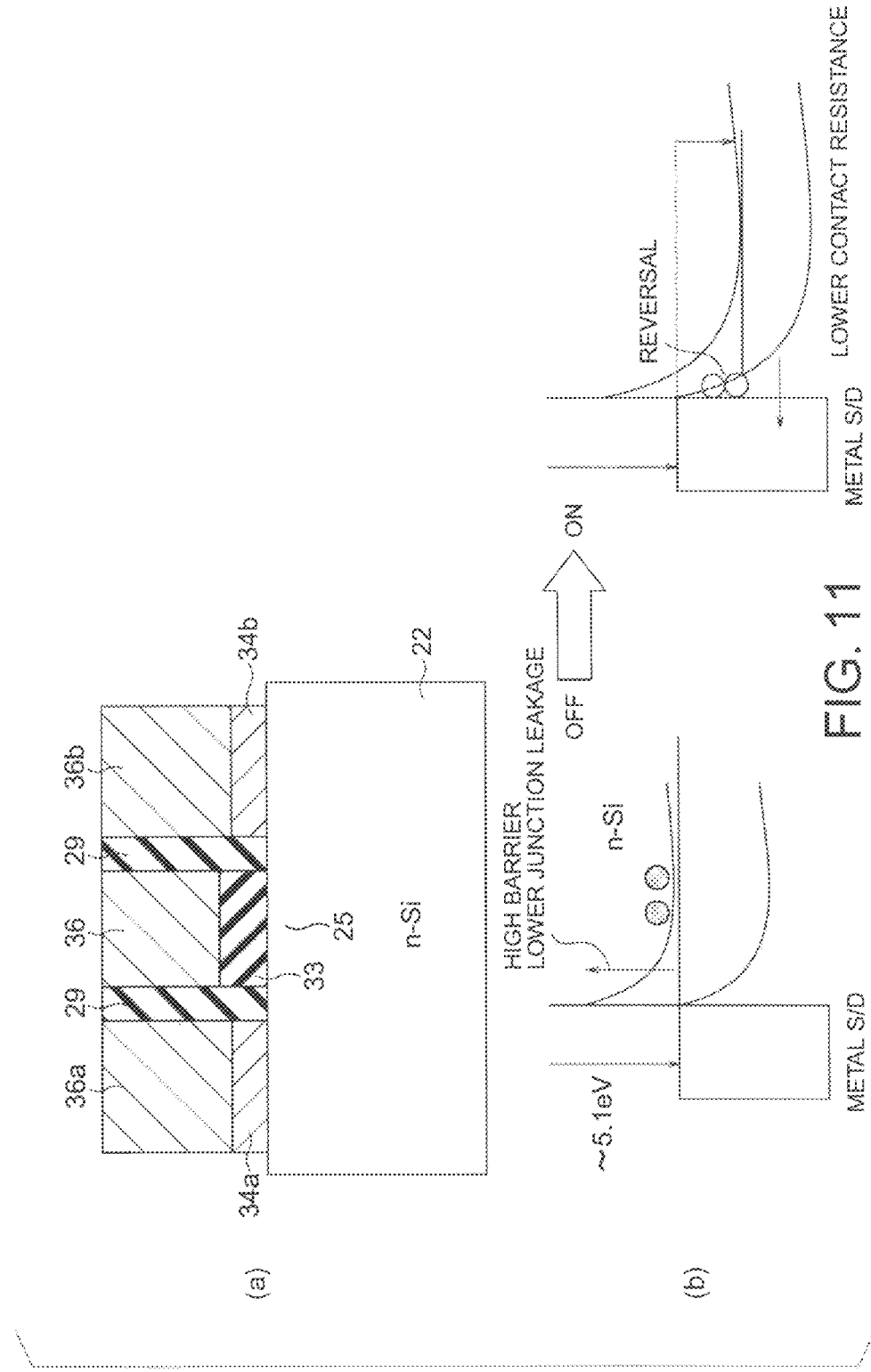
Figure 12:
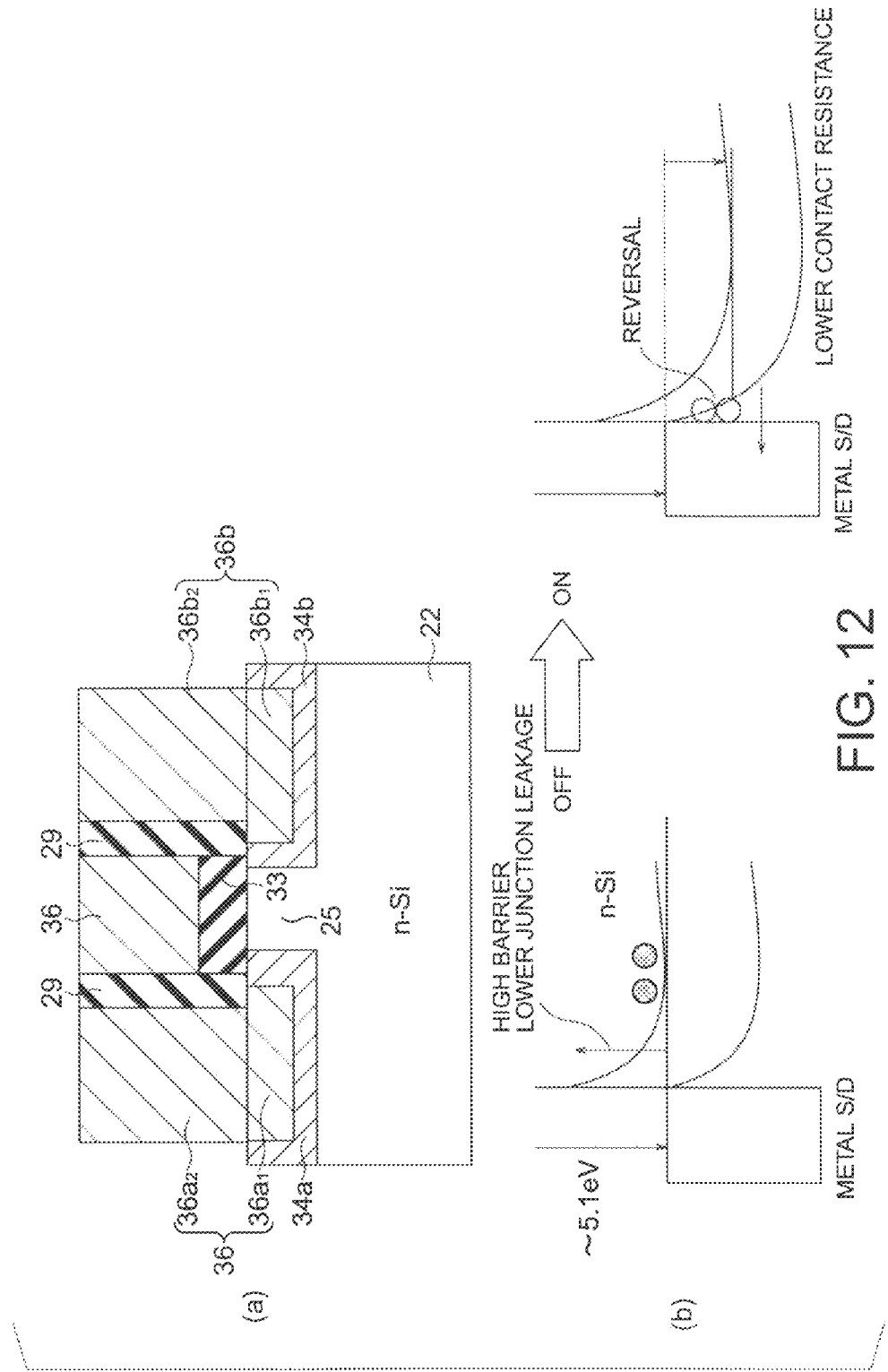

FIGS. 11(a) and 11(b) show a first example of such a p-MISFET, and FIGS. 12(a) and 12(b) show a second example of such a p-MISFET. The p-MISFET of the first example includes a gate insulating film 33 formed on the channel region 25 on the surface of the n-type silicon substrate 22, and a gate electrode 36 that is formed on the gate insulating film 33 and is made of a metal selected from the group including TiN, W, TaN, TaC, HfN, RuO, NiSi, PtSi, PdSi, NiPtSi, and NiPdSi, for example. Interfacial control oxide films 34a and 34b are formed on the channel region 25 at both sides of the gate electrode 36. A source electrode 36a and a drain electrode 36b that are made of a metal selected from the group including TiN, W, TaN, TaC, HfN, RuO, NiSi, PtSi, PdSi, NiPtSi, and NiPdSi, for example, are formed on the interfacial control oxide film 34a and the interfacial control oxide film 34b, respectively. The gate electrode 36 is electrically insulated from the source electrode 36a and the drain electrode 36b by the sidewalls 29 made of an insulating material formed on the side faces of the gate electrode 36.

In the p-MISFET of the first example, the interfacial control oxide film 34a and the interfacial control oxide film 34b are provided between the channel region 25 made of n-type Si and the source electrode 36a and the drain electrode 36b that are made of a metal. A larger work function than the upper edge of the valence band of Si can be obtained by selecting the Nb-added TiON films for the interfacial control oxide films 34a and 34b as described with reference to FIGS. 6(a) and 6(b), for example. Accordingly, the Schottky barrier at each interface can be made 1.1 eV (equivalent to the bandgap of Si) or greater in a channel-off state, and can be made zero in a channel-on state. In this manner, a p-MISFET that has small junction leakage in an OFF state and has ohmic connections established in an ON state can be formed.

As shown in FIGS. 12(a) and 12(b), the p-MISFET of the second example includes a gate insulating film 33 formed on the channel region 25 on the surface of the n-type silicon substrate 22, and a gate electrode 36 that is formed on the gate insulating film 33 and is made of a metal selected from the group including TiN, W, TaN, TaC, HfN, RuO, NiSi, PtSi, PdSi, NiPtSi, and NiPdSi, for example. A first source electrode $36a_1$ and a first drain electrode $36b_1$ that are made of a metal selected from the group including TiN, W, TaN, TaC, HfN, RuO, NiSi, PtSi, PdSi, NiPtSi, and NiPdSi, for example, are buried in the silicon substrate 22 at both sides of the gate electrode 36. An interfacial control oxide film 34a and an interfacial control oxide film 34b are provided between the silicon substrate 22 and the first source electrode $36a_1$ and the first drain electrode $36b_1$, or between the channel region 25 and the first source electrode $36a_1$ and the first drain electrode $36b_1$, respectively. A second source electrode $36a_2$ and a second drain electrode $36b_2$ are further provided on the first source electrode $36a_1$ and the first drain electrode $36b_1$, respectively.

In the p-MISFET of the second example, the interfacial control oxide film 34a and the interfacial control oxide film 34b are provided between the channel region 25 made of n-type Si and the first source electrode $36a_1$ and the first drain electrode $36b_1$ that are made of a metal. A larger work function than the maximum of the valence band of Si can be obtained by selecting the Nb-added TiON for the interfacial control oxide films 34a and 34b as described with reference to FIGS. 6(a) and 6(b), for example. Accordingly, the Schottky barrier at each interface can be made 1.1 eV (equivalent to the bandgap of Si) or greater in a channel-off state, and can be made zero in a channel-on state. In this manner, a p-MISFET that has small junction leakage in an OFF state and has ohmic connections established in an ON state can be formed.

In a case where a Si substrate is used, the energy level of the interfacial control oxide films to be inserted should be 5.17 eV or greater in the work function, as described above. If the oxide films exhibit metallic electric conduction properties, the thin films can be regarded as part of the metal source and drain. In this manner, the contact resistance between the n-type Si channel and the metal source and drain can be greatly increased in an OFF state, and can be greatly lowered in an ON state in a p-MISFET.

Although not shown in the drawings, the work function of the gate electrode 36 can be optimized by inserting a second interfacial control oxide film between the gate insulating film 33 and the gate electrode 36 in each of the structures illustrated in FIGS. 11(a) and 11(b) and FIGS. 12(a) and 12(b). The second interfacial control oxide film differs from the above-described interfacial control oxide films in the amount of additional material and the likes, and normally has a smaller value (5.17 eV or smaller) than the top of the valence band of Si.

In a structure similar to the structure illustrated in FIGS. 12(a) and 12(b), TiON films having Nb added only to their channel side-face portions are used, so that the first source electrode $36a_1$ and the first drain electrode $36b_1$ shown in FIGS. 10(a) and 10(b) can be silicided through a salicide process. In such a case, the work function can be optimized by using Nb-added TiON films on the gate insulating film and the channel side faces. After that, the upper portion of the gate insulating film and the source/drain portions are buried with polycrystalline silicon, and Ni is introduced into the polycrystalline silicon to form NiSi. In this manner, a salicide process can be used. Instead of the Nb-added TiON films, Ru-added $TiO_2$ films may be used, for example. Also, $TiO_2$ films are formed, and the Ni in NiSi is then caused to diffuse into the $TiO_2$ films. Such $TiO_2$ films having Ni added thereto can also be effectively used.

This technique may be applied to one of the n-MISFET and the p-MISFET, or may be applied to a CMIS structure.

Application to Memory Cell Structure

This technique can be applied to a floating gate (FG) memory having a NAND string formed by arranging MISFETs of one of the two types as the basic cells in a row, or to a MONOS memory including such a NAND string. This technique can also be applied to a FG memory having a NOR structure and a MONOS memory including a NOR structure. Here, there is not a particular limit on the respective films forming each basic cell in FG memories or MONOS memories. For example, a silicon nitride film is normally used as the charge storage film in which the charges of the basic cells of a MONOS memory are stored, but a $SrTiO_3$ film or the like having Ru added thereto may be used. Although a $SiO_2$ film is normally used as the tunnel film, a SiON film or a stacked film formed with a $SiO_2$ film, a $Si_3N_4$ film, and a $SiO_2$ film may be used instead, for example. In other words, a structure according to the embodiment of the present invention is used to form the source/drain regions of a semiconductor and the source/drain metal electrodes of each basic cell of a MISFET type. In this manner, the contact resistance at the connecting portions can be greatly lowered, and a memory that consumes less electric power can be realized. Also, since the leakage in a channel-off state can be heavily restricted, a memory that does not waste electric power can be formed.

Ge Substrate

At present, junction leakage is a serious problem with each FET using a Ge substrate. This is because the bandgap is narrow. To counter this problem in an n-MISFET, interfacial control oxide films having an effective work function of 4.0 eV or smaller are used, so that the barrier against holes in an OFF state is made equal to or greater than the bandgap. More specifically, with the use of interfacial control oxide films having an effective work function of 3.9 eV, for example, a hole barrier of 0.76 eV (=0.66 eV+0.1 eV) can be realized, instead of a hole barrier of 0.66 eV (equivalent to the bandgap of Ge). The value of 0.1 eV is the difference between the bottom value 4.0 eV of the CB and 3.9 eV, and the difference can be made even larger by adjusting the work function.

Likewise, in a p-MISFET, interfacial control oxide films having an effective work function of 4.66 eV or greater are used, to make the barrier against electrons in an OFF state equal to or greater than the bandgap. More specifically, with the use of interfacial control oxide films having an effective work function of 5.0 eV, for example, an electron barrier of 1.0 eV (=0.66 eV+0.34 eV) can be realized, instead of an electron barrier of 0.66 eV. The value of 0.34 eV is the difference between the top value 4.66 eV of the VB and 5.0 eV, and the difference can be made even larger by adjusting the work function. In conventional cases, the leakage current in an OFF state is large, and degrades user friendliness. However, with the use of a structure according to this embodiment of the present invention, the problem of the large off leak can be easily solved.

The same applies to other substrates. Typically desirable examples include Ga-based materials (such as GaAs, GaN, and GaP) and In-based materials (such as InP, InAs, and InSb). Materials formed by mixing some of those materials (such as InGaAs and InGaN) are also desirable. The technique according to the embodiment of the present invention can be effectively used for all of those substrates. More specifically, a Ti-based insulating film is interposed between the semiconductor substrate and the metal, and an additional material is selected and controlled. In this manner, a state in the gap appears in the Ti-based insulating film. The work function of the metal is pinned to the state in the gap. By summing up as above, it becomes apparent that this technique can be used for all semiconductor substrates. The substrate dependency can be determined only by which position in the T-based insulating film the state in the gap is to be formed in. Accordingly, the embodiment of the present invention also contains a method by which a state in the gap is moved.

Control on Interface Between Metal and Insulator in Metal/Insulator/Metal (MIM) Capacitor In the following, example cases where the insulating material is a ferroelectric material or a high-dielectric material are briefly described.

The interface between a metal and a dielectric material often has the problem of a very low barrier to be felt by the carriers of one of the two types. For example, in a Pt/PZT/Pt capacitor that has platinum Pt electrodes and a ferroelectric material $Pb(Zr,Ti)O_3$ (hereinafter also referred to as PZT) shown in FIGS. 44(a) and 44(b), the barrier against electrons is low, and the resistance to voltage is low. Therefore, the leakage current is large, and it is difficult to maintain polarization after the power is turned off. As a result, the retention properties are poor. This aspect is also seen in all ferroelectric oxide films such as barium titanium oxide film ($BaTiO_3$ (BTO) film) and strontium bismuth tantalum oxide film ($SrBi_2Ta_2O_9$ (SBT) film). Therefore, in a memory having a ferroelectric capacitor (a FeRAM: Ferro-electric Random Access Memory), it is necessary to increase the thickness of the dielectric film or the like, so as to maintain nonvolatility. As a result, sufficient polarization is not achieved, or high-voltage driving is performed, or the like. If a capacitor electrode that has a sufficiently large effective work function is formed, the leakage current can be reduced, and the dielectric film can be made thinner. As a result, sufficient polarization can be realized, and low-voltage driving can be performed.

In the embodiment illustrated in FIGS. 45(a) and 45(b), interfacial control oxide films formed with Ru-added $TiO_2$ are inserted to the interfaces between the Pt electrodes and the ferroelectric PZT. With this arrangement, a capacitor electrode having a sufficiently large effective work function can be realized, and the leakage current is reduced. Accordingly, the dielectric film can be made thinner, and sufficient polarization can be achieved. Furthermore, low-voltage driving can be performed.

This also applies to any capacitor having a high-dielectric film such as a $TiO_2$ film, $SrTiO_3$ (STO) film, or a $Ta_2O_5$ film. In a memory (DRAM: Dynamical Random Access Memory) using a high-dielectric capacitor such as a capacitor including platinum (Pt) electrodes and a high-dielectric material $TiO_2$ (Pt/$TiO_2$/Pt) illustrated in FIGS. 46(a) and 46(b), when a large amount of charges are induced by applying a voltage, the power consumption also becomes large, since the leakage current of the high-dielectric capacitor is large.

To counter this problem, in the embodiment illustrated in FIGS. 47(a) and 47(b), interfacial control oxide films formed with Ru-added $TiO_2$ are inserted to the interfaces between the Pt electrodes and the high-dielectric $TiO_2$. With this arrangement, the barrier to be felt by electrons can be made higher, and the leakage current can be easily reduced even if the high-dielectric film is made thinner. Since the leakage current is reduced, the dielectric film can be made thinner, and a sufficient charge amount can be achieved. Furthermore, low-voltage driving can be performed.

With a MIM structure being used, the embodiment may be applied only to one of the metal/insulator junction portions. The two junction portions may be formed one by one with different concepts from each other. For example, the electron barrier may be high on one side, and the hole barrier may be high on the other side. Alternatively, a structure according to the embodiment of the present invention may be used only on one side, and may not be used on the other side.

Although the Pt electrodes are used in the above-described MIM structure, various other electrodes that are conventionally used can be used in integrated circuits, if interfacial control oxide films are used. For example, TiN electrodes, W electrodes, and the likes are desirable, with easiness in processing being taken into consideration. Since Pt electrodes are expensive, the use of inexpensive electrodes brings desirable structures. Also, in the MIM structure, a suitable amount of the additional material added to the interfacial control oxide films is considered to be such an amount that causes band conduction. This is because the charge amount and the polarization are increased by applying voltage to a thinner insulating film. As will be described later, the amount of the additional material necessary for pinning is in the range of $6 \times 10^{12}$ atoms/cm$^2$ to $8 \times 10^{14}$ atoms/cm$^2$ in areal density. Further, an optimum amount of the additional material to generate a metallic level is considered to be in the range of $1 \times 10^{14}$ atoms/cm$^2$ to $8 \times 10^{14}$ atoms/cm$^2$ in areal density.

Although an example of the MIM capacitor that has a dielectric (or insulating) film interposed between metal films has been described, the control on the interface between the insulator and the metal is essential. For example, this control can be applied to any capacitor structure that has two or more kinds of insulating films (semiconductor films as well as dielectric films), such as a MIIM structure or a MIIIM structure.

Spin MOSFET

In a spin MOSFET, a structure formed with Si, MgO, and a ferromagnetic metal is used. In that case, MgO forms a tunnel film for the spin current. However, if the film thickness of the MgO film is large, the MgO film becomes high resistance. If the MgO film is thin, it easily turns into an amorphous material, and spin disturbance is caused. Since the ferromagnetic metal is determined mainly by its magnetic properties, the work function cannot be adjusted. As a result, the interfacial resistance becomes very high, and hinders spin conduction. If an embodiment of the present invention is used in that case, the work function can be pinned to an optimum value, regardless of the work function of the ferromagnetic metal. For example, for an n-MOSFET, a structure formed with Si/Nb added TiO$_2$ thin film/ferromagnetic metal may be used. For a p-MOSFET, a structure formed with Si/Ru added TiO$_2$ thin film/ferromagnetic metal may be used. The concept of the optimum value of a work function is the same as that in a MOSFET having a metal source and drain. In other words, a spin MOSFET may be regarded as a form of a MOSFET having a metal source and drain. The largest difference between a spin MOSFET and a MOSFET having a metal source and drain is that a current flows or does not flow, depending on whether the spin orientation is upward or downward in a spin MOSFET. Accordingly, a spin MOSFET can be regarded as a MOSFET that has a metal source and drain (formed with a magnetic material) and includes a memory function depending on the spin orientation. Although a ferromagnetic material is normally used as the magnetic material, it is possible to use an antiferromagnetic material. The most importance aspect is that the spin directions are controlled to be uniform by a certain method (by inducing a magnetic field with a current or by spin injection or the like). In an n-MOSFET, a MgO tunnel film may be used, as in a conventional structure that is formed with Si/MgO/Nb added TiO$_2$ thin film/ferromagnetic metal. In a p-MOSFET, a MgO tunnel film may be used, as in a structure that is formed with Si/MgO/Ru added TiO$_2$ thin film/ferromagnetic metal. However, the resistance equivalent to the MgO film is generated at that point. Since pinning to an optimum work function is possible in a conventional structure, regardless of the work function of the ferromagnetic metal, the insertion of interfacial control oxide film is effective.

Generalization

An embodiment of the present invention relates to a technique for controlling the interface between a semiconductor and a metal. This technique is used to control the junction between a metal and a substrate such as a Si substrate, a Ge substrate, a GaAs substrate, a GaN substrate, an InP substrate, an InAs substrate, an InGaAs substrate, an InGaN substrate, a SOI (Silicon On Insulator) substrate, or a GOI (Germanium On Insulator) substrate. This embodiment can be applied to various kinds of semiconductor devices. Although MISFETs, FG memories, MONOS memories, and MIM capacitors have been described so far, various effects can be achieved by applying the embodiment of the present invention to semiconductor devices that can improve the characteristics by controlling the barrier at each interface between the semiconductor and the metal. The interfacial contact resistance can be made lower by lowering the barrier at each interface or eliminating the barrier (forming an ohmic connection) at each interface. On the other hand, the junction leakage can be reduced, and the leakage current of the capacitor can be made smaller by increasing the height of the barrier. In a MISFET that has the channel region connected to source/drain metal electrodes, the barrier can become higher and lower in accordance with channel-off and channel-on states.

The technique according to the embodiment is not restricted by the structure of any semiconductor device. For example, the technique according to the embodiment of the present invention can be applied not only to flat-type MISFETs, but also to FIN transistors, tri-gate transistors, round-gate transistors, longitudinal transistors, and the likes. This technique can also be applied to memory cells formed by incorporating FGs and charge storage mechanisms into those transistor structures. There is not a limit on capacitor structures that are not necessarily flat-type structures, but may be trench structures or crown structures.

Amount of High-Valence Material to be Added

Next, the amount of high-valence material to be added to each interfacial control oxide film used in the embodiment is described.

First, the conditions for metallization in a case where an additional material is introduced are described. Where "a" represents the lattice constant, TiO$_2$, which is originally an insulating material, is metallized by virtue of the interaction between additional materials when one or more additional materials are added to a 2.5a×2.5a×2.5a unit. This can be converted into $1 \times 10^{14}$ atoms/cm$^2$ in areal density. With a band structure being taken into account, the level in the gap has a width, and a narrow and small dispersive band is generated in the gap. Since $8 \times 10^{14}$ atoms/cm$^2$ or more of additional material cannot be added, this value is set as the maximum value. Depending on the type of material, there are cases where $5 \times 10^{14}$ atoms/cm$^2$ or more cannot be added, and therefore, attention needs to be paid. Here, the maximum value, $8 \times 10^{14}$ atoms/cm$^2$, is regarded as the maximum value that does not depend on the type of material. When the areal density of the additional material is in the range of $1 \times 10^{14}$ atoms/cm$^2$ to $8 \times 10^{14}$ atoms/cm$^2$, a metallic level appears in the gap. This oxide film can become a metal as it is. In other words, this oxide film can function as a thin film serving as an interfacial control oxide film and a metal film. If this metallic thin film is inserted to the interface between a semiconductor and a metal, this metallic thin film turns into an interfacial control oxide film introducing an interfacial state, and the work function can be pinned to the Fermi level of the interfacial control oxide film.

The oxide films for controlling interfaces are not necessarily metallized, if they are thin films. Appropriate pinning to the Fermi level can be performed, as long as one state exists in each area of 10a×10a. Accordingly, $6 \times 10^{12}$ atoms/cm$^2$ or more should be sufficient. In this case, the hopping resistance becomes higher when the physical film thickness of each TiO$_2$ film exceeds 2 nm. Therefore, the film thickness should be 2 nm or less, if the film is not metallized. In the case of a Ti oxide, however, the band offsets for electrons and holes are originally small. Therefore, the film thickness can be up to 5 nm. Each film can be metallized by introducing one or more additional materials to each area of 2.5a×2.5a. In this manner, hopping conduction can be realized, and the limits on film thickness are lifted. Accordingly, if the amount of additional material is $1 \times 10^{14}$ atoms/cm$^2$ or more, the limits on film thickness are lifted.

Where the areal density of the additional material is in the range of $6 \times 10^{12}$ atoms/cm$^2$ to $1 \times 10^{14}$ atoms/cm$^2$, a level appears in the gap, but the oxide film is not metallized and becomes a film having hopping conduction. However, the resistance of such an oxide film can be regarded as much lower than a tunnel insulating film having no additional materials added thereto. Since the base material of such an interfacial control oxide film is a film having a high dielectric constant and has a not-so-large bandgap, the spread of the wave function is sufficiently wide, and the hopping conduction is effective. Here, attention should be paid to the fact that the high dielectric constant is related to the narrow bandgap. For example, low-dielectric-constant SiO$_2$ or the like has a wide bandgap, while high-dielectric-constant HfO$_2$ or the like has a narrow bandgap. Materials such as TiO$_2$ each have a very high dielectric constant, and accordingly, have a very narrow bandgap. If such a thin oxide film having a state in the gap is inserted to the interface between a semiconductor and a metal, the thin oxide film turns into an interfacial control oxide film introducing an interfacial state, and the work function can be pinned to the Fermi energy of the interfacial control oxide film.

Electron Supply to Level in Gap with Ta, F, and H

By adding a high-valence material as described above, a level can be formed in the bandgap. The level in the gap does not necessarily appear at an optimum location. Therefore, the inventors developed a method for artificially shifting levels up and down. When extra electrons are introduced into a level in a gap, the electron correlation energy becomes greater, and the level becomes higher. To introduce electrons, a material that holds more extra electrons than Ti and supplies electrons to the conduction band when Ta should be introduced and should be substituted for Ti. Alternatively, if a material that receives fewer electrons than oxygen substitutes oxygen, extra electrons are generated, and can be introduced into the level in the gap. Examples of materials that can act as above include F and H. The material that can be most easily introduced is H (hydrogen). For example, atomic hydrogen can be introduced by subjecting the oxide to low-temperature plasma hydrogen or excited hydrogen.

Atomic hydrogen (H) is normally introduced into an oxide through oxygen defects and the likes. In the embodiment of the present invention, however, oxygen defects are very few, and hydrogen introduction is not caused through oxygen defects. In the embodiment of the present invention, a high-valence material forms a level in the gap, and electrons are emitted into the level, so as to stabilize the lattice-point hydrogen. Accordingly, hydrogen is introduced into oxide films having high-valence materials added thereto. As described above, in the embodiment of the present invention, hydrogen is introduced into each oxide film having a high-valence material added thereto, but is not introduced into other films such as a gate insulating film.

Conventional FGA (Foaming Gas Anneal) or H$_2$ gas anneal is now described too. In FGA, hydrogen is hardly introduced into a both gate insulating film and any oxide film having a high-valence material added thereto according to the embodiment of the present invention. This is because H$_2$ is stable as molecules, and is not introduced into regular oxide films. Even if electrons can be emitted into the added high-valence materials, sufficient energy gain for dissociating hydrogen molecules is not obtained.

Electron Emission from Level in Gap with N, B, C, Ma, Ca, Sr, Ba, Al, Sc, Y, La, Ce, Pr, Nd, Pm, Sm, Eu, Gd, Tb, Dy, Ho, Er, Tm, Yb, and Lu When electrons are emitted from a level, the electron correlation energy becomes smaller, and the level becomes lower accordingly. To emit electrons from a level, it is necessary to cause the valence band to receive electrons. In the case of Ti, four electrons are released. If the number of electrons released is smaller than in the case of Ti, there is an electron shortage as a result. In such a case, electrons are emitted from a level in a gap. This requirement is satisfied by trivalent and divalent materials, which are Mg, Ca, Sr, Ba, Al, Sc, Y, La, Ce, Pr, Nd, Pm, Sm, Eu, Gd, Tb, Dy, Ho, Er, Tm, Yb, and Lu. Alternatively, a material that receives more electrons than oxygen does may substitute oxygen, so that electrons are received from the level in the gap. Such materials are N, C, and B.

Referring now to FIG. 5, FIGS. 6(a) and 6(b), and FIGS. 13 through 15, the optimum value of the effective work function is described. The embodiment of the present invention concerns a technique for designing interfacial control oxide films that have the work functions optimum for the junctions between the semiconductor source/drain regions and the source/drain metal electrodes in both an n-MISFET and p-MISFET, and have a narrow band in each gap (or a hopping level).

The same applies to techniques for controlling the barrier against carriers at each junction between metal source/drain regions and a semiconductor channel, and techniques for controlling the barriers against carriers in MIM capacitors. Here, attention needs to be paid to the fact that metal source/drain regions are connected directly to a semiconductor channel. More specifically, a connection to a p-type in an n-MISFET, and a connection to an n-type in a p-MISFET are taken into consideration. To reduce the leakage current in an OFF state, interfacial control oxide films each having a smaller work function than the edge of the n-type band are used in the n-MISFET, and interfacial control oxide films each having a larger work function than the edge of the p-type band are used in the p-MISFET. As a result, carriers flow in an ohmic manner in an ON state, and the leakage current is sufficiently restrained in an OFF state. In a MIM capacitor, it is also essential to reduce the leakage current by increasing the height of the carrier barrier. Basically, pinning the Fermi level to a position in the neighborhood of the center of the gap is effective in increasing the heights of both barriers against electrons and holes. Depending on the circumstance, the barrier on the electron side may be made higher than the other.

As shown in FIG. 5, when a high-valence material is added to TiO$_2$, a level appears in the gap in TiO$_2$. The case where the energy position of the level is higher than the minimum (the bottom) (=4.05 eV) of the conduction band of Si (where the work function is small) is set as Type-A. The case where the energy position of the level is in the gap is set as Type-B. The case where the energy position of the level is lower than the maximum (the top) of the valence band of Si (where the work function is large) is set as Type-C. In the case of Ge, the same classification as in the case of Si can be made by coincidence. As can be seen from FIGS. 13, 14, and 15, the minimum (=4.00 eV) of the conduction band of Ge and the maximum (=4.66 eV) of the valence band of Ge are the same as those of Si.

Figure 13:
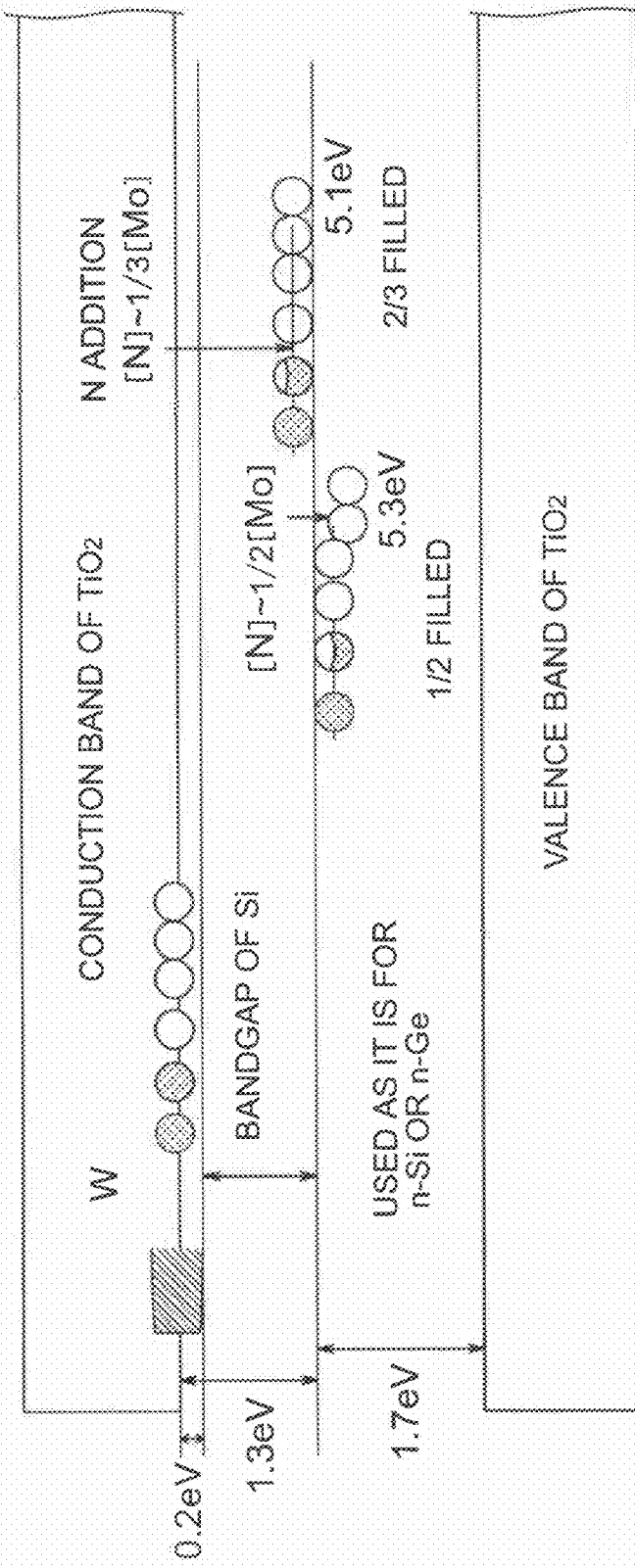
FIG. 13 is a diagram for explaining the level appearing in the gap when an element of Type-A is added to $TiO_2$.
Figure 14:
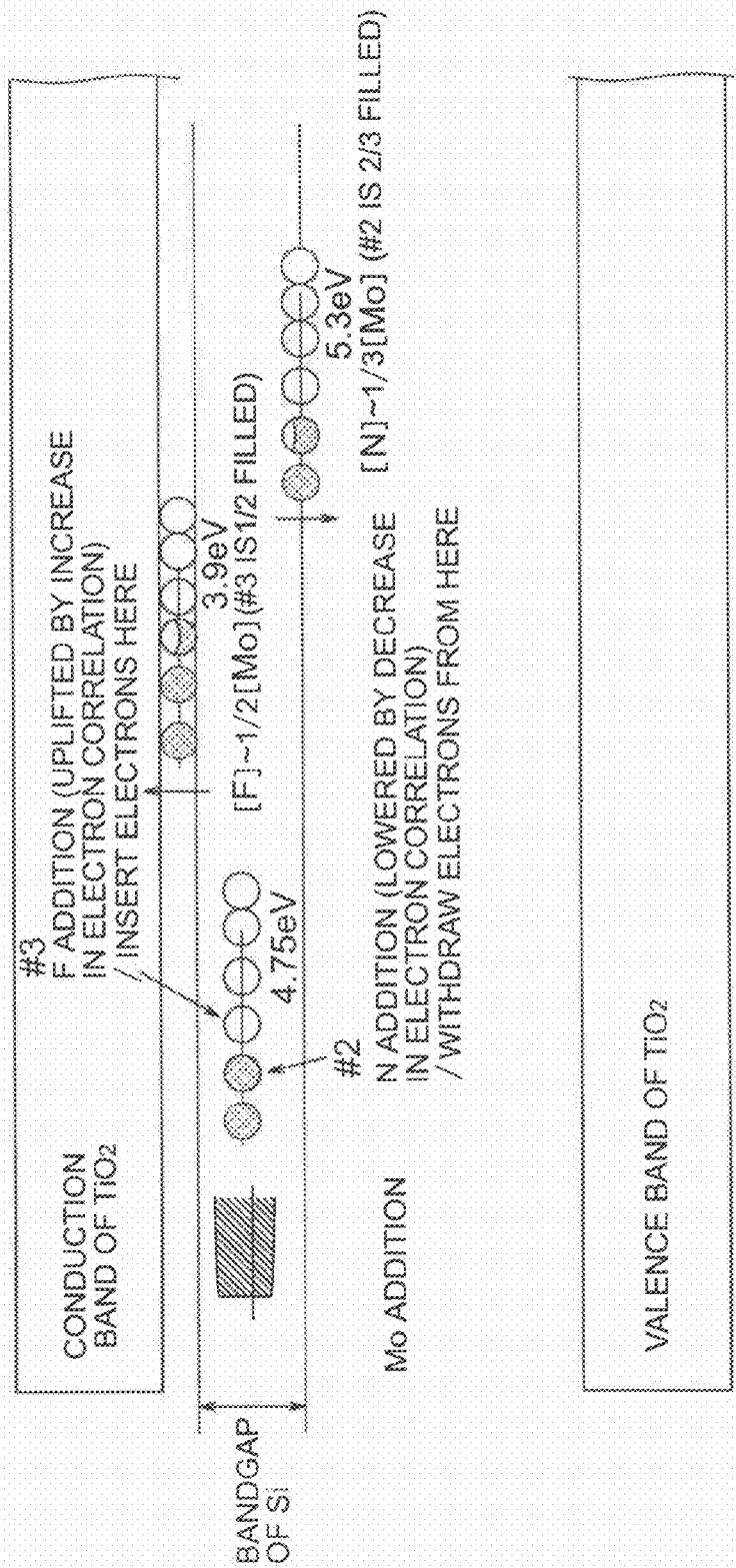
FIG. 14 is a diagram for explaining the level appearing in the gap when an element of Type-B is added to $TiO_2$.
Figure 15:
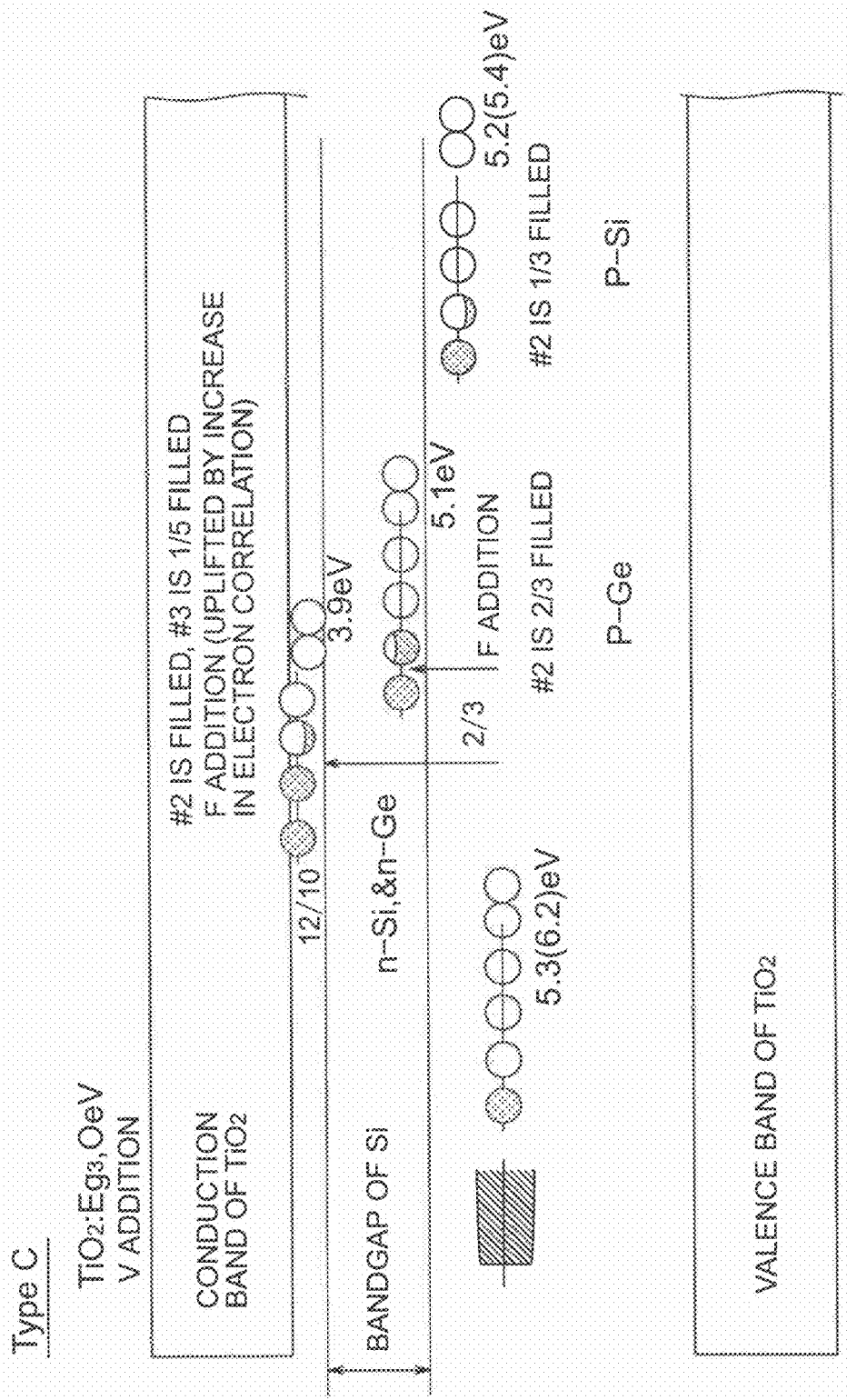
FIG. 15 is a diagram for explaining the level appearing in the gap when an element of Type-C is added to $TiO_2$.

FIGS. 13, 14, and 15 illustrate examples of Type-A, Type-B, and Type-C. The examples of Type-A, Type-B, and Type-C are an example case where W is added, an example case were Mo is added, and an example case where V is added.

Type-B

Referring to FIG. 14, the case of Type-B where Mo is added to a $TiO_2$ (or $SrTiO_3$ or Ti silicate) dielectric oxide is described. The band offset of $TiO_2$ and Si is approximately 0.2 eV on the conduction band side. Since the bandgap of Si is 1.1 eV, and the bandgap of $TiO_2$ is approximately 3.0 eV (or approximately 3.2 eV, depending on the structure), the band offset of $TiO_2$ and Si is 1.7 eV (=3.0−(0.2+1.1)) on the valence band side. When Mo is added to $TiO_2$, oxygen is coordinated around Mo added to $TiO_2$. The level in the gap is formed with the d electrons of the added material, and is also formed with the triply-degenerated dxy trajectory, dyz-trajectory, and dzx-trajectory. On the trajectory, six electrons can be buried for each additional material at a maximum. The difference between the number of electrons buried in the outermost shell of the additional material Mo and the four of electrons in the outermost shell of Ti is the number of electrons accommodated in the level in the gap. For example, six electrons are buried in the outermost shell of Mo. Four of the six electrons are transferred to $TiO_2$, and two (=6−4) of the six electrons become extra electrons. The extra electrons are accommodated in the level of Mo appearing in the gap of $TiO_2$. In this manner, a level in the gap originating from Mo appears in the bandgap of $TiO_2$. The level in the gap forms a narrow band due to the interaction between Mo. As described above, a metal oxide (a metal oxide formed with Mo-added $TiO_2$) can be generated by adding Mo to $TiO_2$. The work function is determined by the level, and is approximately 4.75 eV.

If nitrogen is further introduced here, electrons can be emitted from the level formed by Mo. Through the introduction of nitrogen, oxygen is substituted. Since nitrogen can receive more electrons than oxygen can, the introduced nitrogen receives electrons from Mo, and the film is stabilized. As a result, the number of electrons in the level formed by Mo becomes smaller. Since the interaction between electrons becomes smaller as the number of electrons becomes smaller, the level becomes lower. When one electron per three Mo atoms is introduced into nitrogen states (⅔ of the second state is filled), a metal oxide having a work function in the neighborhood of 5.3 eV is generated, as can be seen from FIG. 14. In other words, it has become apparent that the work function can be adjusted by controlling the nitrogen amount. With this fact being taken into account, a junction with low contact resistance can be formed between p-type Si and a metal. For example, this can be effectively applied to the junctions between a semiconductor source and drain made of p-type Si (semiconductor source/drain regions of a p-MISFET) and source/drain metal electrodes (FIGS. 8(*a*) and 8(*b*)). This can also be effectively applied to the interfaces between an n-type Si channel and a metal source and drain (in a p-MISFET having a metal source and drain) (FIGS. 11(*a*) and 11(*b*), FIGS. 12(*a*) and 12(*b*)).

Since nitrogen receives electrons, nitrogen is called an electron-accepting material in this specification. There are electron-accepting materials other than nitrogen. Materials that substitute oxygen, such as carbon (C) and boron (B), also have the same characteristics as nitrogen. A Ti oxide is used in the embodiment of the present invention. Where Ti is substituted by Mg, Ca, Sr, Ba, Al, Sc, Y, La, or a lanthanoid (Ce, Pr, Nd, Pm, Sm, Eu, Gd, Tb, Dy, Ho, Er, Tm, Yb, or Lu), the same properties as above can be observed. Since the valence of any of those materials is small, they cannot emit more electrons than Ti can. As a result, oxygen can receive electrons from the other element (Mo in the example case illustrated in FIG. 14). In the present invention, N, C, B, Mg, Ca, Sr, Ba, Al, Sc, Y, La, and the lanthanoids are called electron-accepting materials.

Through the above described simultaneous addition of Mo and N, the junctions between a semiconductor source and drain (the semiconductor source/drain regions of a p-MISFET) and source/drain metal electrodes, or the functions between an n-type Si channel and a metal source and drain (in a p-MISFET having a metal source and drain) are obtained. Although the substrate is made of Si in the example case described above, the concept described above can be applied to any other regular semiconductor substrates. The only difference lies in the value of the optimum work function. For example, as for the interfaces between p-type Si source/drain regions and a metal, the structure is designed so as to obtain a work function of 5.17 eV or greater. On the other hand, as for the interfaces between p-type Ge source/drain regions and a metal, the structure is designed so as to obtain a work function of 4.66 eV or greater. In this manner, only the value of the optimum work function differs. The same applies to n-type semiconductors.

Next, a case where fluorine (F) is introduced in place of N as the additional material is described. In this case, electrons are injected into the level in the gap, so as to make the level higher. Accordingly, it becomes possible to design interfacial control oxide films having the work function optimum for the junctions with n-type Si source/drain regions. When fluorine is introduced, oxygen is substituted. Since fluorine cannot accept more electrons than oxygen can, there are extra electrons among the electrons emitted from Ti. The extra electrons are transferred to the level in the gap formed by Mo, and the film is stabilized accordingly. As a result, the number of electrons in the level formed by Mo becomes larger, and the level becomes higher. When one electron per two Mo atoms is introduced into Mo states by means of F introduction (½ of the third state is filled), a metal oxide having a work function in the neighborhood of 3.9 eV is generated, as can be seen from FIG. 14. In other words, it has become apparent that the work function can be adjusted by controlling the fluorine amount.

Since fluorine releases electrons, it is called an electron-releasing material. There are not so many electron-releasing materials, and the most effective one of those is fluorine. The material that can be most easily introduced is hydrogen. For example, it suffices only to leave $TiO_2$ in low-temperature plasma hydrogen. In the embodiment of the present invention, a Ti-based oxide is used, and the same properties as above can be observed if Ti is substituted by Ta. Since the valence of Ta is large, Ta can release more electrons than Ti can. Accordingly, examples of electron-releasing materials include fluorine, hydrogen, and Ta.

Type-B illustrated in FIG. 14 is an example case where a level can be formed in a Si gap by adding a metal. To shift this level upward, it suffices only to introduce electrons by adding F or the like. To shift this level downward, it suffices only to withdraw electrons by adding N or the like. Here, instead of $TiO_2$ films having Mo added thereto, TiON films having Mo added thereto may be formed as the initial films. Films having the level of the additional material (Mo) shifted downward may be formed as the interfacial control oxide films for connecting p-type Si source/drain regions and source/drain metal electrodes. Those films may be turned into films for connecting n-type Si source/drain regions and source/drain metal electrodes by introducing F or the like into the films. In such a case, a larger amount of electrons is introduced, due to the downward shift in the initial films (or the larger work function). On the other hand, TiOF films having Mo added thereto may be formed as the initial films, and interfacial control oxide films for connecting n-type Si source/drain regions and source/drain metal electrodes may be formed. Those films may be turned into films for connecting p-type Si source/drain regions and source/drain metal electrodes by introducing N into the films. In such a case, a larger amount of electrons is withdrawn, due to the upward shift in the initial films (or the smaller work function). In this manner, both an n-MISFET and a p-MISFET (a CMIS structure) can be formed.

Type-A

Referring now to FIG. 13, the case of Type-A where tungsten (W) is added to $TiO_2$ is described. In Type-A, when tungsten (W) is added to $TiO_2$, a level in the gap appears, and a narrow band in the gap is formed by virtue of the interaction between W. This band overlaps with the conduction band of Ti, and Ti and W form the bottom of a conductor. The work function is determined by the positional relationship between the level and the conduction band of Ti, and becomes approximately 3.9 eV, which is the bottom of the conduction band of $TiO_2$. For the connections with n-type Si source/drain regions or n-type Ge source/drain regions, the structure can be used as it is. It is of course possible to further reduce the work function by introducing F, H, Ta, or the like. Alternatively, to make the bottom of the Ti conduction band higher, Hf or Zr may be added. In such a case, the bottom of the conduction band is made higher, and electrons from W or the like are supplied. As for the connections with a metal source and drain or a p-type semiconductor channel, the use of the interfacial control oxide films having a small work function advantageously reduce the off-leakage (the junction leakage).

When nitrogen is further introduced, electrons can be released from the level formed by W. As a result, the number of electrons in the level formed by W becomes smaller, and the level becomes lower. A metal oxide having a work function in the neighborhood of 5.3 eV is generated by introducing one electron per two W atoms into nitrogen states (where $\frac{1}{2}$ of the second state is filled), as shown in FIG. 13. In this manner, interfacial control oxide films for connecting p-type Si source/drain regions to metal electrodes are formed. Further, a metal oxide having a work function in the neighborhood of 5.1 eV is generated by introducing one electron per three W atoms into nitrogen states (where $\frac{2}{3}$ of the second state is filled), as shown in FIG. 13. In this manner, interfacial control oxide films for connecting p-type Ge source/drain regions to metal electrodes are formed. To sum up, the work function can be adjusted by controlling the nitrogen amount, and an optimum work function can be selected in accordance with the type of the semiconductor. In connecting a metal source and drain to an n-type semiconductor channel, the use of interfacial control oxide films having a large work function can advantageously reduce the off-leakage (the junction leakage).

Type-C

Referring now to FIG. 15, the case of Type-C where vanadium (V) is added to $TiO_2$ is described. As shown in FIG. 15, in Type-C, when vanadium (V) is added to $TiO_2$, a level in the gap appears, and a narrow band in the gap is formed by virtue of the interaction between V. The work function is determined by the level, and becomes approximately 5.3 eV. When fluorine is further introduced, electrons can be introduced into the level formed by V. As a result, the number of electrons in the level formed by V becomes larger, and the level becomes higher. A metal oxide having a work function in the neighborhood of 5.2 eV is generated by introducing one electron per three V atoms into V states by means of F introduction (where $\frac{1}{3}$ of the second state is filled), as shown in FIG. 15. In this manner, interfacial control oxide films to be used for connecting p-type Si source/drain regions to source/drain metal electrodes are formed. A metal oxide having a work function in the neighborhood of 5.1 eV is generated by introducing two electrons per three V atoms into V states by means of F introduction (where $\frac{2}{3}$ of the second state is filled), as shown in FIG. 15. In this manner, interfacial control oxide films to be used for connecting p-type Ge source/drain regions to source/drain metal electrodes are formed. Further, a metal oxide having a work function in the neighborhood of 3.9 eV is generated by introducing twelve electrons per ten V atoms into V states by means of F introduction (where the second state is filled, and $\frac{1}{5}$ of the third state is filled), as shown in FIG. 15. In this manner, interfacial control oxide films to be used for connecting n-type Si source/drain regions to source/drain metal electrodes, and interfacial control oxide films to be used for connecting n-type Ge source/drain regions to source/drain metal electrodes are formed. As is apparent from the above, the work function can be adjusted by controlling the fluorine amount. In connecting metal source and drain regions to an n-type semiconductor channel, the use of interfacial control oxide films having a large work function can advantageously reduce the off-leakage (the junction leakage). Meanwhile, in connecting metal source and drain regions to a p-type semiconductor channel, the use of interfacial control oxide films having a small work function can advantageously reduce the off-leakage (the junction leakage).

Figure 16:
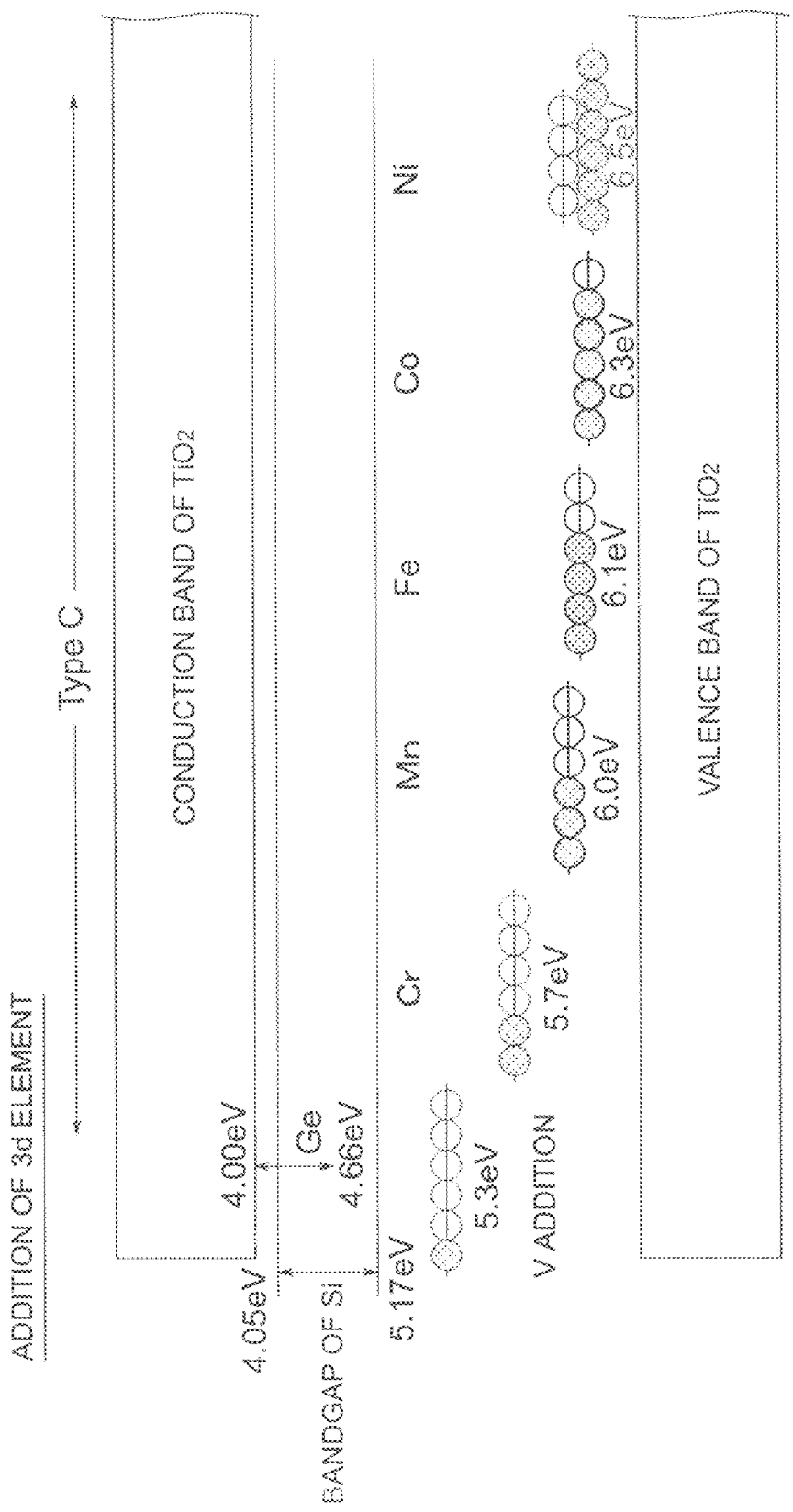
FIG. 16 is a diagram for explaining the level appearing in the gap when a 3d element is added to $TiO_2$.
Figure 17:
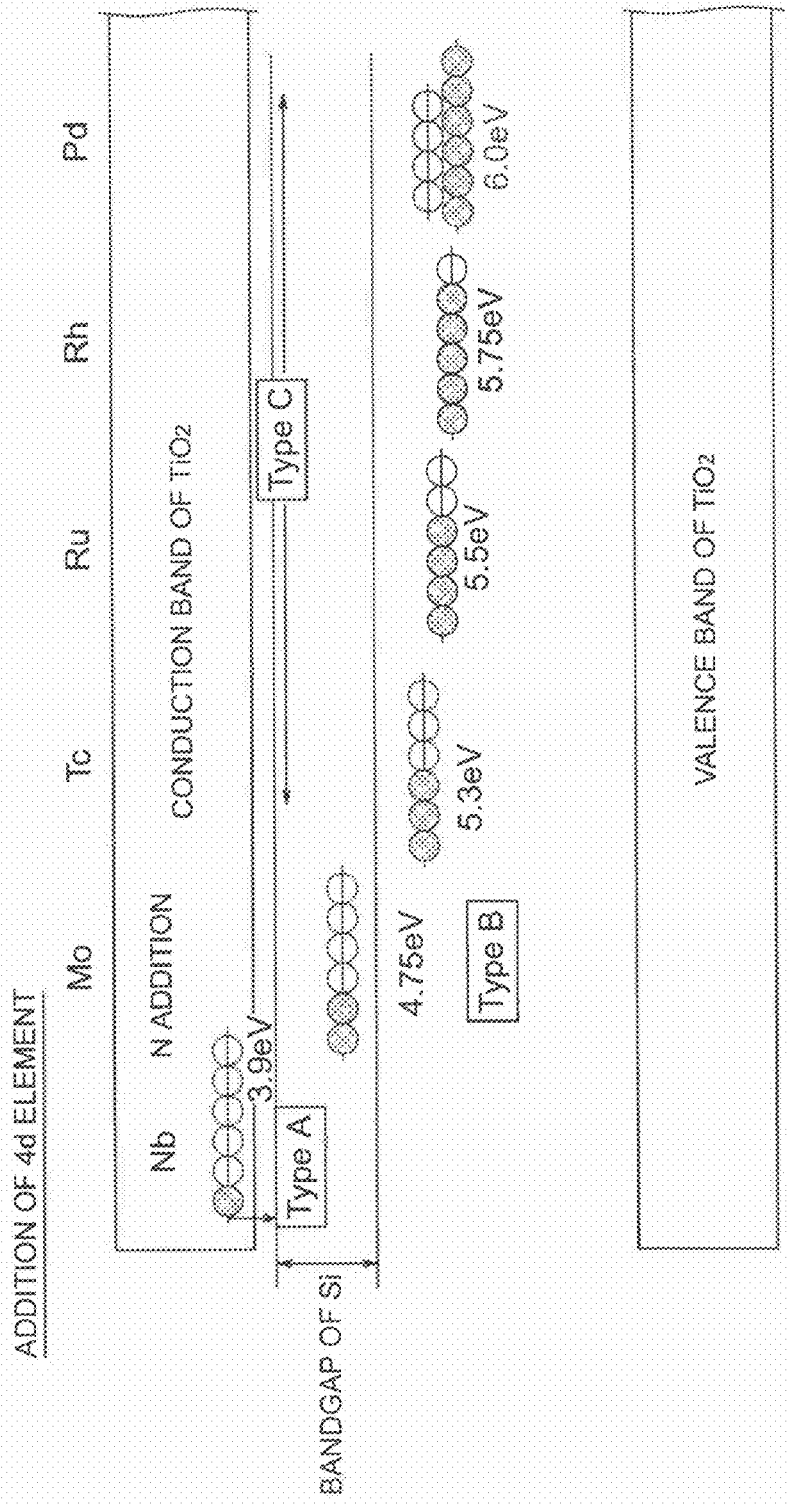
FIG. 17 is a diagram for explaining the level appearing in the gap when a 4d element is added to $TiO_2$.
Figure 18:
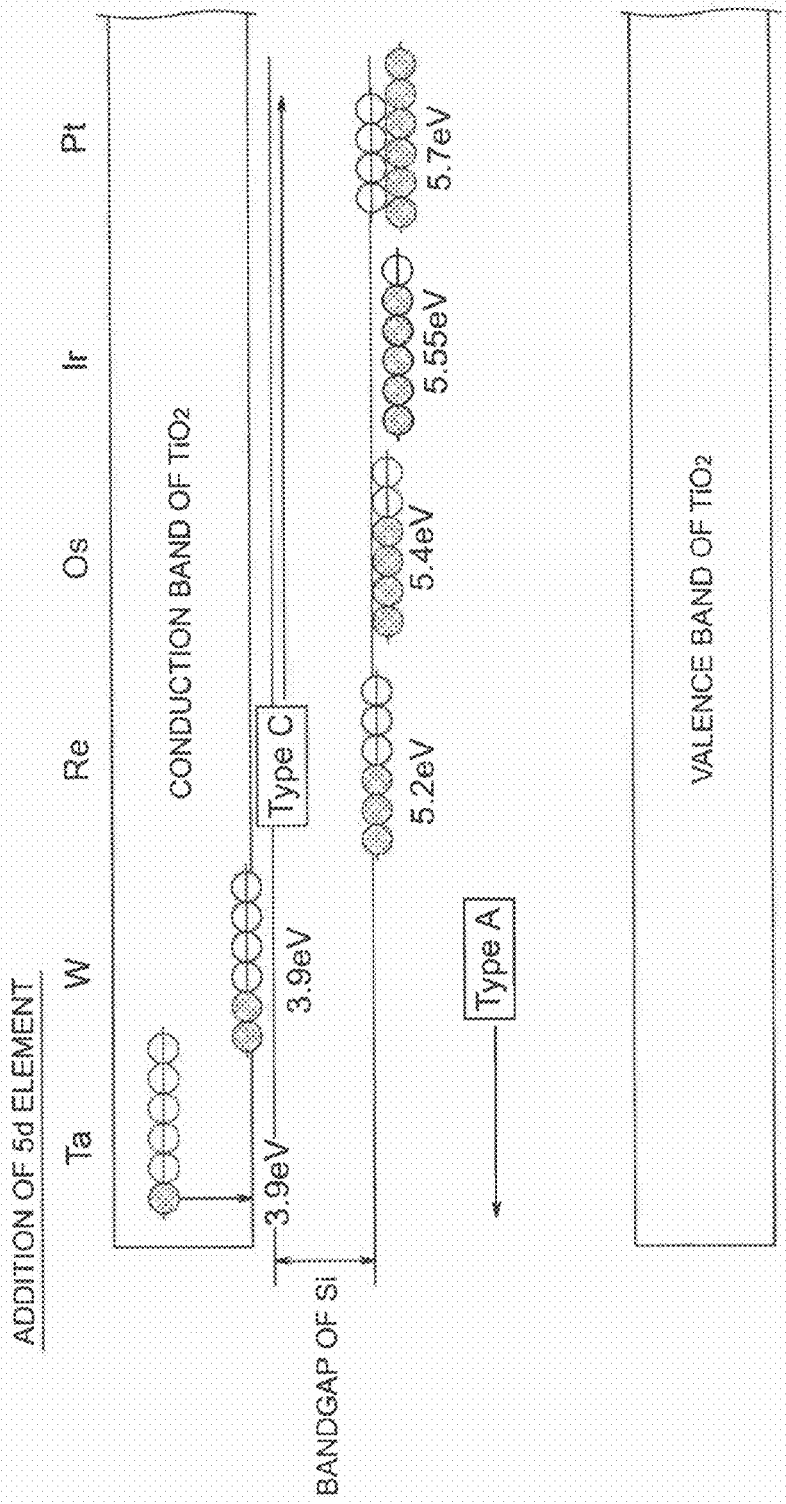
FIG. 18 is a diagram for explaining the level appearing in the gap when a 5d element is added to $TiO_2$.

FIG. 16, FIG. 17, and FIG. 18 show the levels in the gap observed in cases where a 3d element, a 4d element, and a 5d element are introduced into $TiO_2$. Those levels are the results of first principle calculation. As for $SrTiO_3$, the same results as those obtained with $TiO_2$ are obtained. The levels shown in FIGS. 16, 17, and 18 are the levels in the gap observed when Ti is substituted by a high-valence material. In the case of $SrTiO_3$, Ti in the B site is substituted. Although not described in detail, in a case where a trivalent material LaY, or Sc substitutes $SrTiO_3$, Sr in the A site is substituted. In that case, the divalent Sr is substituted, and electrons are supplied to $SrTiO_3$. This is a similar situation to a situation where Ta substitutes Ti. Accordingly, the same situation as the situation of Ta-added $TiO_2$ shown in FIG. 18 is considered to happen in the case of $SrTiO_3$ having La, Y, or Sc added thereto. The pentavalent and higher-valence materials shown in FIGS. 16, 17, and 18 can be considered as Ti oxides. The first principle calculation is based on the density-functional approach, and are performed like local density approximation. Ultrasoft pseudopotentials are used as the potentials. The potentials such as Ti, O, N, and F used in the calculations are already used in various forms, and have high reliability. For example, the lattice constant ($a_0$=3.92 Å) of $SrTiO_3$ obtained through the calculation is only 0.75% shorter than the experimental value (3.95 Å), and can be regarded as sufficient.

FIG. 16 shows example cases where V, Cr, Mn, Fe, Co, or Ni is added as a 3d element to $TiO_2$. Whenever a 3d element is added to $TiO_2$, Type-C is observed, and a suitable effective work function cannot be obtained by adding only a 3d element. When V, Cr, Mn, Fe, Co, or Ni is added, a level appears in the position of 5.3 eV, 5.7 eV, 6.0 eV, 6.1 eV, 6.3 eV, or 6.5 eV. To obtain a desired effective work function, it is effective to introduce electrons by adding an element such as F. It is of course possible to increase the effective work function by adding N or the like.

FIG. 17 shows example cases where Nb, Mo, Tc, Ru, Rh, or Pd is added as a 4d element to $TiO_2$. When Nb is added to $TiO_2$, Type-A is observed, and electrons need to be withdrawn by adding an element such as N, so as to achieve a large effective work function. If a small work function is acceptable, the structure can be used as it is. When Mo is added, Type-B is observed, and a suitable effective work function needs to be obtained by adding F or N or the like. When Tc, Ru, Rh, or Pd is added, Type C is observed, and, to obtain a small effective work function, it is preferable to inject electrons by adding an element such as F. It is of course possible to increase the effective work function by adding N or the like. Even in Type-C, the work function is in the range of 5.3 eV to 6.0 eV. Therefore, the structure is suitable for PMOSs as it is. When Nb, Mo, Tc, Ru, Rh, or Pd is added, a level appears in the position of 3.9 eV, 4.75 eV, 5.3 eV, 5.5 eV, 5.75 eV, or 6.0 eV, respectively.

Figure 19:
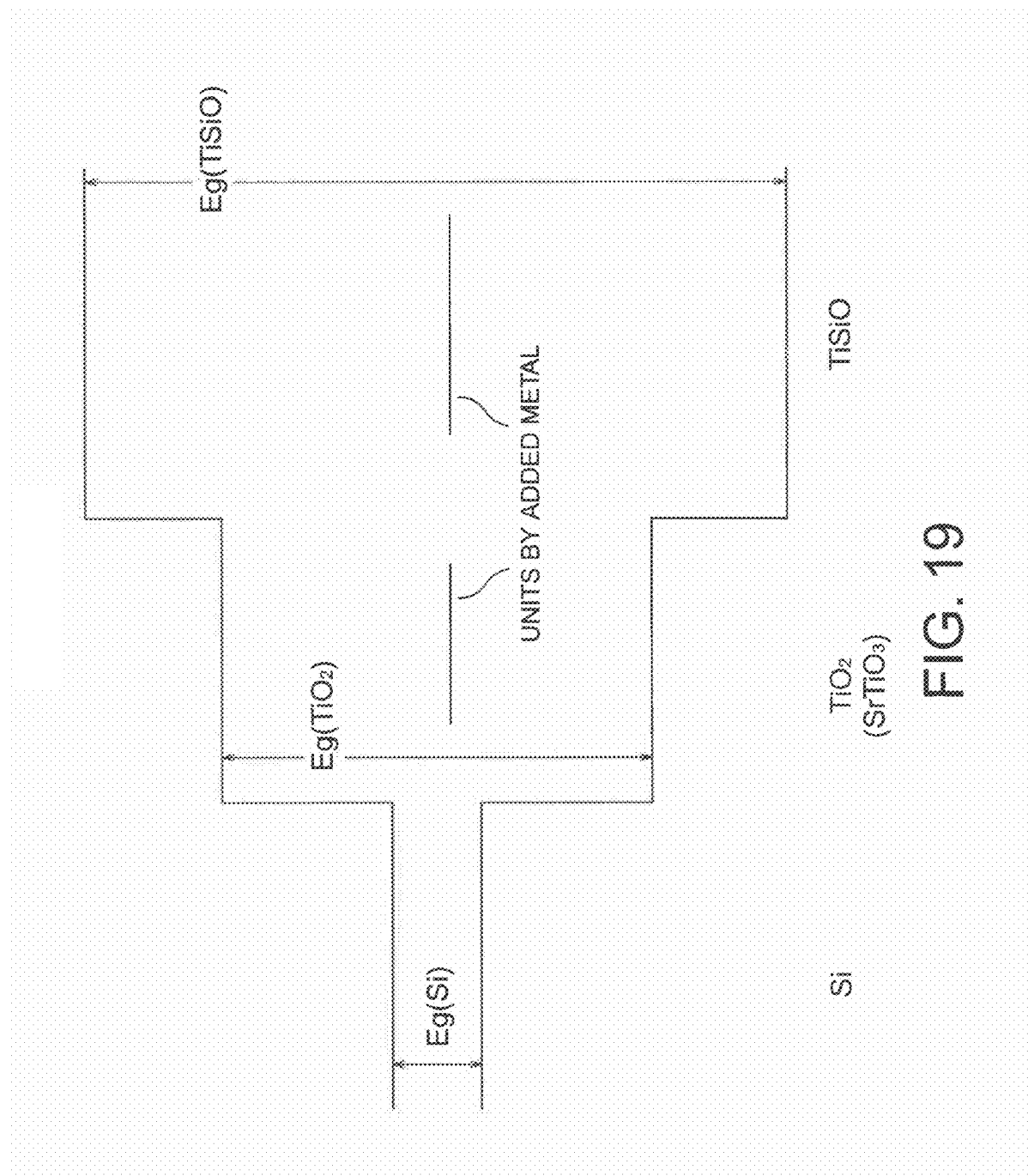
FIG. 19 is a diagram showing the positional relationship among the band offsets of a Si substrate, a $TiO_2$ film, and a TiSiO film.

FIG. 18 shows example cases where Ta, W, Re, Os, Ir, or Pt is added as a 5d element to $TiO_2$. When Ta is added to $TiO_2$, the level exists in the conduction band of $TiO_2$. Accordingly, Ta can be regarded as an electron-donating material. When W is added, Type-A is observed, and electrons need to be released by adding an element such as N, so as to achieve a large effective work function. When Re is added, Type C is observed, and, to obtain a small effective work function, it is preferable to inject electrons by adding an element such as F. When W, Re, Os, Ir, or Pt is added, a level appears in the position of 3.9 eV, 5.2 eV, 5.4 eV, 5.55 eV, or 5.7 eV. Even in Type-C, the work function is in the range of 5.2 eV to 5.7 eV, respectively. Therefore, the structure is suitable for PMOSs as it is Silicate As shown in FIG. 19, the relationship with the gap position of Si remains the same in the case of a silicate. Since the interaction between Si and oxygen is added with the use of a silicate, the bottom of the conduction band of $TiO_2$ becomes higher, and the top of the valence band becomes lower. However, there is not a change in the positional relationship between Si and the level in the gap formed by an addition of a metal. In FIG. 19, Eg(Si) represents the energy gap of Si, Eg($TiO_2$) represents the energy gap of $TiO_2$, and Eg(TiSiO) represents the energy gap of TiSiO.

For $TiO_2$ ($SrTiO_3$) and the silicate of $TiO_2$, the effective work function should be adjusted to 4.05 eV or less in connecting n-type Si source/drain regions to source/drain metal electrodes, and the effective work function should be adjusted to 5.17 eV or greater in connecting p-type Si source/drain regions to source/drain metal electrodes. This can be realized by releasing electrons (through an addition of N or the like) or by injecting electrons (through an addition of F or the like). The same applies to Ge and other semiconductors.

As for a MISFET having a metal source and drain, the effective work function is adjusted to 5.17 eV or greater in connecting the metal source and drain to an n-type channel region, and the effective work function is adjusted to 4.05 eV or less in connecting the metal source and drain to a p-type channel region.

Figure 20:
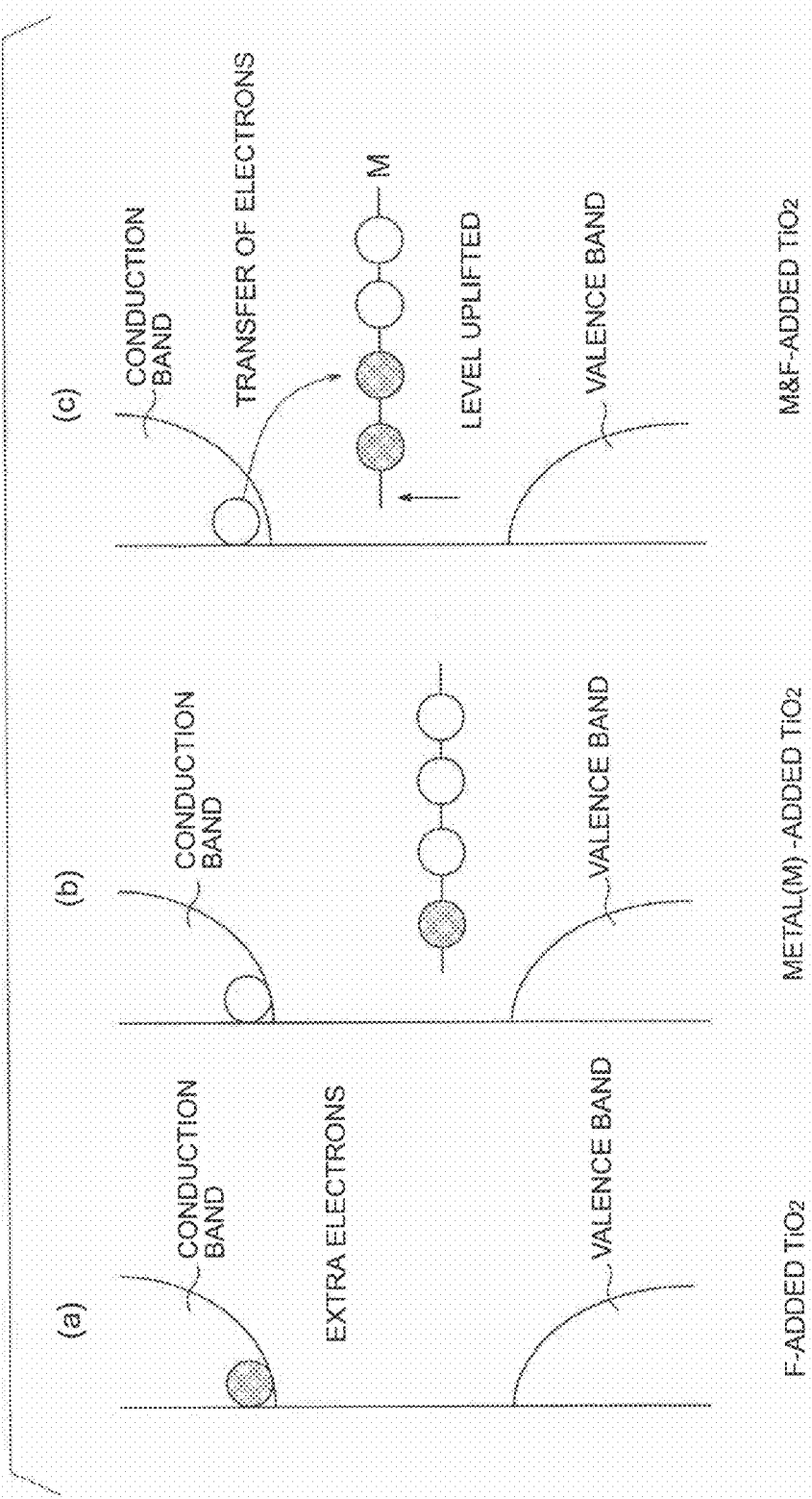
FIG. 20 is a diagram for explaining the F addition facilitated by adding a metal to $TiO_2$.
Figure 21:
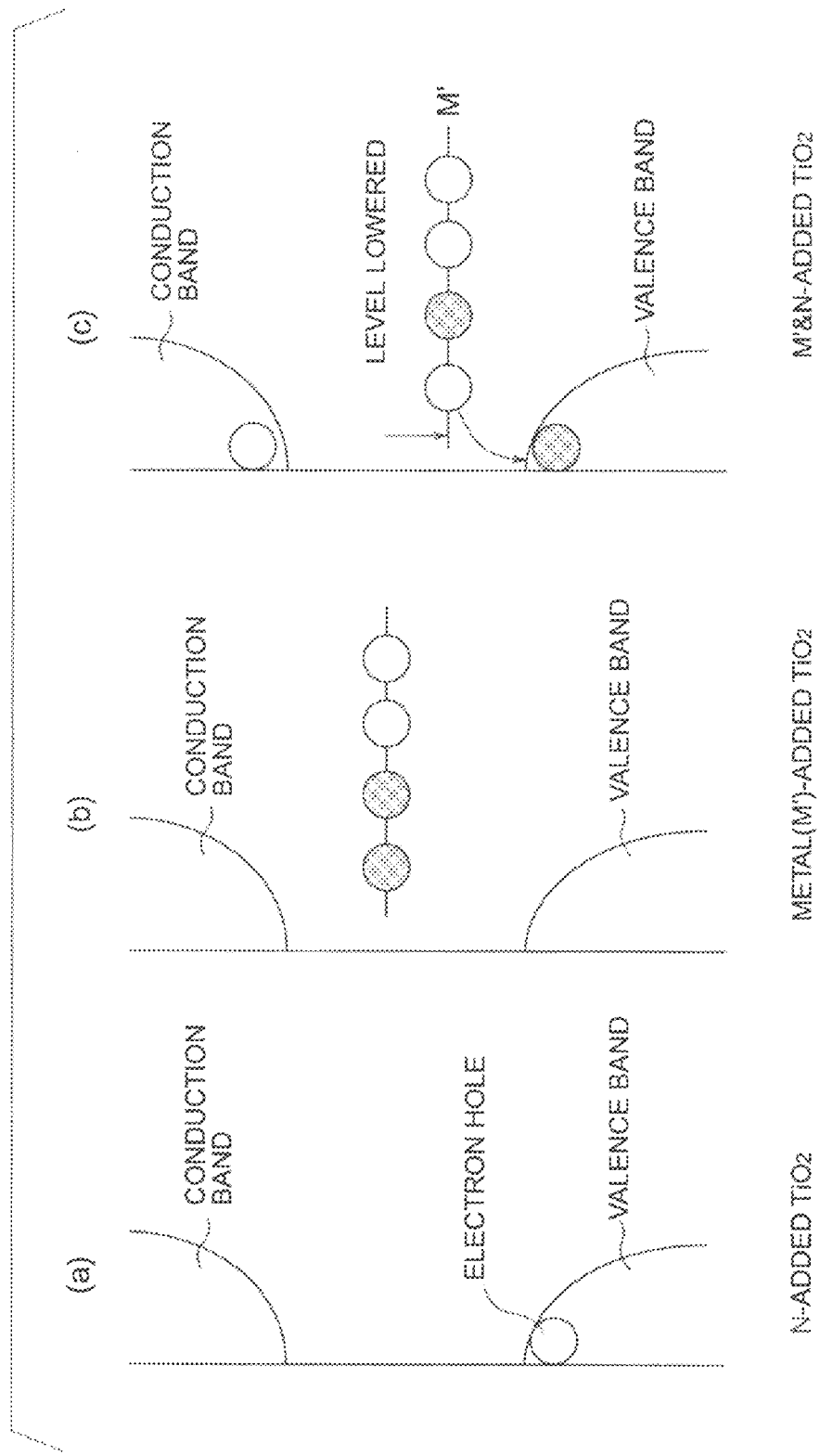
FIG. 21 is a diagram for explaining the N addition facilitated by adding a metal to $TiO_2$.

Referring now to FIGS. 20(a) through 21(c), the reason why F, N, or the like can be more easily introduced into $TiO_2$ than in conventional cases is described. The reason lies in stabilization of the energy of electrons. First, a case where F is added is described. As shown in FIG. 20(a), when F is simply introduced, extra electrons are introduced into the bottom of the conduction band. As a result, a high energy state is formed. However, if a metal is introduced as an additional material, electrons are transferred to a lower energy level (FIG. 20(b)) formed by the added metal, and extra electrons generated by the F addition are transferred (FIG. 20(c)). Accordingly, the energy of the entire structure becomes lower, and F can be more easily introduced than in conventional cases.

Introduction of Ta, F, or H can be selectively concentrated onto the regions of oxide films having a high-valence material added thereto. This is because electrons can be transferred to the high-valence material in the region in which the high-valence material exists, rather than being diffused in other regions, and a higher energy gain can be achieved accordingly.

When N is added, there is an electron shortage. The shortage of electrons leads to electron holes at the top of the conduction band (FIG. 21(a)). Normally, oxygen is released from negative charges, to obtain electrons. However, by introducing a metal additional material, an energy level is formed by the metal additional material (FIG. 21(b)), and electrons can be obtained from the energy level (FIG. 21(c)). At this point, the positions of electron holes formed by the N addition are lower in terms of energy than the position of the level of the metal. Through the acquirement of electrons, the energy of the entire structure becomes lower, and accordingly, N can be more easily introduced than in conventional cases.

Introduction of Mg, Ca, Sr, Ba, Al, Sc, Y, La, Ce, Pr, Nd, Pm, Sm, Eu, Gd, Tb, Dy, Ho, Er, Tm, Yb, Lu, N, C, or B can be selectively concentrated onto the regions of oxide films having a high-valence material added thereto. This is because electrons can be more easily received from the high-valence material in the region in which the high-valence material exists, rather than being diffused in other regions, and a higher energy gain can be achieved accordingly.

Any of those additional materials may be introduced by a technique involving ion implantation, a technique involving film formation and thermal diffusion, a technique involving introduction of the additional material from an atmosphere at the time of film formation, a technique involving introduction of the additional material from an atmosphere after film formation, a technique involving introduction of the additional material in the form of a film forming gas such as CVD (Chemical Vapor Deposition) or ALD (Atomic Layer Deposition), a technique involving introduction of the additional material as a sputtering target, a technique involving injection of the additional material into the substrate, the sidewalls or the like and thermal diffusion of the additional material in a later thermal process, or the like. Particularly, even F or N can be introduced into a Si substrate, and then into the interfacial control oxide films in the thermal process. Since F or N can be easily introduced into the interfacial control oxide films as described above, F or N can be selectively and exclusively introduced into the interfacial control oxide films through the substrate and the gate insulating film.

In the silicate of $TiO_2$ (TiSiO), a $Si_3N_4$ structure is normally formed first, if nitrogen is added. In other words, nitrogen is not introduced into $TiO_2$, but leads to Si—N bonds. However, if a metal additional material is introduced, nitrogen is introduced into the $TiO_2$ side, and the energy is lowered accordingly, as described above. In other words, Ti—N bonds are formed first. As is apparent from this fact, level adjustment also can be performed in a silicate with the use of nitrogen or the like.

Next, the relative amount of the second additional material is described.

First, the relative amount of an additional material such as N in the case of Type-A is described.

With respect to the additive amount [α](atoms/cm²) of an element a selected from the group consisting of Ta, Nb, and W, the additive amount [β] (atoms/cm²) of an element β selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu satisfies the following relation (1):

$$0.17 \times [\alpha] < [\beta] \times K < [\alpha] \times ([\text{number of outermost shell electrons of element } \alpha] - 4) \quad (1)$$

Here, the number of electrons in the outermost shell of the element α is 5 in the case of Ta or Nb, and is 6 in the case of W. Meanwhile, K takes the following values:
  where the element β is N, K is 1,
  where the element β is C, K is 2,
  where the element β is B, K is 3,
  where the element β is Mg, Ca, Sr, or Ba, K is 2, and
  where the element β is Al, Sc, Y, La, Ce, Pr, Nd, Pm, Sm, Eu, Gd, Tb, Dy, Ho, Er, Tm, Yb, or Lu, K is 1.

Where the element β is N, C, or B, the number of electrons in the outermost shell is smaller than the number of electrons in the outermost shell in the case of oxygen (O) by 1, 2, or 3, respectively. Therefore, the number of electrons the added element β can receive when substituting oxygen is 1, 2, or 3, which is the value of K. Where the element β is Mg, Ca, Sr, or Ba, the number of electrons released is smaller than the number of electrons released in the case of tetravalent titanium (Ti) by 2, since the element β is divalent. Therefore, when the element β is added, two holes are formed at the upper edge of the valence band. Accordingly, the edge of the valence band can receive two electrons, and this value becomes the value of K. In other words, where the element β is Mg, Ca, Sr, or Ba, K represents the number of electrons the edge of the valence band can receive. Where the element β is Al, Sc, Y, La, Ce, Pr, Nd, Pm, Sm, Eu, Gd, Tb, Dy, Ho, Er, Tm, Yb, or Lu, the number of electrons the upper edge of the valence band can receive when the element β is added is one, since the element β is trivalent. This value becomes the value of K. Accordingly, [β]×K represents the amount of electrons that can be received by adding the element β. The relative upper limit is determined by the fact that only up to {[number of outermost shell electrons of element α]−4} of electrons can be released from the level formed by the element α.

Also, ([number of outermost shell electrons of element α]−4) is the number of electrons that can be released from the first additional material. The lower limit can be considered to be 0.17×[α]<[β]×K. This is because the electron releasing effect (lowering of the level position) starts becoming visible when electrons enter the positions of the Ti atoms around the position of one Ti atom. Since there are six Ti atoms at a maximum around the one Ti atom, the effect of an electron correlation does not become visible, unless the lower limit is approximately ⅙=0.166.

The basic structure of TiO₂ is a rutile structure. In this basic structure, six oxygen atoms exist near a Ti atom, and six Ti atoms exist outside the six oxygen atoms. Basically, the maximum number of outside Ti atoms is six. Even in some other structure such as an amorphous structure, there are not changes in the basic electron states such as the fact that the conduction band is formed with the 3d components of Ti, and the fact that the valence band is formed with the 2p components of oxygen.

Although there is only one kind of first element a to be added in the above description, two kinds of first elements may be added. In such a case, the additive amount [α] is the sum of the two elements to be added. Also, there is only one kind of second element β to be added in the above description, but two or more kinds of second elements may be added. In such a case, the [β]×K in the relation (1) is the sum of the products of K and the additive amount of second elements to be added. For example, In a case where the second elements to be added are $\beta_1$ and $\beta_2$, and the values of K corresponding to those second elements are $K_1$ and $K_2$, the [β]×K in the relation (1) should be $[\beta_1] \times K_1 + [\beta_2] \times K_2$. This also applies to the cases described below. To achieve the effects of the embodiment of the present invention by adding an additional material, the amount of the additional material needs to be at least $1.0 \times 10^{12}$ atoms/cm² (=$0.17 \times 6 \times 10^{12}$ atoms/cm²), since a level is not formed in the gap if the amount is less than $6 \times 10^{12}$ atoms/cm² in areal density. If the areal density of an additional material is less than $1.0 \times 10^{12}$ atoms/cm², the additional material can be considered to be an impurity material.

Cases where Ti is substituted have been described so far, but these cases include cases where Ti in $SrTiO_3$ is substituted. In the case of $SrTiO_3$, however, Type-A is formed even if Sr is substituted by La, Y, or Sc. In this case, the difference in valence between Sr and La, Y, or Sc is 1. Since there are 12 oxygen atoms around Sr, the lower limit is changed from ⅙=0.166, which is the lower limit in the case of Ti, to 1/12=0.08. As long as attention is paid to these two points, the same concept as above can be applied. Also, a divalent material such as Ca, Sr, or Ba does not affect charge introduction and release, even if Sr is substituted by one of the divalent material. Therefore, attention also need to be paid to the fact that those divalent materials do not function as the second additional materials to receive electrons. In the following, explanation of the attention that should be paid when $SrTiO_3$ is used is not repeated for the other Types, but attention should be paid to the above-mentioned points in any Type.

Next, the relative amount of an additional material such as N or F in the case of Type-B is described.

With respect to the additive amount [Mo] (atoms/cm²) of Mo added to $HfO_2$, F, H, or Ta is added to form an n-MOS transistor, and N or the like is added to form a p-MOS transistor.

The additive amount [γ] (atoms/cm²) of a first element γ selected from the group consisting of F, H, and Ta satisfies the following relation (2):

$$0.17 \times [\text{Mo}] < [\gamma] < [\text{Mo}] \times 2 \quad (2)$$

and the additive amount [δ] (atoms/cm²) of a second element δ selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu satisfies the following relation (3):

$$0.17 \times [\text{Mo}] < [\delta] \times K < [\text{Mo}] \times 2 \quad (3)$$

Since the number of electrons in the outermost shell of Mo is six, the upper limit on the n-MOS transistor side is determined when [the amount of Mo×2] of electrons are received, and the lower limit on the p-MOS transistor side is determined when [the amount of Mo×2] of electrons are released. Here, K represents the number of electrons that can be received through the addition of the second element δ. More specifically, K takes the following values:
  where the second element δ is N, K is 1,
  where the second element δ is C, K is 2,
  where the second element δ is B, K is 3,
  where the second element δ is Mg, Ca, Sr, or Ba, K is 2, and
  where the second element δ is Al, Sc, Y, La, Ce, Pr, Nd, Pm, Sm, Eu, Gd, Tb, Dy, Ho, Er, Tm, Yb, or Lu, K is 1.

In a case where a second element such as nitrogen (N) is added to both the n-MIS transistor and the p-MIS transistor to form a CMIS device of Type-B or a CMIS device having Mo or the like added thereto, N is added to the first oxide film of the n-MIS transistor and the second oxide film of the p-MIS transistor, so as to form a p-MIS transistor used as an interfacial control oxide film or a gate electrode. After that, a first element such as F is added only to the first oxide film, and an n-MOS transistor used as an interfacial control oxide film or a gate electrode is formed.

In this case, with respect to the additive amount [Mo] (atoms/cm$^2$) of Mo, the additive amount [γ] (atoms/cm$^2$) of a first element γ (such as F, H, or Ta) and the additive amount [γ] (atoms/cm$^2$) of a second element δ (such as N) satisfy the following relations (4) and (5):

$$0.17\times[Mo]<[\gamma]<[Mo]\times 2+[\delta]\times K \quad (4)$$

and $$0.17\times[Mo]<[\delta]\times K<[Mo]\times 2 \quad (5)$$

Here, K represents the number of electrons that can be received through the addition of the second element δ. According to the relation (4), the lower limit is the same as the value according to the relation (2), and the upper limit reflects the fact that the amount of electrons Mo can receive is increased. The relation (5) is the same as the relation (3).

In a case where a first element such as fluorine (F) is added to both the n-MIS transistor and the p-MIS transistor to form a CMIS device of Type-B or a CMIS device having Mo or the like added thereto, F is added to the first oxide film of the n-MIS transistor and the second oxide film of the p-MIS transistor, so as to form an n-MIS transistor used as an interfacial control oxide film or a gate electrode. After that, a first element such as F is added only to the second oxide film, and a p-MOS transistor used an interfacial control oxide film or a gate electrode is formed.

In this case, with respect to the additive amount [Mo] (atoms/cm$^2$) of Mo, the additive amount [∈] (atoms/cm$^2$) of a first element ∈ (such as F, H, or Ta) and the additive amount [ζ] (atoms/cm$^2$) of a second element ζ (such as N) satisfy the following relations (6) and (7):

$$0.17\times[Mo]<[\in]<[Mo]\times 2 \quad (6)$$

and $$0.17\times[Mo]<[\zeta]\times K<[Mo]\times 2+[\in] \quad (7)$$

Here, K represents the number of electrons that can be received through the addition of the second element ζ. Since F releases only one electron when added, the contents of the relation (6) are the same as the contents of the relation (2) in a case K is 1. According to the relation (7), the lower limit is the same as the value according to the relation (2), and the upper limit reflects the fact that the amount of electrons Mo can release is increased.

Next, the relative amount of an additional material such as F in the case of Type-C is described.

With respect to the additive amount [η] (atoms/cm$^2$) of a first element η as an additional metal, the additive amount [θ] (atoms/cm$^2$) of a second element θ selected from the group consisting of F, H, and Ta satisfies the following relation (8):

$$0.17\times[\eta]<[\theta]<[\eta]\times(10-[\text{number of outermost shell electrons of first element }\eta]) \quad (8)$$

Here, the number of outermost shell electrons of the first element η is five when the first element η is V, six when the first element η is Cr, seven when the first element η is Mn, Tc, or Re, eight when the first element η is Fe, Ru, or Os, and nine when the first element η is Co, Rh, or Ir.

When the first element η is Ni, Pd, or Pt, the following relation (9) is satisfied:

$$0.17\times[\eta]<[\theta]<[\eta]\times(14-[\text{number of outermost shell electrons of first element }\eta]) \quad (9)$$

The number of outermost shell electrons of the first element η is 10. Since three states are filled when Ni, Pd, or Pt is used, two states become important. When one of those materials is used, the three states appear in the vicinities of the two states, and a situation where there are almost five states as illustrated in FIGS. 16, 17, and 18 should be approximated.

EXAMPLES

The following is a detailed description of examples of the present invention, with reference to the accompanying drawings.

Example 1

Type A, n-Si

FIGS. 22(a) and 22(b) show a semiconductor device of Example 1 of the present invention. As shown in FIG. 22(a), the semiconductor device of this example has a stacked structure formed with a W-added TiO$_2$ film 42 on an n-type silicon substrate 22, and a metal film 44 made of W and formed on the TiO$_2$ film 42. The W added to TiO$_2$ is an additional material of Type-A that forms a level in the band in a position higher than the bottom of the conduction band of Si when added. Through the addition of W, a junction with the n-type Si substrate without a barrier (a barrier-less junction) is formed.

The semiconductor device of this example is formed in the following manner. First, a TiO$_2$ film is formed by sputtering on the n-type Si substrate 22, and a W film is formed by sputtering on the TiO$_2$ film. After that, 1050° C. annealing is performed in vacuum, and 450° C. FGA (Foaming Gas Annealing) is performed in a H$_2$ atmosphere. Through this thermal process, W diffuses into TiO$_2$, and a level in the gap in TiO$_2$ is formed in the neighborhood of 3.9 eV in work function. The level in the gap is caused by the addition of W to TiO$_2$. The band lineup is shown in FIG. 22(b). The semiconductor device can be effectively manufactured by a simultaneous sputtering technique using the two targets of a TiO$_2$ target and a W target. When the electric characteristics of the junction between the W-added TiO$_2$ film 42 and the metal film 44 made of W are measured, it becomes apparent that the interfacial contact resistance is very low, and ohmic properties are observed. The ohmic properties are caused by the pinning of the work function of the metal to the level in the gap, as shown in FIG. 22(b). Although W is used as an additional material in this example, Ta or Nb may be used instead. When Ta or Nb is introduced, a simultaneous sputtering technique is effectively employed, and a TiO$_2$ target and a Ta (Nb) target are used. In a case where Ta is added, electrons are supplied to the bottom of the conduction band of TiO$_2$. To supply electrons into the states in the gap, Ta might be used. In a TiO$_2$ film having Ta added thereto, a state in which the work function is 3.9 eV can be created. Further, TiO$_2$ is used as the base Ti oxide in this example. However, La$_2$Ti$_2$O$_7$, TiSiO, SrTiO$_3$, or the like can be used likewise. By using each suitable target, the same structure as above can be formed by the same process as above. In the case of a SrTiO$_3$ base, it is also effective to create a film having La, Y, or Sc added thereto. In that case, a simultaneous sputtering technique using the two targets of a SrTiO$_3$ target and a Y$_2$O$_3$ target is effectively utilized.

In a case where the semiconductor device of this example is applied to the n-type Si source/drain regions and the source/drain metal electrodes in an n-MISFET, the work function of the W-added $TiO_2$ film 42 is effectively set at 4.0 eV, with the stacked structure of the gate insulating film and the metal gate electrode formed on the gate insulating film in the n-MISFET being taken into consideration.

It is also possible to further add N or the like to the W-added $TiO_2$ film 42. If N or the like is not added, the work function obtained only through the addition of W is approximately 3.9 eV. The work function obtained only through an addition of Nb is also approximately 3.9 eV. Particularly, through the addition of Nb, the bottom of the conduction band of $TiO_2$ is formed with Ti, and Ti and Nb have a large interaction with each other. Accordingly, the work function is considered to be approximately 3.9 eV. To achieve a larger work function than 3.9 eV, it suffices only to introduce N or the like, for example. By doing so, electrons are released from the level in the gap, and the level can be made deeper. Other than nitrogen (N), the work function can be made larger by introducing some other electron-accepting material (C, B, Mg, Ca, Sr, Ba, Al, Sc, Y, La, Ce, Pr, Nd, Pm, Sm, Eu, Gd, Tb, Dy, Ho, Er, Tm, Yb, or Lu).

To make the work function smaller, Hf or Zr can be effectively introduced. The bottom of the conduction band can be made higher by virtue of the interaction between Ti and Hf or Zr, and the work function can be made smaller accordingly. The position of the bottom of the conduction band of Ti is approximately 3.9 eV, and should be 4.05 eV or less and 4.0 eV or less in the cases of a Si substrate and a Ge substrate. Therefore, the work function does not need to be made smaller, for the time being. However, in a case where the bottom of the conduction band of a subject semiconductor substrate is lower than 3.9 eV, interfacial control oxide films that can cope with smaller work functions can be designed with the use of Hf or Zr.

To make the work function smaller, it is also possible to introduce Ta, F, or H, as already mentioned.

Comparative Example 1

Figure 23:
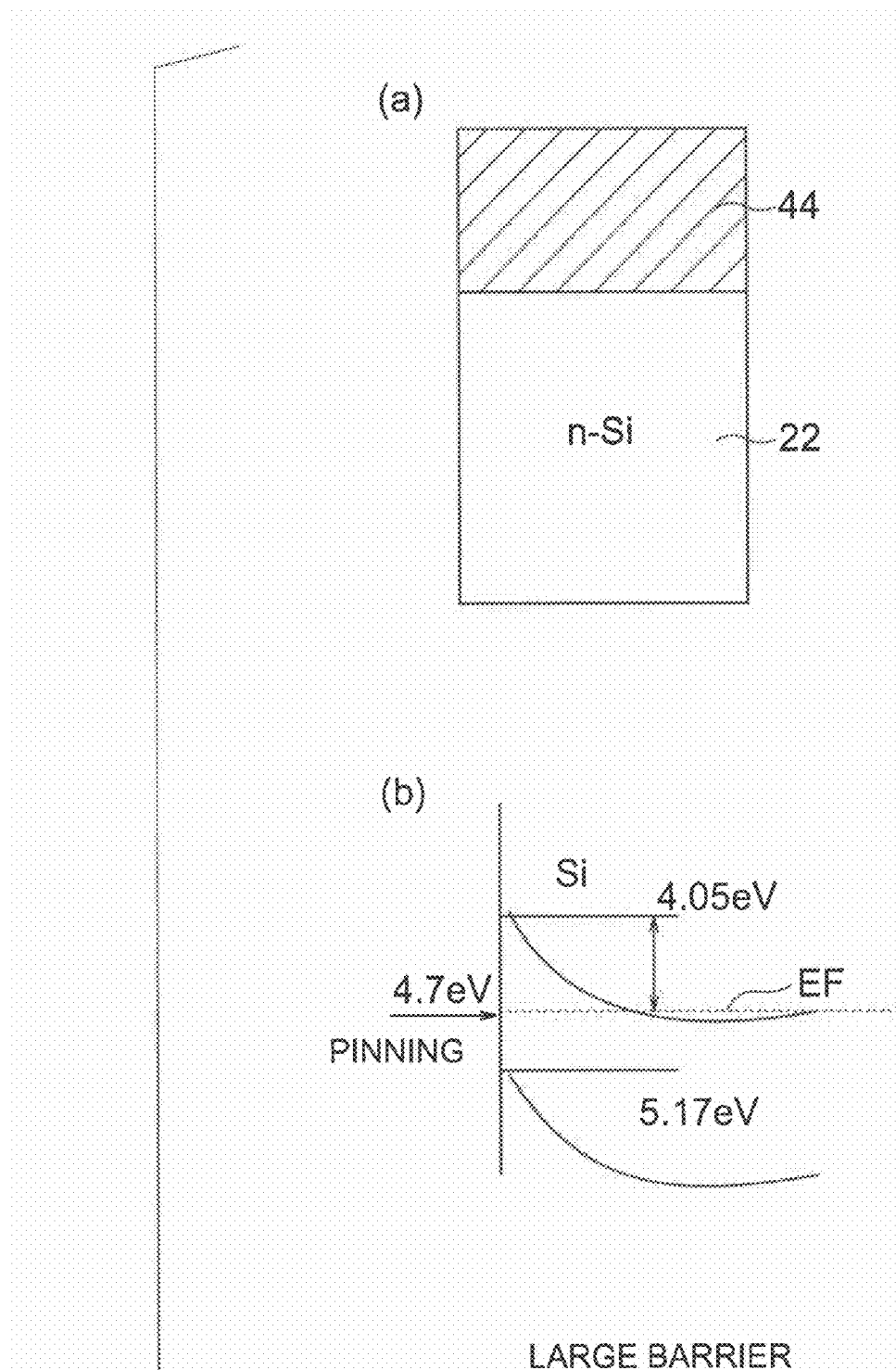
FIGS. 23(a) and 23(b) are diagrams showing a semiconductor device according to Comparative Example 1 of Example 1.

FIGS. 23(a) and 23(b) show a semiconductor device of Comparative Example 1 of this example. The semiconductor device of Comparative Example 1 is the same as the semiconductor device of Example 1 illustrated in FIG. 22(a), except that the W-added $TiO_2$ film 42 is removed. The semiconductor device of this comparative example is formed in the following manner.

First, as shown in FIG. 23(a), a W film 44 is formed on an n-type Si substrate 22, and 450° C. annealing is performed in vacuum. After that, 1050° C. annealing is performed in vacuum, and 450° C. FGA (Foaming Gas Annealing) is performed in a $H_2$ atmosphere. When the electric characteristics of the junction between the n-type Si substrate 22 and the W film 44 are measured, it becomes apparent that the interfacial contact resistance is very high, and ohmic properties cannot be observed. This is because the metal is pinned onto Si, as can be seen from the band lineup shown in FIG. 23(b). The pinned position is the position of approximately 4.7 eV in work function, and the height of the barrier is as large as 0.65 eV (=4.7−4.05). Compared with the value in Example 1, the resistance is much higher.

Comparative Example 2

A semiconductor device of Comparative Example 2 of this example is now described. The semiconductor device of Comparative Example 2 is the same as the semiconductor device of Example 1 illustrated in FIG. 22(a), except that the W-added $TiO_2$ film 42 is replaced with a $Si_3N_4$ thin film having no additional materials added thereto. The $Si_3N_4$ film having no additional materials added thereto is used between the metal film and the n-type Si substrate, and the height of the barrier is greatly lowered. More specifically, for the metal having an n-type work function, the barrier height is in the range of 0.2 eV to 0.3 eV. When the electric characteristics of the junction between the metal film and the $Si_3N_4$ film are measured, no ohmic properties are observed. This is because the tunnel resistance of the $Si_3N_4$ film is high. Compared with the value in Example 1, the resistance is higher. This confirms that it is difficult to optimize the work function by simply introducing a thin film (made of $Si_3N_4$, $Al_2O_3$, $SiO_2$, $GeO_2$, $TiO_2$, $HfO_2$, $ZrO_2$, or the like), and the tunnel resistance becomes higher. However, since a $TiO_2$ film has a low tunnel barrier, a slightly thicker film can be advantageously formed with the $TiO_2$ film.

Modifications

Where $TiO_2$ Containing Many Oxygen Defects is Interposed

When oxygen defects are formed, a state appears in a position in the range of 3.9 eV to 4.0 eV in the vicinity of the conduction band bottom. This is considered effective in connections with n-type Si and the likes. The amount of oxygen defects is very small, if oxygen defects are formed by controlling the oxygen amount. However, by introducing nitrogen (N), oxygen defects are formed, and a sufficient number of oxygen defects can be secured.

As already mentioned, the work function can also be made larger by introducing an electron-accepting material other than nitrogen (N).

(Modification 1) Type-A, p-Si

Figure 24:
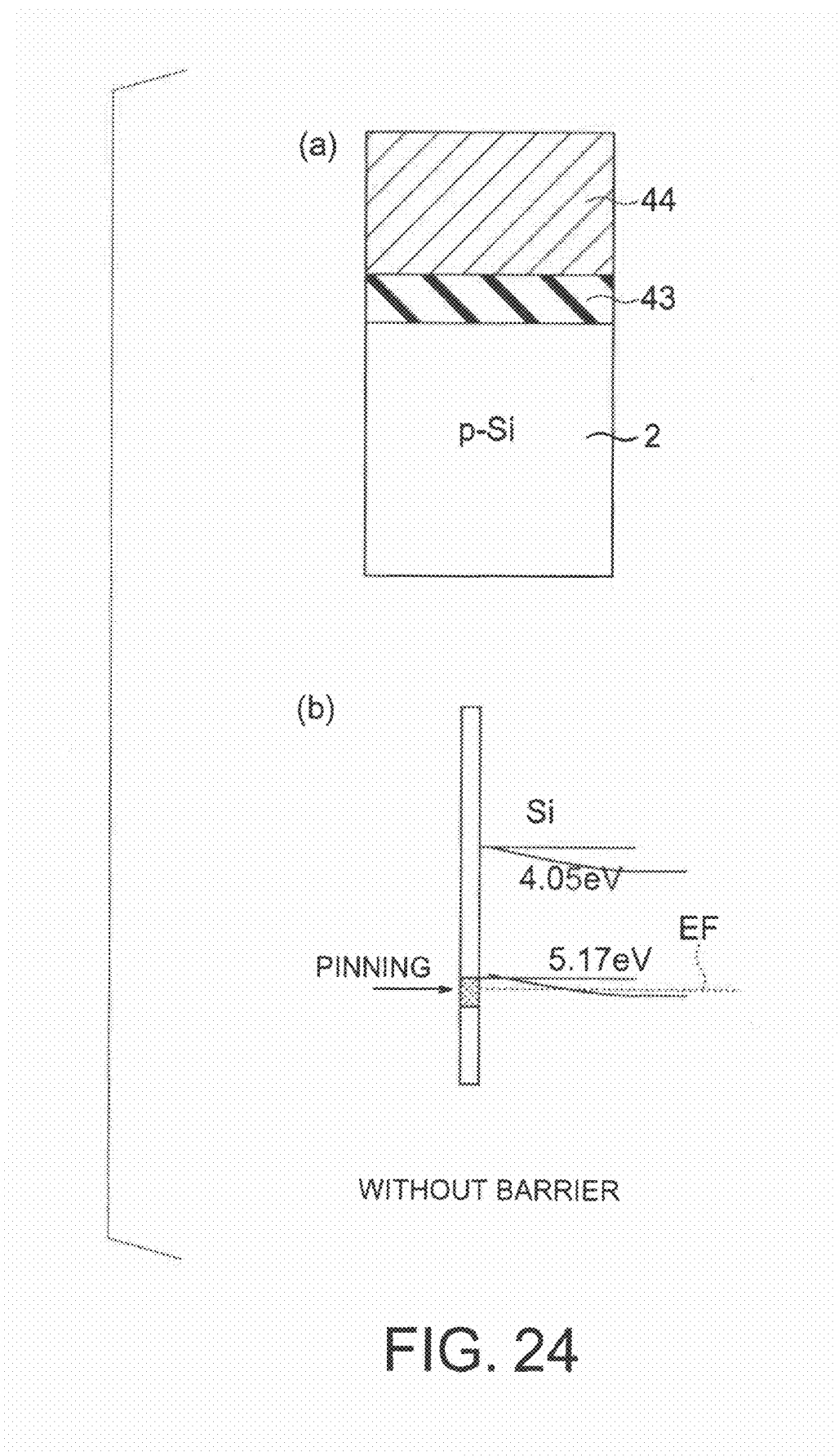
FIGS. 24(a) and 24(b) are diagrams showing a semiconductor device according to Modification 1 of Example 1.

FIGS. 24(a) and 24(b) show a semiconductor device according to Modification 1 of this example. The semiconductor device of this modification has a stacked structure formed with a W-added TiON film 43 on a p-type silicon substrate 2, and a metal film 44 made of W and formed on the TiON film 43. The W added to $TiO_2$ is an additional material of Type-A that forms a level in the band in a position higher than the bottom of the conduction band of Si when added. By further adding N, the level in the band can be located lower than the top of the valence band of Si. Through the additions of N and W, a junction with the p-type Si substrate without a barrier (a barrier-less junction) is formed.

The semiconductor device of this modification is formed in the following manner. The W-added TiON film 43 is formed on the p-type silicon substrate 2. This TiON film 43 is formed in an $Ar/O_2/N_2$ atmosphere by simultaneous sputtering using the two targets of a W target and a $TiO_2$ target. During the film formation, nitrogen is introduced into the film, and 450° C. annealing is performed in a $N_2$ atmosphere. After that, 1050° C. annealing is performed in vacuum, and 450-° C. FGA (Foaming Gas Annealing) is performed in a $H_2$ atmosphere. By optimizing the $N_2$ partial pressure during the film formation and the $N_2$ annealing condition after the film formation, a level in the gap in $TiO_2$ is formed in the neighborhood of 5.3 eV in work function. To form this level in the gap, the level formed through the addition of W to $TiO_2$ is moved by further adding nitrogen. The band lineup is shown in FIG. 24(b). When the electric characteristics of the junction between the HfON film 43 and the metal film 44 are measured, it becomes apparent that the interfacial contact resistance is very low, and ohmic properties are observed. The ohmic properties are caused by the pinning of the work function of the metal to the level in the gap shown in FIG. 24(b).

Although nitrogen (N) is introduced to optimize the work function in this modification, it is also possible to optimize the work function by introducing some other electron-accepting material, instead of N. In either case, the work function can be adjusted to approximately 5.3 eV.

Although W is used as the additional material to the interfacial control oxide film in this modification, it is also possible to use Ta or Nb. Also, the same effects as above can be achieved by using a $SrTiO_3$-based film as the interfacial control oxide film, instead of a TiON film.

(Modification 2) Type-B, n-Si

Next, a semiconductor device according to Modification 2 of this example is described. The semiconductor device of this modification has the same structure as the semiconductor device of Example 1 illustrated in FIG. 22(a), except that Mo (molybdenum) and F (fluorine) are used as the additional materials to be added to $TiO_2$. The Mo added to $TiO_2$ is an additional material of Type-B that forms a level in the band in a position between the conduction band and the valence band of Si when added. With this arrangement, a junction with an n-type Si substrate can be formed without a barrier.

The semiconductor device of this modification is formed in the following manner. First, a Mo-added $TiO_2$ film is formed on an n-type Si substrate. Film formation is performed in an $Ar/O_2$ atmosphere by simultaneous sputtering using the two targets of a Mo target and a $TiO_2$ target, and F ions are then implanted. After that, 1050° C. annealing is performed in vacuum, and 450° C. FGA (Foaming Gas Annealing) is performed in a $H_2$ atmosphere. By optimizing the amount of F ions implanted, a level in the gap in $TiO_2$ is formed in the neighborhood of 3.9 eV in work function. To form this level in the gap, the level formed through the addition of Mo to $TiO_2$ is moved by further adding fluorine. The band lineup here is the same as that shown in FIG. 22(b). When the electric characteristics of the junction between the $TiO_2$ film having Mo and F added thereto and the metal film are measured, it becomes apparent that the interfacial contact resistance is very low, and ohmic properties are observed. The ohmic properties are caused by the pinning of the work function of the metal to the level in the gap shown in FIG. 22(b).

Although fluorine (F) is introduced to optimize the work function in this modification, it is also possible to optimize the work function by introducing H or Ta, instead of F. In either case, the work function can be adjusted to approximately 3.9 eV. Also, the same effects as above can be achieved by using a $SrTiO_3$-based film as the interfacial control oxide film, instead of a $TiO_2$ film.

(Modification 3) Type-B, p-Si

Next, a semiconductor device according to Modification 3 of this example is described. The semiconductor device of this modification has the same structure as the semiconductor device of Modification 1 illustrated in FIG. 24(a), except that Mo (molybdenum) and N (nitrogen) are used as the additional materials to be added to $TiO_2$. The Mo added to $TiO_2$ is an additional material of Type-B that forms a level in the band in a position between the conduction band and the valence band of Si when added. With this arrangement, a barrier-less junction with a p-type Si substrate can be formed.

The semiconductor device of this modification is formed in the following manner. First, a Mo-added TiON film is formed on a p-type Si substrate. A W film is formed on the TiON film by sputtering. The Mo-added TiON film is formed in an $Ar/O_2/N_2$ atmosphere by simultaneous sputtering using the two targets of a Mo target and a $TiO_2$ target. During the film formation, nitrogen is introduced into the film, followed by 450° C. annealing in a $N_2$ atmosphere. After that, 1050° C. annealing is performed in vacuum, and 450° C. FGA (Foaming Gas Annealing) is performed in a $H_2$ atmosphere. By optimizing the $N_2$ partial pressure during the film formation and the $N_2$ annealing condition after the film formation, a level in the gap in $TiO_2$ is formed in the neighborhood of 5.3 eV in work function. To form this level in the gap, the level formed through the addition of Mo to $TiO_2$ is moved by further adding nitrogen. The band lineup here is the same as that shown in FIG. 24(b). When the electric characteristics of the junction between the Mo-added TiON film and the W film are measured, it becomes apparent that the interfacial contact resistance is very low, and ohmic properties are observed. The ohmic properties are caused by the pinning of the work function of the metal to the level in the gap shown in FIG. 24(b).

Although nitrogen (N) is introduced to optimize the work function in this modification, it is also possible to optimize the work function by introducing some other electron-accepting material, instead of N. In either case, the work function can be adjusted to approximately 5.3 eV. Also, the same effects as above can be achieved by using a $SrTiO_3$-based film as the interfacial control oxide film, instead of a $TiO_2$ film.

(Modification 4) Type-C, n-Si

Next, a semiconductor device according to Modification 4 of this example is described. The semiconductor device of this modification has the same structure as the semiconductor device of Example 1 illustrated in FIG. 22(a), except that an additional material to be added to $TiO_2$ is a material of Type-C. More specifically, V (vanadium) and H (hydrogen) are used as the additional materials to be added to $TiO_2$. The V added to $TiO_2$ is the additional material of Type-C that forms a level in the band in a position lower than the top of the valence band of Si when added. With this arrangement, a barrier-less junction with an n-type Si substrate can be formed.

The semiconductor device of this modification is formed in the following manner. First, a V-added $TiO_2$ film is formed on an n-type Si substrate. A W film is formed on the $TiO_2$ film by sputtering. The V-added $TiO_2$ film is formed in an $Ar/O_2$ atmosphere by simultaneous sputtering using the two targets of a V target and a $TiO_2$ target. The sample is then left in plasma H at room temperature, so as to introduce hydrogen atoms into the V-added $TiO_2$ film at the interface. After that, 1050° C. annealing is performed in vacuum, and 450° C. FGA (Foaming Gas Annealing) is performed in a $H_2$ atmosphere. By optimizing the time and temperature for the leaving in the plasma H, a level in the gap in $TiO_2$ is formed in the neighborhood of 3.9 eV in work function. To form this level in the gap, the level formed through the addition of V to $TiO_2$ is moved by further adding hydrogen. The band lineup here is the same as that shown in FIG. 22(b). When the electric characteristics of the junction between the $TiO_2$ film having V added thereto and the W film are measured, it becomes apparent that the interfacial contact resistance is very low, and ohmic properties are observed. The ohmic properties are caused by the pinning of the work function of the metal to the level in the gap shown in FIG. 22(b).

Although hydrogen (H) is introduced to optimize the work function in this modification, it is also possible to optimize the work function by introducing F or Ta, instead of H. In either case, the work function can be adjusted to approximately 3.9 eV.

Although V is used as an additional material in this modification, it is also possible to use Cr, Mn, Fe, Co, Ni, Tc, Ru, Rh, Pd, Re, Os, Ir, or Pt, instead of V. The work functions of $TiO_2$ having those additional materials added thereto ranges from 5.2 eV to 6.5 eV. However, the work functions can be made smaller by introducing F, H, or Ta. Also, the same effects as above can be achieved by using a $SrTiO_3$-based film as the interfacial control oxide film, instead of a $TiO_2$ film.

(Modification 5) Type-C, p-Si

Next, a semiconductor device according to Modification 5 of this example is described. The semiconductor device of this modification has the same structure as the semiconductor device of Modification 1 illustrated in FIG. 24(a), except that an additional material to be added to $TiO_2$ is a material of Type-C. More specifically, V (vanadium) and Ta (tantalum) are used as the additional materials to be added to $TiO_2$. The V added to $TiO_2$ is an additional material of Type-C that forms a level in the band in a position lower than the top of the valence band of Si when added. With this arrangement, a barrier-less junction with a p-type Si substrate can be formed.

The semiconductor device of this modification is formed in the following manner. First, a V- and Ta-added $TiO_2$ film is formed on a p-type Si substrate. A W film is formed on the $TiO_2$ film by sputtering. The V- and Ta-added $TiO_2$ film is formed in an $Ar/O_2$ atmosphere by simultaneous sputtering using the three targets of a V target, a Ta target, and a $TiO_2$ target. After that, 1050° C. annealing is performed in vacuum, and 450° C. FGA (Foaming Gas Annealing) is performed in a $H_2$ atmosphere. The additive amounts can be optimized by adjusting the electric power supplied to each target. A level in the gap in $TiO_2$ is formed in the neighborhood of 5.3 eV in work function. To form this level in the gap, the level formed through the addition of V to $TiO_2$ is moved by further adding Ta. The band lineup here is the same as that shown in FIG. 24(b). When the electric characteristics of the junction between the $TiO_2$ film having V and Ta added thereto and the W film are measured, it becomes apparent that the interfacial contact resistance is very low, and ohmic properties are observed. The ohmic properties are caused by the pinning of the work function of the metal to the level in the gap shown in FIG. 24(b).

Although tantalum (Ta) is introduced to optimize the work function in this modification, it is also possible to optimize the work function by introducing F or H, instead of Ta. In either case, the work function can be adjusted to approximately 5.3 eV.

Although V is used as an additional material in this modification, it is also possible to use Cr, Mn, Fe, Co, Ni, Tc, Ru, Rh, Pd, Re, Os, Ir, or Pt, instead of V. Also, the same effects as above can be achieved by using a $SrTiO_3$-based film as the interfacial control oxide film, instead of a $TiO_2$ film.

Although Ta (or F, H) is used to elevate the level in the gap in this modification, any of those materials may not be used. In such a case, very deep work-function states are formed. As long as only the contact between a p-type semiconductor and a metal (Si and a metal or Ge and a metal) should be ohmic, Ta (or F, H) does not need to be introduced after an additional material of Type-C is added.

Example 2

Type-A, n-Ge

FIGS. 25(a) and 25(b) show a semiconductor device according to Example 2 of the present invention. As shown in FIG. 25(a), the semiconductor device of this example has a stacked structure formed with a W-added $TiO_2$ film 50 on an n-type Ge substrate 48, and a metal film 52 made of W and formed on the $TiO_2$ film 50. The W added to $TiO_2$ is an additional material of Type-A that forms a level in the band in a position higher than the bottom of the conduction band of Ge when added. A barrier-less junction with the n-type Ge substrate is formed.

The semiconductor device of this example is formed in the following manner. First, a $TiO_2$ film is formed by sputtering on the n-type Ge substrate 48, and the W film 52 is formed by sputtering on the $TiO_2$ film. The procedures to be carried out thereafter are the same as those of Example 1. The band lineup observed here is shown in FIG. 25(b). Simultaneous sputtering using the two targets of a $TiO_2$ target and a W target is also effective. When the electric characteristics of the junction between the W-added $TiO_2$ film 50 and the W film 52 are measured, it becomes apparent that the interfacial contact resistance is very low, and ohmic properties are observed. The ohmic properties are caused by the pinning of the work function of the metal to the level in the gap, as shown in FIG. 25(b). Although W is used as an additional material in this example, Ta or Nb may be used instead.

It is also possible to further add N or the like to the W-added $TiO_2$ film. If N or the like is not added, the work function obtained only through the addition of W is approximately 3.9 eV. The work function obtained through an addition of Ta or Nb is also approximately 3.9 eV. It suffices only to introduce N or the like to achieve a larger work function than 3.9 eV, for example. However, if Ta is added, the states of Ta exist in the conduction band, and it is difficult to shift the band. Electrons are released from the level in the gap, and the level can be made deeper. Other than nitrogen (N), the work function can be made larger by introducing some other electron-accepting material. Also, the same effects as above can be achieved by using a $SrTiO_3$-based film as the interfacial control oxide film, instead of a $TiO_2$ film.

Comparative Example 1

Figure 26:
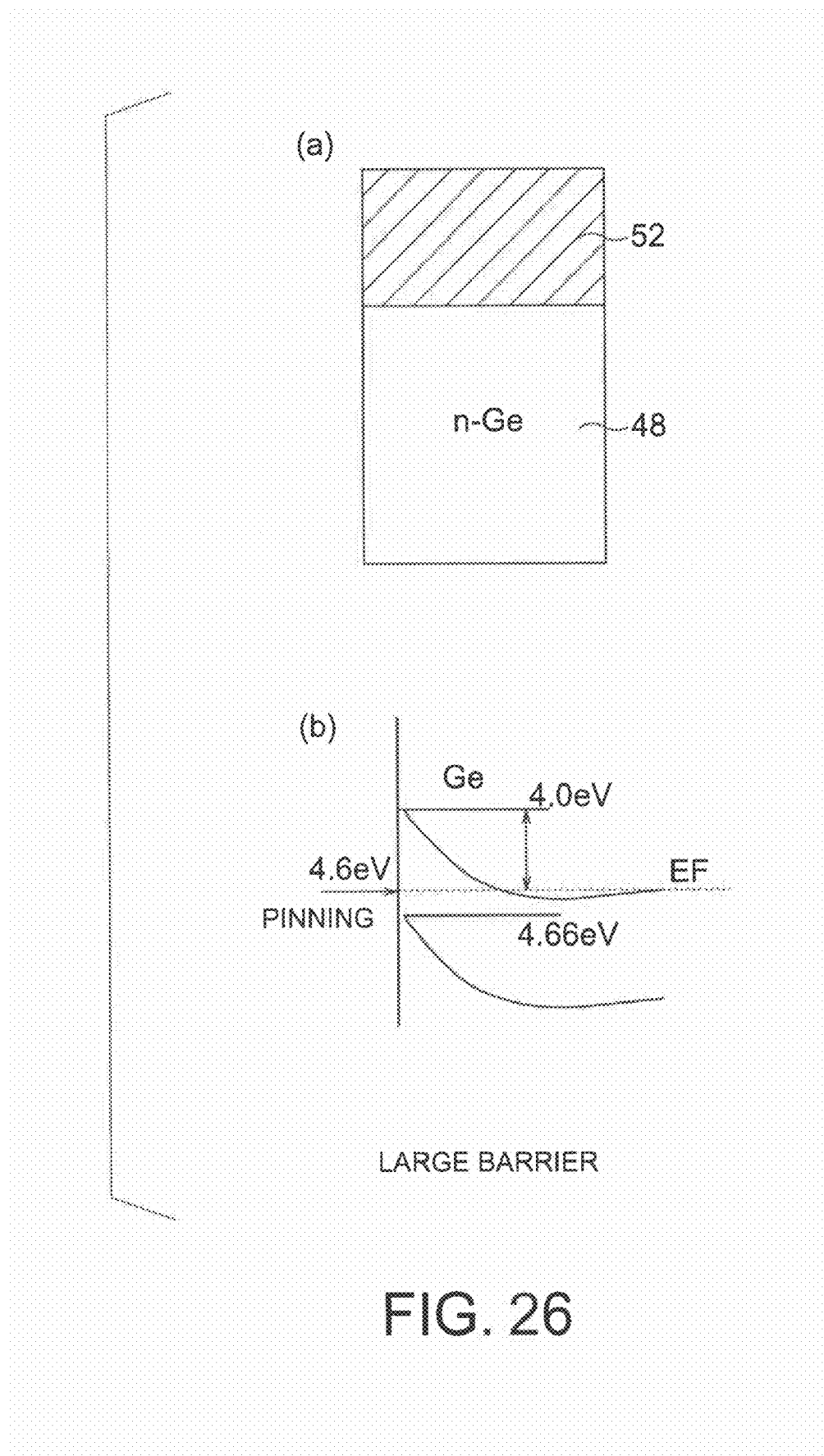
FIGS. 26(a) and 26(b) are diagrams showing a semiconductor device according to Comparative Example 1 of Example 2.

FIGS. 26(a) and 26(b) show a semiconductor device of Comparative Example 1 of this example. The semiconductor device of Comparative Example 1 is the same as the semiconductor device of Example 2 illustrated in FIG. 25(a), except that the W-added $TiO_2$ film 50 is removed. The semiconductor device of this comparative example is formed in the following manner.

First, as shown in FIG. 26(a), a W film 52 is formed on an n-type Ge substrate 48, and 450° C. annealing is performed in vacuum. After that, 1050° C. annealing is performed in vacuum, and 450° C. FGA (Foaming Gas Annealing) is performed in a $H_2$ atmosphere. When the electric characteristics of the junction between the n-type Ge substrate 48 and the W film 52 are measured, it becomes apparent that the interfacial contact resistance is very high, and ohmic properties are not observed. This is because the metal is pinned onto Si, as can be seen from the band lineup shown in FIG. 26(b). The pinned position is the position of approximately 4.6 eV in work function, and the height of the barrier is as large as 0.6 eV (=4.6−4.0). Compared with the value in Example 2, the resistance is much higher.

Comparative Example 2

A semiconductor device of Comparative Example 2 of this example is now described. The semiconductor device of Comparative Example 2 is the same as the semiconductor device of Example 2 illustrated in FIG. 25(a), except that the W-added $TiO_2$ film 50 is replaced with a $Si_3N_4$ thin film having no additional materials added thereto. The $Si_3N_4$ film having no additional materials added thereto is used between the metal film and the n-type Si substrate, and the height of the barrier is greatly lowered. More specifically, for the metal having an n-type work function, the barrier height is in the range of 0.2 eV to 0.3 eV. When the electric characteristics of the junction between the metal film and the $Si_3N_4$ film are measured, no ohmic properties are observed. This is because the tunnel resistance of the $Si_3N_4$ film is high. Compared with the value in Example 2, the resistance is higher. This confirms that it is difficult to optimize the work function by simply introducing a thin film (made of $Si_3N_4$, $Al_2O_3$, $SiO_2$, $GeO_2$, $TiO_2$, $HfO_2$, $ZrO_2$, or the like), and the tunnel resistance becomes higher.

(Modification 1) Type-A, p-Ge

Figure 27:
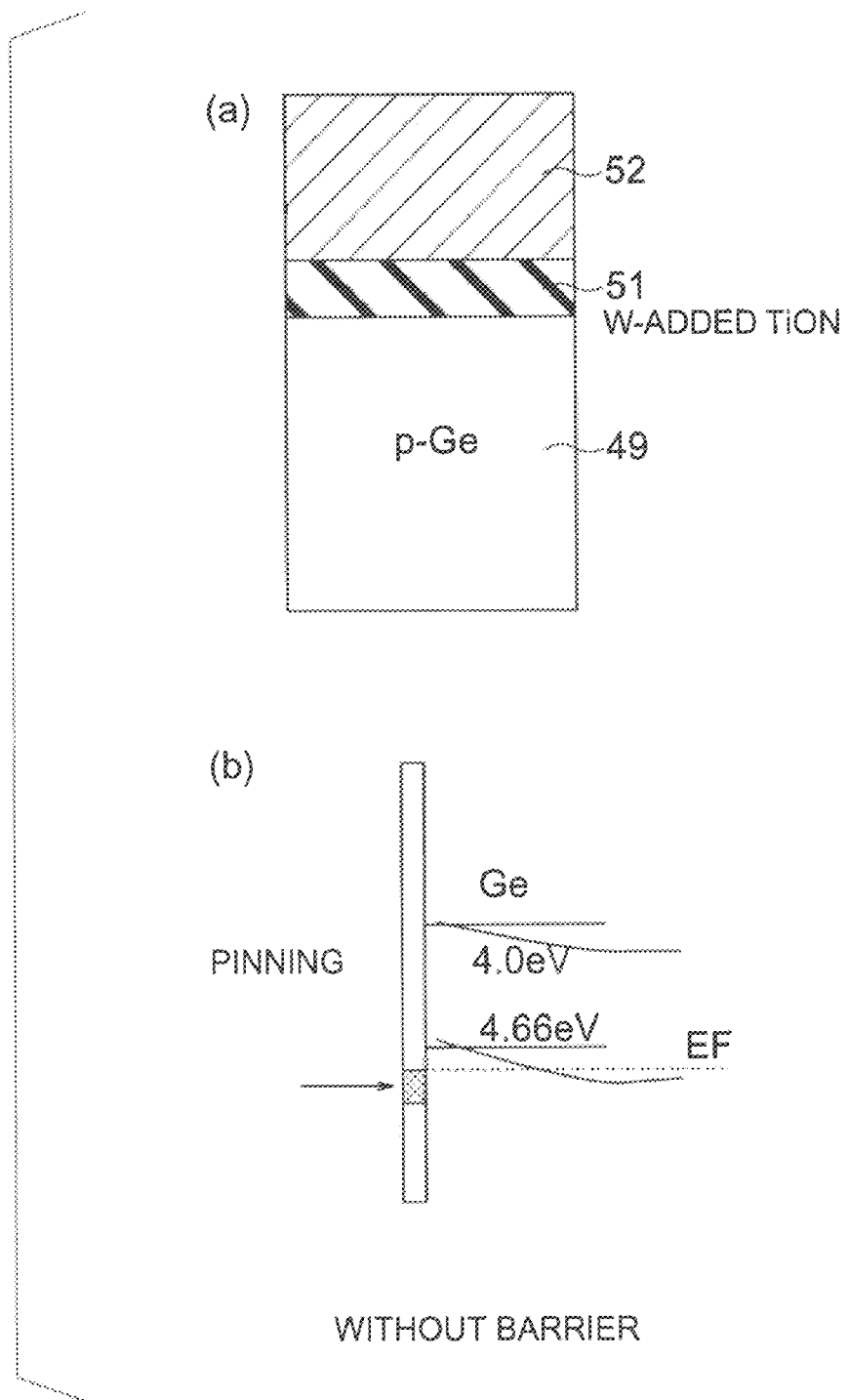
FIGS. 27(a) and 27(b) are diagrams showing a semiconductor device according to Modification 1 of Example 2.

FIGS. 27(a) and 27(b) show a semiconductor device according to Modification 1 of this example. The semiconductor device of this modification has a stacked structure formed with a W-added TiON film 51 on a p-type Ge substrate 49, and a metal film 52 made of W and formed on the TiON film 51. The W added to $TiO_2$ is an additional material of Type-A that forms a level in the band in a position higher than the bottom of the conduction band of Ge when added. By further adding N, the level in the band can be located lower than the top of the valence band of Ge. Through the additions of N and W, a junction with the p-type Ge substrate is formed without a barrier (barrier-less junction).

The semiconductor device of this modification is formed in the following manner. The W-added TiON film 51 is formed on the p-type Ge substrate 49. This TiON film 51 is formed in an $Ar/O_2/N_2$ atmosphere by simultaneous sputtering using the two targets of a W target and a $TiO_2$ target. During the film formation, nitrogen is introduced into the film, and 450° C. annealing is performed in a $N_2$ atmosphere. After that, 1050° C. annealing is performed in vacuum, and 450° C. FGA (Foaming Gas Annealing) is performed in a $H_2$ atmosphere. By optimizing the $N_2$ partial pressure during the film formation and the $N_2$ annealing condition after the film formation, a level in the gap in $TiO_2$ is formed in the neighborhood of 5.0 eV in work function. To form this level in the gap, the level formed through the addition of W to $TiO_2$ is moved by further adding nitrogen. The band lineup observed here is shown in FIG. 27(b). When the electric characteristics of the junction between the TiON film 51 and the metal film 52 are measured, it becomes apparent that the interfacial contact resistance is very low, and ohmic properties are observed. The ohmic properties are caused by the pinning of the work function of the metal to the level in the gap shown in FIG. 27(b).

Although nitrogen (N) is introduced to optimize the work function in this modification, it is also possible to optimize the work function by introducing some other electron-accepting material, instead of N. In either case, the work function can be adjusted to approximately 5.0 eV.

Although W is used as an additional material in this modification, it is also possible to use Ta or Nb. Also, the same effects as above can be achieved by using a $SrTiO_3$-based film, instead of a $TiO_2$-based film.

(Modification 2) Type-B, n-Ge

Next, a semiconductor device according to Modification 2 of this example is described. The semiconductor device of this modification has the same structure as the semiconductor device of Example 2 illustrated in FIG. 25(a), except that Mo (molybdenum) and F (fluorine) are used as the additional materials to be added to $TiO_2$. The Mo added to $TiO_2$ is an additional material of Type-B that forms a level in the band in a position between the conduction band and the valence band of Ge when added. With this arrangement, a barrier-less junction with an n-type Ge substrate can be formed.

The semiconductor device of this modification is formed in the following manner. First, a Mo-added $TiO_2$ film is formed on an n-type Ge substrate. A W film is formed by sputtering on the $TiO_2$ film. The Mo-added $TiO_2$ film is formed in an $Ar/O_2$ atmosphere by simultaneous sputtering using the two targets of a Mo target and a $TiO_2$ target, and F ions are then implanted. After that, 1050° C. annealing is performed in vacuum, and 450° C. FGA (Foaming Gas Annealing) is performed in a $H_2$ atmosphere. By optimizing the amount of F ions implanted, a level in the gap in $TiO_2$ is formed in the neighborhood of 3.9 eV in work function. To form this level in the gap, the level formed through the addition of Mo to $TiO_2$ is moved by further adding fluorine. The band lineup here is the same as that shown in FIG. 25(b). When the electric characteristics of the junction between the $TiO_2$ film having Mo and F added thereto and the metal film are measured, it becomes apparent that the interfacial contact resistance is very low, and ohmic properties are observed. The ohmic properties are caused by the pinning of the work function of the metal to the level in the gap shown in FIG. 25(b).

Although fluorine (F) is introduced to optimize the work function in this modification, it is also possible to optimize the work function by introducing H or Ta, instead of F. In either case, the work function can be adjusted to approximately 3.9 eV. Also, the same effects as above can be achieved by using a $SrTiO_3$-based film as the interfacial control oxide film, instead of a $TiO_2$ film.

(Modification 3) Type-B, p-Ge

Next, a semiconductor device according to Modification 3 of this example is described. The semiconductor device of this modification has the same structure as the semiconductor device of Modification 1 illustrated in FIG. 27(a), except that Mo (molybdenum) and N (nitrogen) are used as the additional materials to be added to $TiO_2$. The Mo added to $TiO_2$ is an additional material of Type-B that forms a level in the band in a position between the conduction band and the valence band of Ge when added. With this arrangement, a barrier-less junction with a p-type Ge substrate can be formed.

The semiconductor device of this modification is formed in the following manner. First, a Mo-added TiON film is formed on a p-type Ge substrate. A W film is formed on the TiON film by sputtering. The Mo-added TiON film is formed in an $Ar/O_2/N_2$ atmosphere by simultaneous sputtering using the two targets of a Mo target and a $TiO_2$ target. During the film formation, nitrogen is introduced into the film, followed by 450° C. annealing in a $N_2$ atmosphere. After that, 1050° C. annealing is performed in vacuum, and 450° C. FGA (Foaming Gas Annealing) is performed in a $H_2$ atmosphere. By optimizing the $N_2$ partial pressure during the film formation and the $N_2$ annealing condition after the film formation, a level in the gap in $TiO_2$ is formed in the neighborhood of 5.0 eV in work function. To form this level in the gap, the level formed through the addition of Mo to $TiO_2$ is moved by further adding nitrogen. The band lineup here is the same as that shown in FIG. 27(b). When the electric characteristics of the junction between the Mo-added TiON film and the W film are measured, it becomes apparent that the interfacial contact resistance is very low, and ohmic properties are observed. The ohmic properties are caused by the pinning of the work function of the metal to the level in the gap shown in FIG. 27(b).

Although nitrogen (N) is introduced to optimize the work function in this modification, it is also possible to optimize the work function by introducing some other electron-accepting material, instead of N. In either case, the work function can be adjusted to approximately 5.0 eV. Also, the same effects as above can be achieved by using a $SrTiO_3$-based film as the interfacial control oxide film, instead of a TiON film.

(Modification 4) Type-C, n-Ge

Next, a semiconductor device according to Modification 4 of this example is described. The semiconductor device of this modification has the same structure as the semiconductor device of Example 2 illustrated in FIG. 25(a), except that V (vanadium) and H (hydrogen) are used as the additional materials to be added to $TiO_2$. The V added to $TiO_2$ is an additional material of Type-C that forms a level in the band in a position lower than the top of the valence band of Ge when added. With this arrangement, a barrier-less junction with an n-type Ge substrate can be formed.

The semiconductor device of this modification is formed in the following manner. First, a V-added $TiO_2$ film is formed on an n-type Ge substrate. A W film is formed on the $TiO_2$ film by sputtering. The V-added $TiO_2$ film is formed in an $Ar/O_2$ atmosphere by simultaneous sputtering using the two targets of a V target and a $TiO_2$ target. The sample is then left in plasma H at room temperature, so as to introduce hydrogen atoms into the V-added $TiO_2$ film at the interface. After that, 1050° C. annealing is performed in vacuum, and 450° C. FGA (Foaming Gas Annealing) is performed in a $H_2$ atmosphere. By optimizing the time and temperature for the leaving in the plasma H, a level in the gap in $TiO_2$ is formed in the neighborhood of 3.9 eV in work function. To form this level in the gap, the level formed through the addition of V to $TiO_2$ is moved by further adding hydrogen. The band lineup here is the same as that shown in FIG. 25(b). When the electric characteristics of the junction between the $TiO_2$ film having V added thereto and the W film are measured, it becomes apparent that the interfacial contact resistance is very low, and ohmic properties are observed. The ohmic properties are caused by the pinning of the work function of the metal to the level in the gap shown in FIG. 25(b).

Although hydrogen (H) is introduced to optimize the work function in this modification, it is also possible to optimize the work function by introducing F or Ta, instead of H. In either case, the work function can be adjusted to approximately 3.9 eV.

Although V is used as an additional material in this modification, it is also possible to use Cr, Mn, Tc, or Re, instead of V. Also, the same effects as above can be achieved by using a $SrTiO_3$-based film as the interfacial control oxide film, instead of a $TiO_2$ film.

(Modification 5) Type-C, p-Ge

Next, a semiconductor device according to Modification 5 of this example is described. The semiconductor device of this modification has the same structure as the semiconductor device of Modification 1 illustrated in FIG. 27(a), except that an additional material to be added to $TiO_2$ is a material of Type-C. More specifically, V (vanadium) and Ta (tantalum) are used as the additional materials to be added to $TiO_2$. The V added to $TiO_2$ is an additional material of Type-C that forms a level in the band in a position lower than the top of the valence band of Ge when added. With this arrangement, a barrier-less junction with a p-type Ge substrate can be formed.

The semiconductor device of this modification is formed in the following manner. First, a V- and Ta-added $TiO_2$ film is formed on a p-type Ge substrate. A W film is formed on the $TiO_2$ film by sputtering. The V- and Ta-added $TiO_2$ film is formed in an $Ar/O_2$ atmosphere by simultaneous sputtering using the three targets of a V target, a Ta target, and a $TiO_2$ target. After that, 1050° C. annealing is performed in vacuum, and 450° C. FGA (Foaming Gas Annealing) is performed in a $H_2$ atmosphere. The additive amounts can be optimized by adjusting the electric power supplied to each target. A level in the gap in $TiO_2$ is formed in the neighborhood of 5.0 eV in work function. To form this level in the gap, the level formed through the addition of V to $TiO_2$ is moved by further adding Ta. The band lineup here is the same as that shown in FIG. 27(b). When the electric characteristics of the junction between the $TiO_2$ film having V and Ta added thereto and the W film are measured, it becomes apparent that the interfacial contact resistance is very low, and ohmic properties are observed. The ohmic properties are caused by the pinning of the work function of the metal to the level in the gap shown in FIG. 27(b).

Although tantalum (Ta) is introduced to optimize the work function in this modification, it is also possible to optimize the work function by introducing F or H, instead of Ta. In either case, the work function can be adjusted to approximately 5.0 eV.

Although V is used as an additional material in this modification, it is also possible to use Cr, Mn, Tc, or Re, instead of V.

Although Ta (or F, H) is used to elevate the level in the gap in this modification, any of those materials may not be used. In such a case, very deep work-function states are formed. As long as the contact between a p-type semiconductor and a metal (Si and a metal or Ge and a metal) should simply be ohmic, Ta (or F, H) does not need to be introduced after an additional material of Type-C is added. Also, the same effects as above can be achieved by using a $SrTiO_3$-based film as the interfacial control oxide film, instead of a $TiO_2$ film.

Example 3

MIM Capacitor

Figure 28:
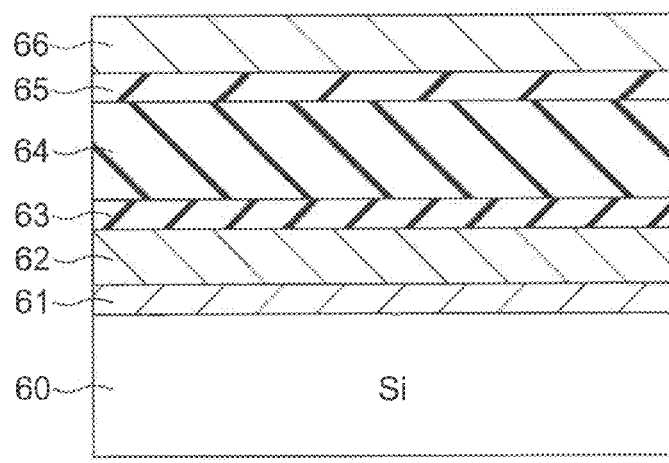
FIG. 28 is a cross-sectional view of a semiconductor device according to Example 3.
Figure 29:
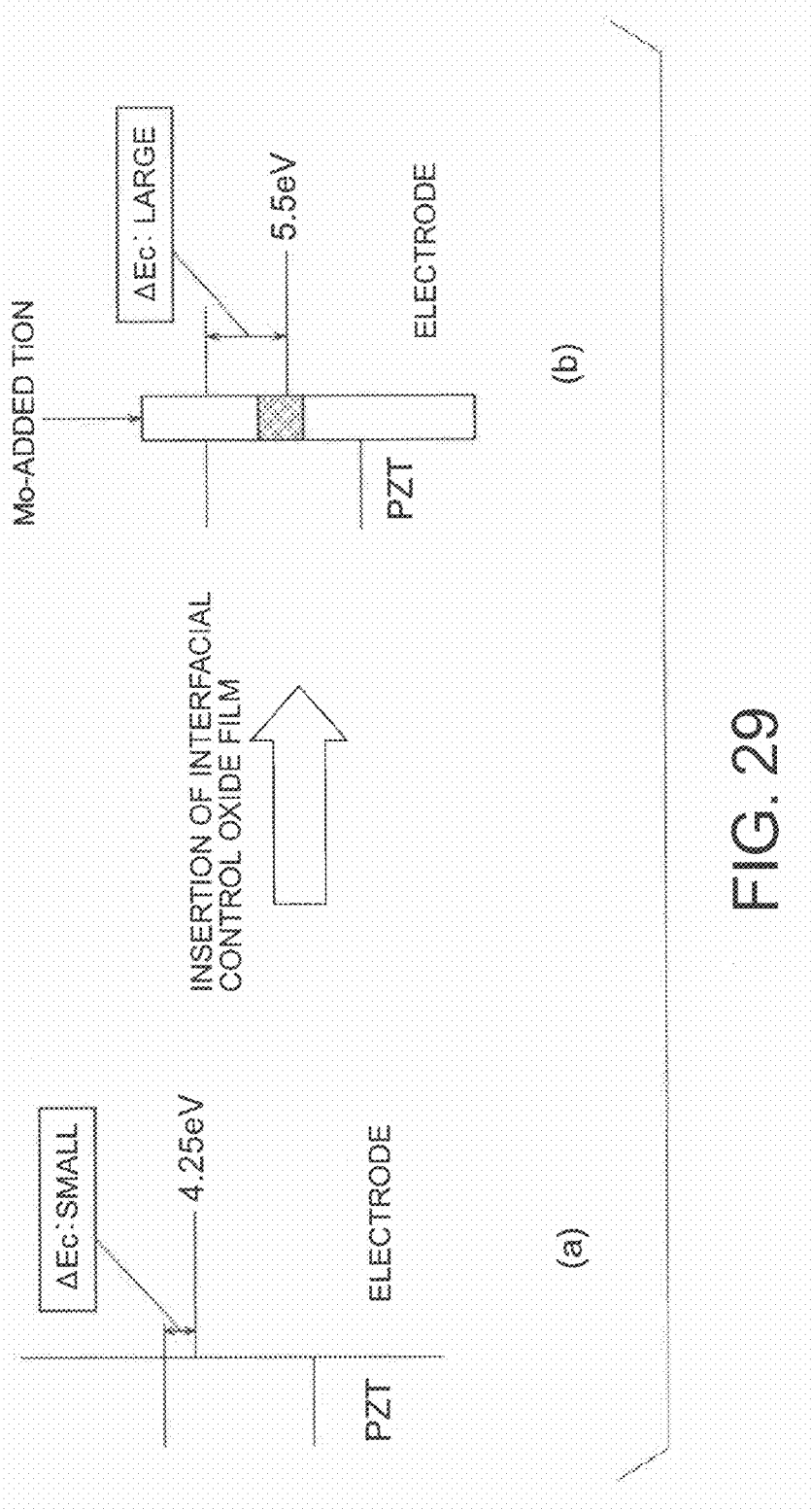
FIGS. 29(a) and 29(b) are diagrams for explaining the level in the gap in Example 3.

Referring now to FIGS. 28 through 29(b), a semiconductor device of Example 3 of the present invention is described. The semiconductor device of this example is a MIM capacitor that has a stacked structure formed with a metal, an insulating material, and a metal. As shown in FIG. 28, a stacked structure is placed on a silicon substrate 60. In this stacked structure, a TiAlN buffer layer 61, a $SrRuO_3$ electrode 62, a Mo-added TiON film (an interfacial control oxide film) 63, a Pb(Zr, $TiO_3$ ferroelectric film 64, a Mo-added TiON film (an interfacial control oxide film) 65, and a $SrRuO_3$ electrode 66 are stacked in this order. Each of the layers is formed by sputtering. Particularly, the Mo-added TiON films 63 and 65 are formed in an $Ar/O_2/N_2$ atmosphere by simultaneous sputtering using a Mo target and a $TiO_2$ target. After all the film formation is completed, 1050° C. annealing is performed in vacuum, and 450° C. FGA (Foaming Gas Annealing) is performed in a $H_2$ atmosphere.

As shown in FIG. 29(a) and FIG. 29(b), in the Mo-added TiON films 63 and 65, a level in the gap in $TiO_2$ is formed, and the effective work function of the electrodes is pinned to the level. In this example, the level in the gap in $TiO_2$ is formed in the neighborhood of 5.5 eV in work function. By the technique according to the above-described embodiment of the present invention, it is possible to design interfacial control oxide films having an appropriate work function through a combination of other additional materials. More specifically, states in the gap are formed by adding V, Cr, Mn, Fe, Co, Ni, Nb, Mo, Tc, Ru, Rh, Pd, W, Re, Os, Ir, Pt, or the like, and the work function is adjusted to approximately the center of the gap of the ferroelectric material. Also, as described in this specification, the energy of the states in the gap can be reduced with the use of an electron-accepting material such as N. On the other hand, by introducing an electron-releasing material such as F, H, or Ta, the energy of the states in the gap can be increased.

In the structure of this example, the barrier against electrons in the MIM capacitor is approximately 1.65 eV, and the barrier against holes is also approximately 1.65 eV. Accordingly, once polarization is caused, the polarization can be maintained over a long period of time. More specifically, where this capacitor is used as a capacitor for a ferroelectric memory (FeRAM), a very high-performance ferroelectric memory that does not change over time can be manufactured. In such a FeRAM using the MIM capacitor of this example, refresh during operation is basically unnecessary, and a quintessential nonvolatile memory can be formed.

In this example, oxide electrodes made of SrRuO₃ are used as the capacitor electrodes. However, any of various other metals that are conventionally used may be used as the electrode material. Typically, a material with excellent processability, such as W or TiN, can be used. In the MIM capacitor of this example, the work function is determined by the inserted oxide, and the electrode material can be freely selected.

Although TiON films are used as the Ti oxide films inserted at the interfaces, the same effects as above can be achieved with the use of SrTiO₃-based films.

Comparative Example

Next, a MIM capacitor according to a comparative example of this example is described. The MIM capacitor of this comparative example has the same structure as the MIM capacitor of this example shown in FIG. 28, except that the interfacial control oxide films are removed. More specifically, this MIM capacitor has a stacked structure on a semiconductor substrate. In this stacked structure, a TiAlN buffer layer 61, a SrRuO₃ electrode 62, a Pb(Zr,Ti)O₃ ferroelectric film 64, and a SrRuO₃ electrode 66 are stacked in this order. In this comparative example, oxygen defects appear over time, and the barrier against electrons becomes as low as 0.2 eV. As a result, leakage current flows, and polarization easily disappears. Such changes occur very easily over time, and the polarization is maintained only for a few hours. Also, with the use of W or TiN electrodes, large leakage current flows even in the initial stage, and the structure cannot be put into practical use.

(Modification) Novel Structure of DRAM Capacitor

Figure 30:
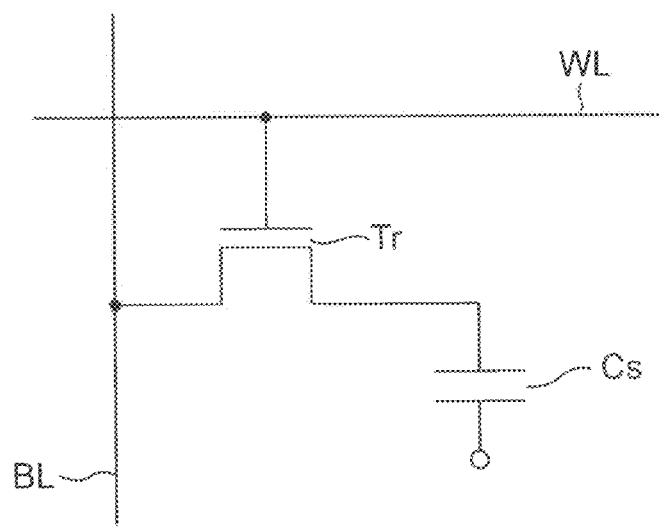
FIG. 30 is a circuit diagram of a DRAM memory cell that uses a capacitor according to a modification of Example 3.

In this example, retention of the polarization of a ferromagnetic material has been described. The same concept as above can be applied to capacitors using high-dielectric materials such as (Ba,Sr)TiO₃, SrTiO₃, Ta₂O₅. More specifically, it is essential that the effective work function is made larger, and particularly, the electron barrier is made higher, by providing oxide films for interfacial control. An oxide dielectric material easily forms oxygen defects. Where oxygen defects are actually formed, the barrier against electrons tends to become lower. If a high-electric material capacitor including the structure of this example is used as the capacitor of a DRAM (Dynamic Random Access Memory), only one tenth of the conventional refresh operation is required, since the structure of this example excels in charge accumulation and retention. Accordingly, a high-speed DRAM that consumes less electric power and exhibits high reliability over a long period of time can be obtained. Although TiO₂-based films are used as the Ti oxide films inserted at the interfaces in this example, the same effects as above can be achieved with the use of SrTiO₃-based films. FIG. 30 shows an example of a memory cell of a DRAM including the capacitor of this modification. This memory cell is a memory cell of 1-trasistor and 1-capacitor type that has a transistor Tr and a capacitor Cs. One end of the transistor Tr is connected to a bit line BL, and the other end is connected to one end of the capacitor Cs. The gate is connected to a word line WL. The capacitor Cs of this memory cell is the capacitor of this modification. Memory cells each having this structure are arranged in a matrix fashion, to form a memory cell array.

Example 4

MISFET Having Semiconductor Source/Drain

Figure 31:
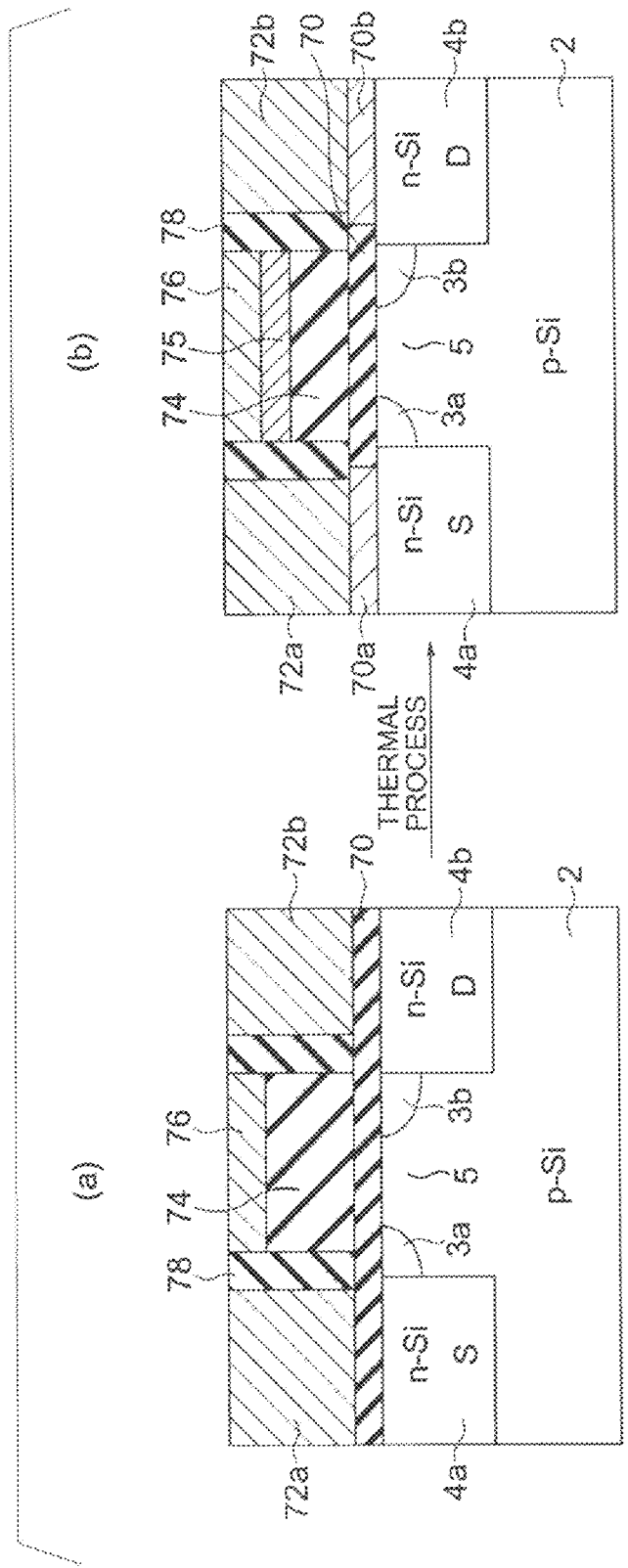
FIGS. 31(a) and 31(b) are cross-sectional views illustrating a procedure for manufacturing a semiconductor device according to Example 4.

Referring now to FIGS. 31(a) and 31(b), a semiconductor device according to Example 4 of the present invention is described. The semiconductor device of this example is an n-MISFET, and has interfacial control oxide films inserted between the source/drain regions and the source/drain metal electrodes. More specifically, source regions 3a and 4a and drain regions 3b and 4b that are made of n-type Si are formed at a distance from each other in a p-type Si substrate 2, as shown in FIG. 31(b). Those source and drain regions include the extension regions 3a and 3b. The region in the p-type Si substrate 2 located between the source regions 3a and 4a and the drain regions 3b and 4b serves as a channel region 5. W-added TiO₂ films (interfacial control oxide films) 70a and 70b are formed on the source region 4a and the drain region 4b, and a TiO₂ film 70 not having W added thereto is formed on the channel region 5. In the source/drain regions 4a and 4b, source/drain metal electrodes 72a and 72b made of W (tungsten) or the like are formed on the W-added TiO₂ films 70a and 70b. In the channel region 5, a gate insulating film 74 made of HfSiON or the like is formed on the TiO₂ film 70. A W-added HfSiON film (an interfacial control oxide film) 75 is formed on the gate insulating film 74, and a gate electrode 76 made of W is formed on the W-added HfSiON film (the interfacial control oxide film) 75. Sidewalls 78 made of an insulating material are formed between the source/drain metal electrodes 72a and 72b, and the gate insulating film 74 and the gate electrode 76. By the sidewalls 78, the gate electrode 76 is insulated from the source/drain metal electrodes 72a and 72b. In FIG. 31(b), the sidewalls 78 have the TiO₂ film 70 existing at their bottom portions. However, the TiO₂ film 70 may be removed, so as to bring the bottom portions into contact with the Si substrate 2. The structure minus the TiO₂ film 70 is shown in FIG. 7(a).

Next, a method for manufacturing the n-MISFET of this example is described.

The stacked structures of the n-type Si source/drain regions 4a and 4b, the TiO₂ films 70a and 70b, and the metal electrodes 72a and 72b shown in FIG. 31(a) may be considered the same as the stacked structure of Example 1. The TiO₂ film 70 is formed by sputtering on the corresponding portions (the semiconductor source and drain) 4a and 4b of the n-type Si substrate, and the W films 72a, 72b, and 76 are formed on the TiO₂ film 70 by sputtering. After the formation of the TiO₂ film 70, the gate insulating film 74 is formed, and n-type impurities are introduced into the Si substrate 2, to form the extension regions 3a and 3b. After that, a dummy gate electrode (not shown) is formed on the gate insulating film 74, and dummy source/drain electrodes (not shown) are formed on the TiO₂ film 70 in the source/drain regions. At this point, grooves are formed between the dummy gate electrode and the dummy source/drain electrodes. The sidewalls 78 made of an insulating material are then formed to fill the grooves. After the dummy gate electrode and the dummy source/drain electrodes are removed, n-type impurities are introduced into the Si substrate 2, to form the source/drain regions 4a and 4b. The gate electrode 76 made of W and the source/drain metal electrodes 72a and 72b made of W are then simultaneously formed, and flattening is performed by CMP.

After that, 1050° C. annealing is performed in vacuum, and 450° C. FGA (Foaming Gas Annealing) is performed in a H₂ atmosphere. Through this thermal process, W diffuses into the TiO₂ film 70 between the n-type Si source/drain regions 4a and 4b and the source/drain metal electrodes 72a and 72b, and a level in the gap in $TiO_2$ is formed in the neighborhood of 3.9 eV in work function. As W sufficiently diffuses, the interfacial control oxide films 70a and 70b made of W-added $TiO_2$ are formed (FIG. 31(b)). By adjusting the annealing time and temperature, the interfacial control oxide films 70a and 70b can become hopping-conductive films (in the range of $6 \times 10^{12}$ atoms/cm$^2$ to $1 \times 10^{14}$ atoms/cm$^2$ in the areal density of W) or band-conductive films (in the range of $1 \times 10^{14}$ atoms/cm$^2$ to $8 \times 10^{14}$ atoms/cm$^2$ in the areal density of W). Between the two types, the band-conductive films can have lower resistance as the interfacial control oxide films. In this example, approximately $2 \times 10^{14}$ atoms/cm$^2$ in the areal density of W is introduced, and band-conductive films are formed. At the same time, W also diffuses into the gate insulating film 74, and the interfacial control oxide film 75 is formed between the gate insulating film 74 made of HfSiON and the gate electrode 76 made of W. By virtue of the interfacial control oxide film 75, a level in the gap in Hf silicate (HfSiO) is formed in the neighborhood of 4.1 eV in work function. The interfacial control oxide film 75 has both tungsten W and nitrogen N introduced into the Hf silicate. Through the addition of tungsten W, the level in the gap is formed, and electrons are transferred from the level to the nitrogen. Accordingly, the level in the gap becomes deeper. As a result, a level in the gap is formed in the neighborhood of 4.1 eV. In this manner, the work function can be optimized by controlling the processing conditions in the formation of the interfacial control oxide films 70a and 70b and the interfacial control oxide film 75.

Although $TiO_2$ films are used as the Ti oxide films inserted at the interfaces, the same effects as above can be achieved with the use of $SrTiO_3$-based films.

(Modification 1)

Figure 32:
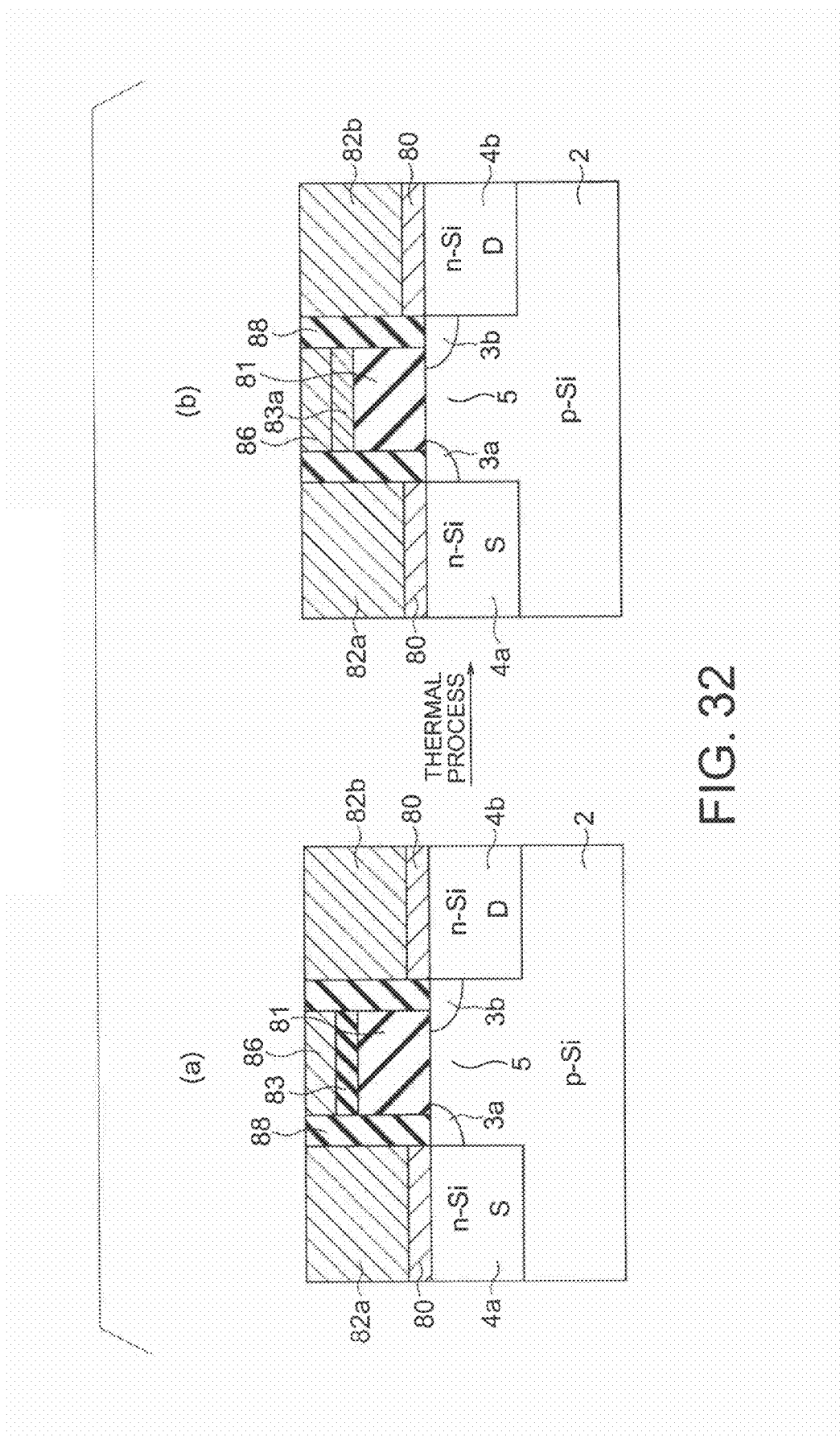
FIGS. 32(a) and 32(b) are cross-sectional views illustrating a procedure for manufacturing a semiconductor device according to Modification 1 of Example 4.

Referring now to FIGS. 32(a) and 32(b), an n-MISFET according to Modification 1 of Example 4 is described. As shown in FIG. 32(b), the n-MISFET of this modification is the same as the n-MISFET of Example 4, except that the source/drain metal electrodes and the gate electrode are made of TiN, instead of W, and Nb-added (Ti,Hf)$O_2$ films 80 are formed between the n-type Si source/drain regions 4a and 4b and the source/drain electrodes 82a and 82b made of TiN. Here, "(Ti,Hf)" implies that the film contains both the Ti element and the Hf element. A gate insulating film 81 made of HfON is first formed on the channel region 5, and a (Ti,Hf)ON film (an interfacial control oxide film) 83a is formed on the gate insulating film 81. The gate electrode 86 made of TiN is formed on the (Ti,Hf)ON film 83a. Sidewalls 88 made of an insulating material are formed between the gate electrode 86 and the source/drain metal electrodes 82a and 82b. In this modification, the bottom portions of the sidewalls 88 are in contact with the Si substrate 2.

The Nb-added (Ti,Hf)$O_2$ films 80 and the Nb-added (Ti,Hf)$O_2$ film 83 prior to the addition of N (FIG. 32(a)) are formed by performing sputtering simultaneously on the three targets of a $TiO_2$ target, a $HfO_2$ target, and a Nb target. In this modification, film formation is performed while the power supply to the $HfO_2$ target is restricted, so that Ti/(Ti+Hf) becomes equal to 0.95.

Next, the process for manufacturing the n-MISFET of this modification is briefly described. The gate insulating film 81 made of HfON is formed on the channel region 5 in the p-type Si substrate 2. By injecting n-type impurities into the Si substrate 2, the extension regions 3a and 3b are formed. After that, the Nb-added (Ti,Hf)$O_2$ films 80 and 83 are formed on the entire surface. A resist is then applied onto the entire surface, and patterning is performed, to form a dummy gate electrode (not shown) made from the resist and dummy source/drain electrodes (not shown) made from the resist. At this point, patterning is also performed on the Nb-added (Ti,Hf)$O_2$ films 80 and 83, and grooves (not shown) are formed between the dummy gate electrode and the dummy source/drain electrodes. The sidewalls 88 are then formed to fill the grooves with an insulating material. After the dummy gate electrode and the dummy source/drain electrodes are removed, n-type impurities are introduced into the Si substrate 2, to form the source/drain regions 4a and 4b. The metal electrodes made of TiN are then formed, and flattening is performed by CMP. After that, 1050-° C. annealing is performed in vacuum, and 450-° C. FGA (Foaming Gas Annealing) is performed in a $H_2$ atmosphere.

In the n-MISFET formed in the above manner, a level in the gap in $TiO_2$ is formed in the neighborhood of 3.3 eV in work function by virtue of the Nb-added (Ti,Hf)$O_2$ films 80 between the n-type Si source/drain regions 4a and 4b and the source/drain metal electrodes 82a and 82b made of TiN. Through the above described thermal process, the Nb-added (Ti,Hf)$O_2$ film 83 reacts with the gate insulating film 81 made of HfON at the interface, and turns into the Nb-added (Ti,Hf)ON film 83a (FIG. 32(b)). Through the addition of nitrogen, the work function of the Nb-added (Ti, Hf)ON film 83a becomes as large as 4.1 eV. In the Nb-added (Ti, Hf)$O_2$ films 80 that connect the source/drain regions 4a and 4b to the source/drain metal electrodes 82a and 82b, the work function can be 3.9 eV. However, at the junction between the gate insulating film 81 and the gate electrode 86 made of a metal, the work function needs to be optimized by the technique according to the above-described embodiment of the present invention.

Although N is added through the thermal process in this modification, N or some other electron-accepting material may be added to the Nb-added (Ti,Hf)$O_2$ film 83 by ion implantation, or nitrogen may be introduced into the Nb-added (Ti,Hf)$O_2$ film 83 through plasma nitridation or the like. Even at the junctions between the source/drain regions 4a and 4b and the source/drain metal electrodes, nitrogen or the like can be effectively introduced to move them toward the conduction band edge of silicon. This is because it is considered that both can be optimized without a significant adjustment made on the interface between the gate insulating film and the gate electrode made of a metal.

The following are examples of combinations of materials in Modification 1. With the base material being $TiO_2$, $SrTiO_3$, or Ti silicate, a level in the gap is formed by adding at least one element selected from the group consisting of W, Nb, and Ta, and the level is effectively used. By further introducing at least one of the electron-accepting materials such as N, oxide films having the optimized work function can be used as the interfacial control oxide films.

Alternatively, with the base material being $TiO_2$, $SrTiO_3$, or Ti silicate, a level in the gap is formed by adding at least one element selected from the group consisting of V, Cr, Mn, Fe, Co, Ni, Mo, Tc, Ru, Rh, Pd, Re, Os, Ir, and Pt. By further introducing at least one element selected from the group consisting of Ta, F, and H, oxide films having the optimized work function can be used as the interfacial control oxide films. Those elements can be introduced not only by the simultaneous sputtering technique, but some of the elements can be introduced from a film forming atmosphere after film formation. Also, some of the elements can be introduced by ion implantation or plasma nitridation after film formation. For example, in a case where Cr and Ta are introduced, it does not matter which one of them is introduced first. A TiTaO film may be formed first, and a Cr film is then formed on the TiTaO film, followed by thermal diffusion. The simultaneous sputtering with the use of the three targets of a Cr target, a Ta target, and a TiO₂ target may be performed in an Ar/O₂ atmosphere.

Although TiO₂-based films are used as the Ti oxide films inserted at the interfaces, the same effects as above can be achieved with the use of SrTiO₃-based films.

(Modification 2) Memory Cell

Figure 33:
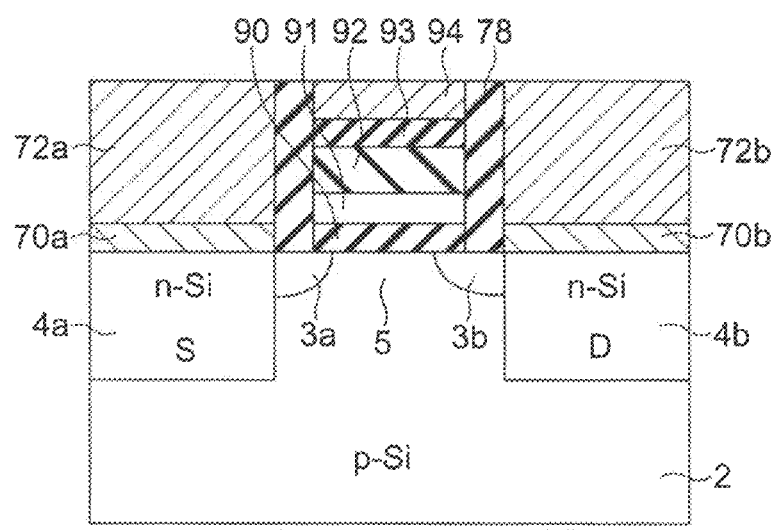
FIG. 33 is a cross-sectional view of a semiconductor device according to Modification 2 of Example 4.

FIG. 33 shows a semiconductor device according to Modification 2 of Example 4. The semiconductor device of this modification is a nonvolatile semiconductor device, and FIG. 33 is a cross-sectional view of a memory cell of this semiconductor memory device. As shown in FIG. 33, source regions 3a and 4a and drain regions 3b and 4b that are made of n-type Si are formed at a distance from each other in a p-type Si substrate 2. Those source and drain regions include the extension regions 3a and 3b. The region in the p-type Si substrate 2 located between the source regions 3a and 4a and the drain regions 3b and 4b serves as a channel region 5. W-added TiO₂ films (interfacial control oxide films) 70a and 70b are formed on the source region 4a and the drain region 4b, and source/drain electrodes 72a and 72b made of W are formed on the TiO₂ films 70a and 70b. A tunnel insulating film 90, a charge storage film 91, a block insulating film 92, a W-added TiSiON film (an interfacial control oxide film) 93, and a control electrode 94 made of W are stacked on the channel region 5 in this order. Sidewalls 78 made of an insulating material are formed to insulate the interfacial control oxide films 70a and 70b and the source/drain electrodes 72a and 72b from the stacked film formed with the tunnel insulating film 90, the charge storage film 91, the block insulating film 92, the W-added TiSiON film (the interfacial control oxide film) 93, and the control electrode 94 made of W.

With this structure, the threshold value is controlled by storing charges, and the structure can function as a memory by determining whether the channel is on or off. The resistance can be lowered by controlling the work function between the semiconductor source/drain regions and the source/drain metal electrodes. Accordingly, the power consumption can be suppressed.

An insulating film such as a SiO₂ film is used as the tunnel insulating film 90 (the insulating film for causing charge tunneling). The charge storage film 91 may be formed with a floating electrode (FG) made of n-type polycrystalline silicon or the like, or may be a trapping insulating film that can store or trap charges of silicon nitride or Ru-added SrTiO₃, for example. The block insulating film 92 is formed with an insulating film having a high dielectric constant, such as a LaAlO₃ film, a HfO₂ film, or an Al₂O₃ film.

The block insulating film 92 is designed to prevent the charges from escaping from the charge storage film 91 to the control electrode 94. Each of those films may have a stacked structure, so as to fulfill the respective roles. Particularly, with interdiffusion being taken into consideration, it is essential to form a structure resistant to diffusion between each two films. Basically, charges are introduced and released by virtue of the tunneling effect of the tunnel insulating film from the channel side. Especially, unwanted injection of charges from the control electrode 94 made of W should be avoided. Therefore, the interface of the block insulating film 92 on the side of the control electrode 94 is nitrided, and a TiO₂ oxide film is inserted into the interface with the control electrode 94 in this modification. A thermal process is then performed, so that the interface turns into the TiON film (the interfacial control oxide film) 93 having W added thereto, and has a large work function (approximately 5.7 eV, for example). In this manner, a structure that prevents unwanted injection of charges from the control electrode 94 made of W can be obtained.

Also, in this modification, W diffuses in the TiO₂ films between semiconductor source/drain regions 4a and 4b and the source/drain electrodes 72a and 72b made of W, and the TiO₂ films turn into contacts having the work function of 3.9 eV. In other words, the TiO₂ films form ohmic junctions. Such a structure is very effective in a memory cell of NOR type or the like that performs control operations through the contacts with the source/drain regions. In a NAND cell, contacts with the source/drain regions are only partially formed. However, there should be contacts at the end portions of a NAND cell, and large current flows. Therefore, in reducing the power consumption, lower resistance (or ohmic resistance) is essential. However, at the end portions, regular MISFETs may be used. In such a case, it suffices only to use MISFETs of this example. In both NOR type and NAND type, as long as the contacts with the source/drain regions are ohmic contacts, memories of various types can be used, without concern for the power consumption at the contacts. In that sense, controlling the contact resistance is very effective.

Although TiO₂-based films are used as the Ti oxide films inserted at the interfaces, the same effects as above can also be achieved with the use of SrTiO₃-based films.

(Modification 3) p-MISFET

Figure 34:
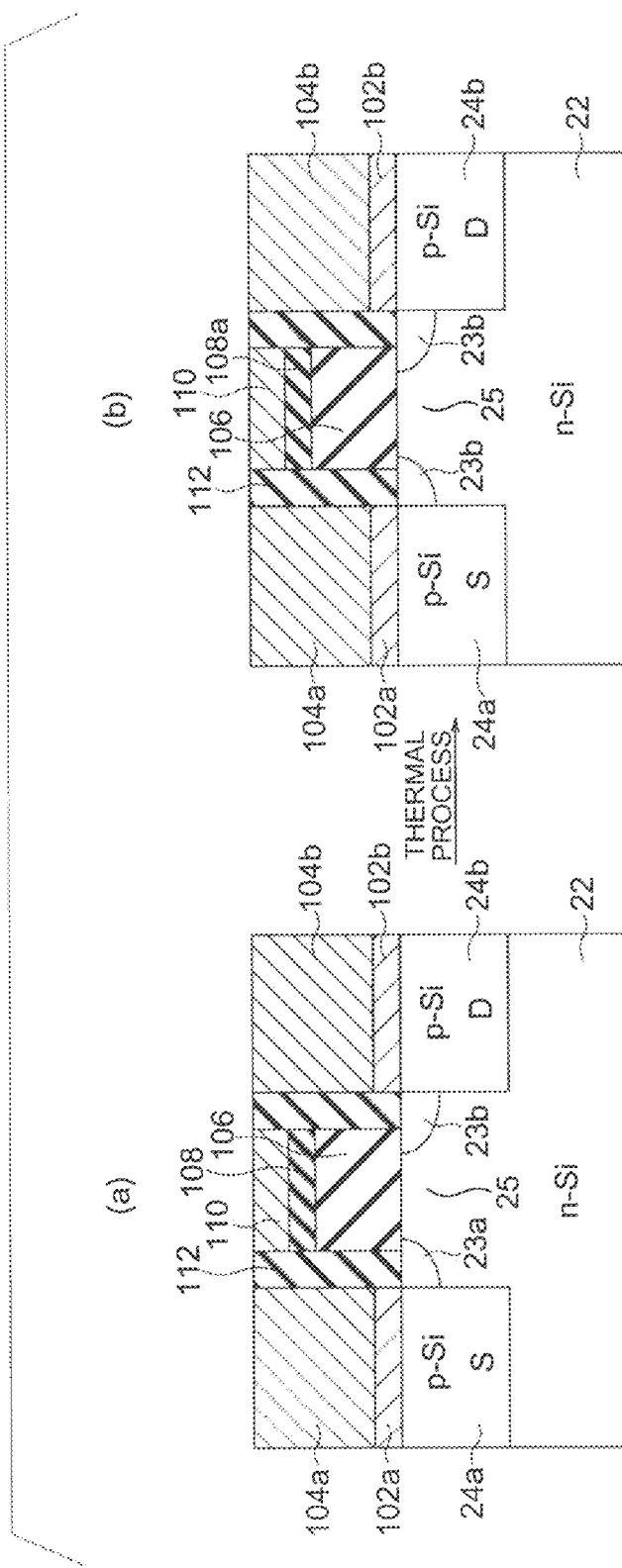
FIGS. 34(a) and 34(b) are cross-sectional views illustrating a procedure for manufacturing a semiconductor device according to Modification 3 of Example 4.

Referring now to FIGS. 34(a) and 34(b), a semiconductor device according to Modification 3 of Example 4 is described. The semiconductor device of this modification is a p-MISFET, and has interfacial control oxide films provided between the source/drain regions and the source/drain metal electrodes. More specifically, source regions 23a and 24a and drain regions 23b and 24b that are made of p-type Si are formed at a distance from each other in an n-type Si substrate 22, as shown in FIG. 34(b). Those source and drain regions include the extension regions 23a and 23b. The region in the n-type Si substrate 22 located between the source regions 23a and 24a and the drain regions 23b and 24b serves as a channel region 25. V-added TiO₂ films (interfacial control oxide films) 102a and 102b are formed on the source region 24a and the drain region 24b, and a HfTaON film 106 is formed on the channel region 25. In the source/drain regions 24a and 24b, source/drain metal electrodes 104a and 104b made of W (tungsten) or the like are formed on the V-added TiO₂ films 102a and 102b. In the channel region 25, a V- and Ta-added TiO₂ film (an interfacial control oxide film) 108a is formed on the gate insulating film 106 made of HfTaON, and a gate electrode 110 made of W is formed on the TiO₂ film 108a. Sidewalls 112 made of an insulating material are formed between the stacked structure formed with the gate insulating film 106, the TiO₂ film 108a, and the gate electrode 110, and each of the stacked structures formed with the V-added TiO₂ films (interfacial control oxide films) 102a and 102b, and the source/drain metal electrodes 104a and 104b. By the sidewalls 112, the gate electrode 110 is insulated from the source/drain metal electrodes 104a and 104b.

In this modification, the V-added TiO₂ films are formed by performing sputtering simultaneously on the two targets of a TiO₂ target and a V target.

Next, a method for manufacturing the p-MISFET according to this modification is briefly described. The gate insulating film 106 made of HfTaON is formed on the channel region 25 in the n-type Si substrate 22. By injecting p-type impurities into the Si substrate 22, the extension regions 23a and 23b are formed on both sides of the gate insulating film 106. After that, the V-added TiO₂ films 102a, 102b, and 108 are formed on the entire surface. A resist is then applied onto the entire surface, and patterning is performed, to form a dummy gate electrode (not shown) made from the resist and dummy source/drain electrodes (not shown) made from the resist. At this point, patterning is also performed on the V-added TiO$_2$ films 102a, 102b, and 108, and grooves (not shown) are formed between the dummy gate electrode and the dummy source/drain electrodes. The sidewalls 112 are then formed to fill the grooves with an insulating material. After the dummy gate electrode and the dummy source/drain electrodes are removed, p-type impurities are introduced into the Si substrate 22, to form the source/drain regions 24a and 24b on both sides of the gate insulating film 106. The metal electrodes made of W are then formed, and flattening is performed by CMP. After that, 1050° C. annealing is performed in vacuum, and 450° C. FGA (Foaming Gas Annealing) is performed in a H$_2$ atmosphere.

In the p-MISFET formed in the above manner, a level in the gap in TiO$_2$ is formed in the neighborhood of 5.5 eV in work function by virtue of the V-added TiO$_2$ films 102a and 102b between the p-type Si source/drain regions 24a and 24b and the source/drain metal electrodes 104a and 104b made of W. Through the above-described thermal process, the V-added TiO$_2$ film 108 reacts with the gate insulating film 106 made of HfTaON at the interface, and turns into the V- and Ta-added TiO$_2$ film 108a (FIG. 34(b)). Through the addition of Ta, the work function of the V-added TiO$_2$ film 108 becomes as small as 5.0 eV. In the V-added TiO$_2$ films 102a and 102b that connect the source/drain regions 24a and 24b to the source/drain metal electrodes 104a and 104b, the work function can be 6.2 eV. However, at the junction between the gate insulating film 106 and the gate electrode 110 made of a metal, the work function needs to be optimized by the technique according to the above-described embodiment of the present invention.

Although Ta is added through the thermal process in this modification, Ta, F, H, or the like may be added to the V-added TiO$_2$ film by ion implantation, or the V-added TiO$_2$ film may be left in exited hydrogen. Even at the junctions between the source/drain regions and the source/drain metal electrodes, Ta or the like can be effectively introduced to move them toward the valence band edge of silicon. This is because it is considered that both can be optimized without a significant adjustment made on the interface between the gate insulating film and the gate electrode made of a metal.

The following are examples of combinations of materials in Modification 3. With the base material being TiO$_2$, SrTiO$_3$, or Ti silicate, a level in the gap is formed through an addition of Ta, Nb, W, or Mo (Type-A, Type-B). By further introducing at least one of the electron-accepting materials such as N, oxide films having the optimized work function can be used as the interfacial control oxide films.

Alternatively, with the base material being TiO$_2$, SrTiO$_3$, or Ti silicate, a level in the gap is formed by adding at least one element selected from the group consisting of V, Cr, Mn, Fe, Co, Ni, Mo, Tc, Ru, Rh, Pd, Re, Os, Ir, and Pt. The oxide films obtained by doing so can be used as the interfacial control oxide films. This is particularly effective in cases where there are no second additional materials such as F. By further introducing at least one element selected from the group consisting of Ta, F, and H, oxide films having the optimized work function can be effectively used as the interfacial control oxide films. Those elements can be introduced not only by the simultaneous sputtering technique, but some of the elements can be introduced from a film forming atmosphere after film formation. Also, some of the elements can be introduced through ion implantation or excited hydrogen after film formation. For example, in a case where V and Ta are introduced, it does not matter which one of them is introduced first. A TiTaO film may be formed first, and a V film is then formed on the TiTaO film, followed by thermal diffusion. The simultaneous sputtering with the use of the three targets of a V target, a Ta target, and a TiO$_2$ target may be performed in an Ar/O$_2$ atmosphere.

By optimizing the interfacial control oxide film between the gate insulating film and the metal gate electrode, this modification can cope with a MISFET using a SOI substrate. In that case, the work function should be made closer to the center of the gap in the SOI layer than in conventional cases. By the technique according to the above-described embodiment of the present invention, this can be easily realized. Even a completely-depleted substrate can be used, which implies that the technique according to the embodiment of the present invention can be applied to a wide variety of fields.

Flexible control on the work function is essential in the technique according to the embodiment of the present invention. Flexible control should be collectively performed on the junctions between the semiconductor source/drain regions and the source/drain metal electrodes, and the junction between the gate insulating film and the metal gate electrode.

Although TiO$_2$-based films are used as the Ti oxide films inserted at the interfaces, the same effects as above can be achieved with the use of SrTiO$_3$-based films.

Example 5

MISFET Having Metal Source/Drain

Figure 35:
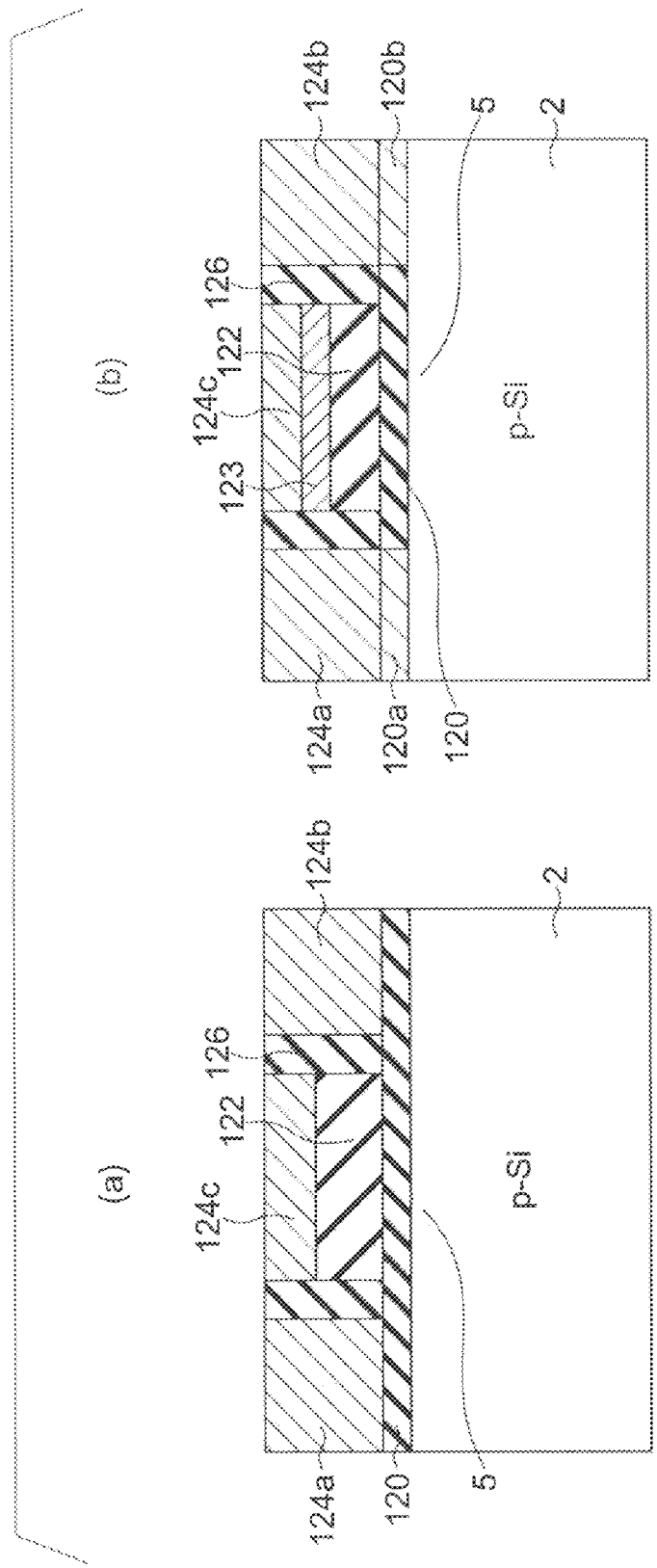
FIGS. 35(a) and 35(b) are cross-sectional views illustrating a procedure for manufacturing a semiconductor device according to Example 5.
Figure 36:
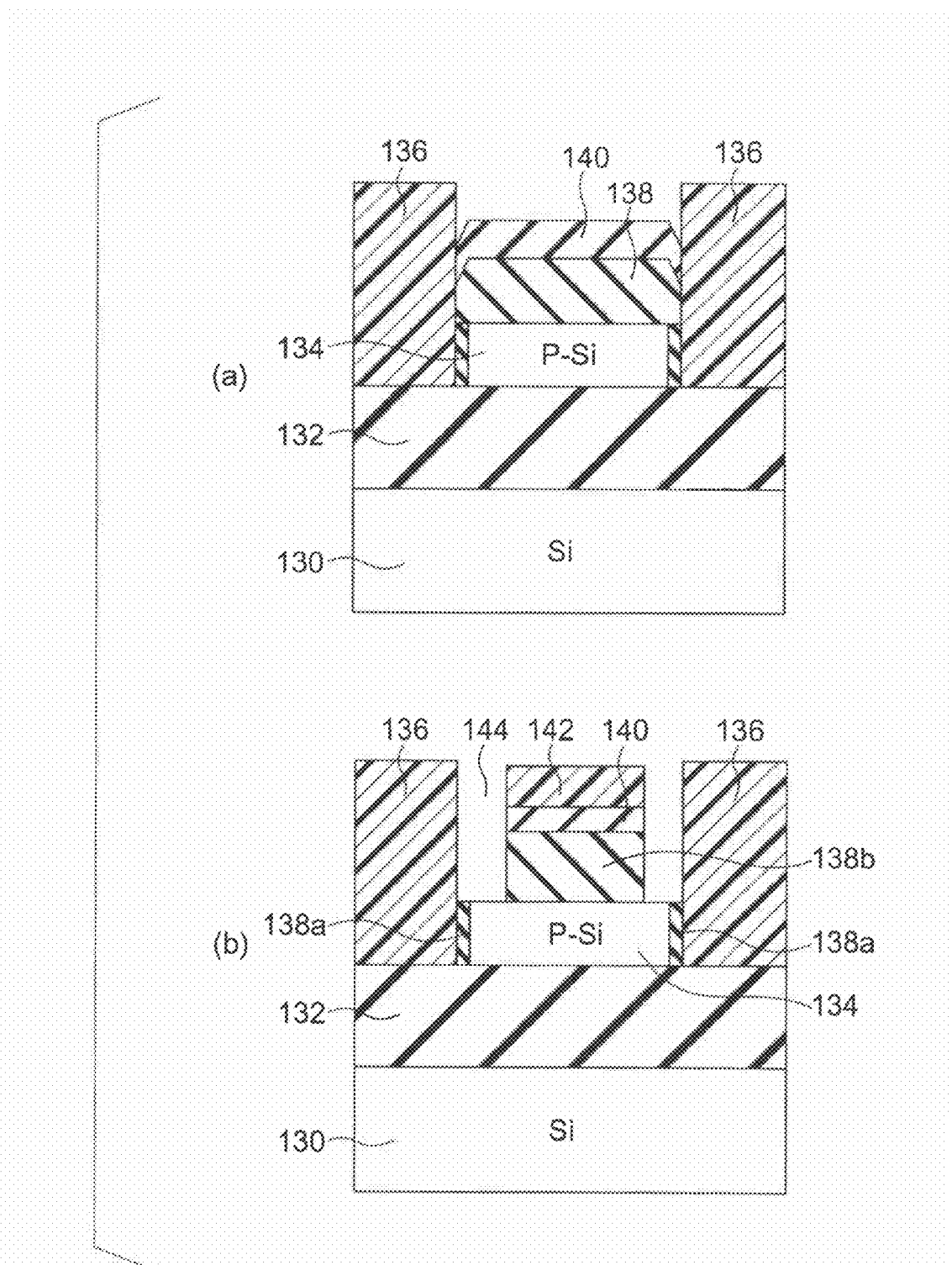
Figure 37:
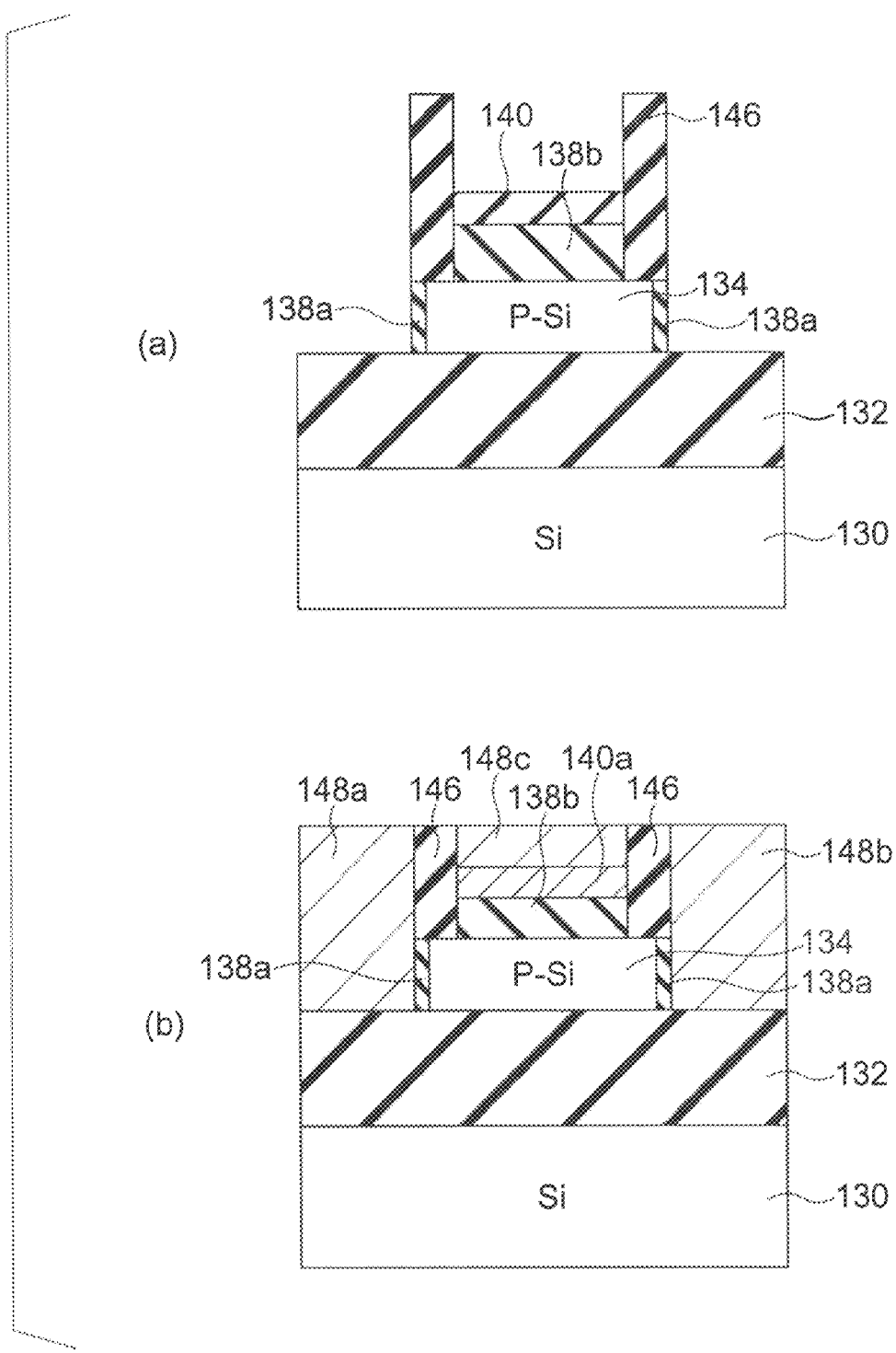

Referring now to FIGS. 35(a) and 35(b), a semiconductor device according to Example 5 of the present invention is described. The semiconductor device of this example is an n-MISFET, and has W-added TiO$_2$ films (interfacial control oxide films) 120a and 120b inserted between a channel region 5 formed in the surface of a p-type Si substrate 2 and the source/drain (source/drain electrodes) 124a and 124b made of W, as shown in FIG. 35(b). A TiO$_2$ film 120 not having W added thereto is formed on the channel region 5 located between the W-added TiO$_2$ films 120a and 120b. A gate insulating film 122 made of HfSiON is formed on the TiO$_2$ film 120, and a W-added HfSiON film (an interfacial control oxide film) 123 is formed on the gate insulating film 122. A gate electrode 124c made of W is formed on the interfacial control oxide film 123. By sidewalls 126 made of an insulating material, the stacked structure formed with the gate insulating film 122, the interfacial control oxide film 123, and the gate electrode 124c is insulated from the source/drain electrodes 124a and 124b. In this example, the sidewalls 126 have the TiO$_2$ film 120 existing at their bottom portions. However, the TiO$_2$ film 120 may be removed, so as to bring the bottom portions into contact with the Si substrate 2, as shown in FIG. 9(a). Alternatively, the source/drain electrodes made of a metal may be partially buried in the Si substrate 2, and interfacial control oxide films may be formed between the channel region 5 and the buried portions of the source/drain electrodes, as shown in FIG. 10(a).

Next, a method for manufacturing the n-MISFET of this example is described.

First, as shown in FIG. 35(a), the TiO$_2$ film 120 is formed by sputtering on the p-type silicon channel 5. The gate insulating film 122 made of HfSiON is then formed. After that, a dummy gate electrode (not shown) and dummy source/drain electrodes (not shown) are formed. At this point, isolation grooves are formed between the dummy gate electrode and the dummy source/drain electrodes. The sidewalls 126 are then formed by filling the isolation grooves with an insulating material. Film formation is then performed by sputtering W, to simultaneously form the source/drain electrodes 124a and 124b made of W, and the gate electrode 124c made of W. Flattening is then performed by CMP.

After that, 1050° C. annealing is performed in vacuum, and 450° C. FGA (Foaming Gas Annealing) is performed in a $H_2$ atmosphere. Through this thermal process, W diffuses into the $TiO_2$ film 120 between the p-type Si channel 5 and the source/drain electrodes 124a and 124b, and a level in the gap in $TiO_2$ is formed in the neighborhood of 3.9 eV in work function. As W sufficiently diffuses, part of the $TiO_2$ film 120 turns into W-added $TiO_2$ films (interfacial control oxide films) 120a and 120b (FIG. 35(b)). By adjusting the annealing time and temperature, the interfacial control oxide films can become hopping-conductive films (in the range of $6\times10^{12}$ atoms/cm$^2$ to $1\times10^{14}$ atoms/cm$^2$ in the areal density of W) or band-conductive films (in the range of $1\times10^{14}$ atoms/cm$^2$ to $8\times10^{14}$ atoms/cm$^2$ in the areal density of W). Between the two types, the band-conductive films can have lower resistance as the interfacial control oxide films. In this example, approximately $2\times10^{14}$ atoms/cm$^2$ in the areal density of W is introduced, and band-conductive films are formed. At the same time, W also diffuses into the gate insulating film 122, and the W-added HfSiON film (interfacial control oxide film) 123 is formed between the gate insulating film 122 made of HfSiON and the gate electrode 124c made of W. By virtue of the interfacial control oxide film 123, a level in the gap in Hf silicate is formed in the neighborhood of 4.1 eV in work function. The interfacial control oxide film 123 has both tungsten W and nitrogen N introduced into the Hf silicate. Through the addition of tungsten W to the HfSiON film, the level in the gap is formed, and electrons are transferred from the level to the nitrogen. Accordingly, the level in the gap becomes deeper. As a result, a level in the gap is formed in the neighborhood of 4.1 eV. In this manner, the work function can be optimized by controlling the interfacial control oxide films 120a, 120b, and 123.

The n-MISFET having the metal source and drain is completed in the above manner. Since there is a large barrier against holes in a channel-off sate, as illustrated in FIG. 9(b) and FIG. 10(b), a MISFET having very small junction leakage can be obtained. Furthermore, since the barrier against electrons disappears in a channel-on state, there is no contact resistance, and ohmic contacts are realized. Moreover, conduction through a level in the gap is achieved, the conduction is band conduction (in the range of $1\times10^{14}$ atoms/cm$^2$ to $8\times10^{14}$ atoms/cm$^2$ in the areal density of W), and tunnel resistance is not newly formed. If the additive amount is small, hopping conduction is caused (in the range of $6\times10^{12}$ atoms/cm$^2$ to $1\times10^{14}$ atoms/cm$^2$ in the areal density of W), but the resistance caused in that case is also much lower than tunnel resistance. Although contact resistance control through tunnel resistance has been suggested, the method is inadequate due to generation of tunnel resistance. In this example, on the other hand, tunnel resistance is not generated, and the contact resistance can be flexibly controlled. "Tunnel resistance" is the resistance of the tunneling effect caused by overlapping of wave functions on both sides of an insulating film, without intervention of a level in the gap. On the other hand, band conduction and hopping conduction are conduction via a level in the gap, and do not involve tunnel resistance.

Although $TiO_2$ films are used as the Ti oxide films inserted at the interfaces, the same effects as above can be achieved with the use of $SrTiO_3$-based films.

(Modification 1)

Referring now to FIGS. 36(a) through 37(b), an n-MISFET according to Modification 1 of Example 5 is described. FIGS. 36(a) through 37(b) are cross-sectional views illustrating the procedures for manufacturing the n-MISFET of this modification. The n-MISFET of this modification is formed on a SOI substrate that includes a supporting substrate 130, a buried insulating film 132, and a SOI layer 134 made of p-type silicon.

First, patterning is performed on the SOI layer, to form the channel region 134. A resist pattern 136 is then formed on the buried insulating film 132, so as to form voids between the resist pattern and the side faces of the channel region 134. With the resist pattern 136 serving as a mask, a $TiO_2$ film 138 is formed to cover the side faces and the upper face of the channel region 134. A HfON film 140 is further formed to cover the $TiO_2$ film 138 (FIG. 36(a)).

A resist pattern 142 is then formed on the HfON film 140. With this resist pattern 142 serving as a mask, patterning is performed on the HfON film 140 and the $TiO_2$ film 138 (FIG. 36(b)). As a result, a gate insulating film is formed with a stacked structure of the patterned $TiO_2$ film 138b and the patterned HfON film 140b. At this point, grooves 144 are formed between the resist pattern 136 and the stacked film of the patterned $TiO_2$ film 138b and the patterned HfON film 140b (FIG. 36(b)). $TiO_2$ films 138a remain between the resist pattern 136 and both side faces of the channel region 134.

Buried sidewalls 146 made of an insulating material such as SiN are formed in the grooves 144, and the resist patterns 136 and 142 are removed (FIG. 37(a)). After that, W is deposited by sputtering, and flattening is performed by CMP. In this manner, source/drain electrodes 148a and 148b made of W are formed on the buried insulating film 132, and a gate electrode 148c made of W is formed on the HfON film 140.

After that, 1050° C. annealing is performed in vacuum, and 450° C. FGA (Foaming Gas Annealing) is performed in a $H_2$ atmosphere. Through this thermal process, W diffuses into the $TiO_2$ film 138a between the p-type Si channel 134 and the source/drain electrodes 148a and 148b, and a level in the gap in $TiO_2$ is formed in the neighborhood of 3.9 eV in work function. As W sufficiently diffuses, part of the $TiO_2$ film 138 turns into W-added $TiO_2$ films (interfacial control oxide films) 138a (FIG. 37(b)). By adjusting the annealing time and temperature, the interfacial control oxide films can become hopping-conductive films (in the range of $6\times10^{12}$ atoms/cm$^2$ to $1\times10^{14}$ atoms/cm$^2$ in the areal density of W) or band-conductive films (in the range of $1\times10^{14}$ atoms/cm$^2$ to $8\times10^{14}$ atoms/cm$^2$ in the areal density of W). Between the two types, the band-conductive films can have lower resistance as the interfacial control oxide films. In this example, approximately $2\times10^{14}$ atoms/cm$^2$ in the areal density of W is introduced, and band-conductive films are formed. At the same time, W also diffuses from the gate electrode 148c made of W into the HfON film 140, and the W-added HfON film (interfacial control oxide film) 140a is formed. By virtue of the interfacial control oxide film 140a, a level in the gap in Hf oxide is formed in the neighborhood of 4.2 eV in work function. The interfacial control oxide film 140a has both W and N introduced into the Hf oxide. Through the addition of W to the HfON film, the level in the gap is formed, and electrons are transferred from the level to the nitrogen. Accordingly, the level in the gap becomes deeper. As a result, a level in the gap is formed in the neighborhood of 4.1 eV.

Although $TiO_2$-based films are used as the Ti oxide films inserted at the interfaces, the same effects as above can be achieved with the use of $SrTiO_3$-based films.

(Modification 2)

Figure 38:
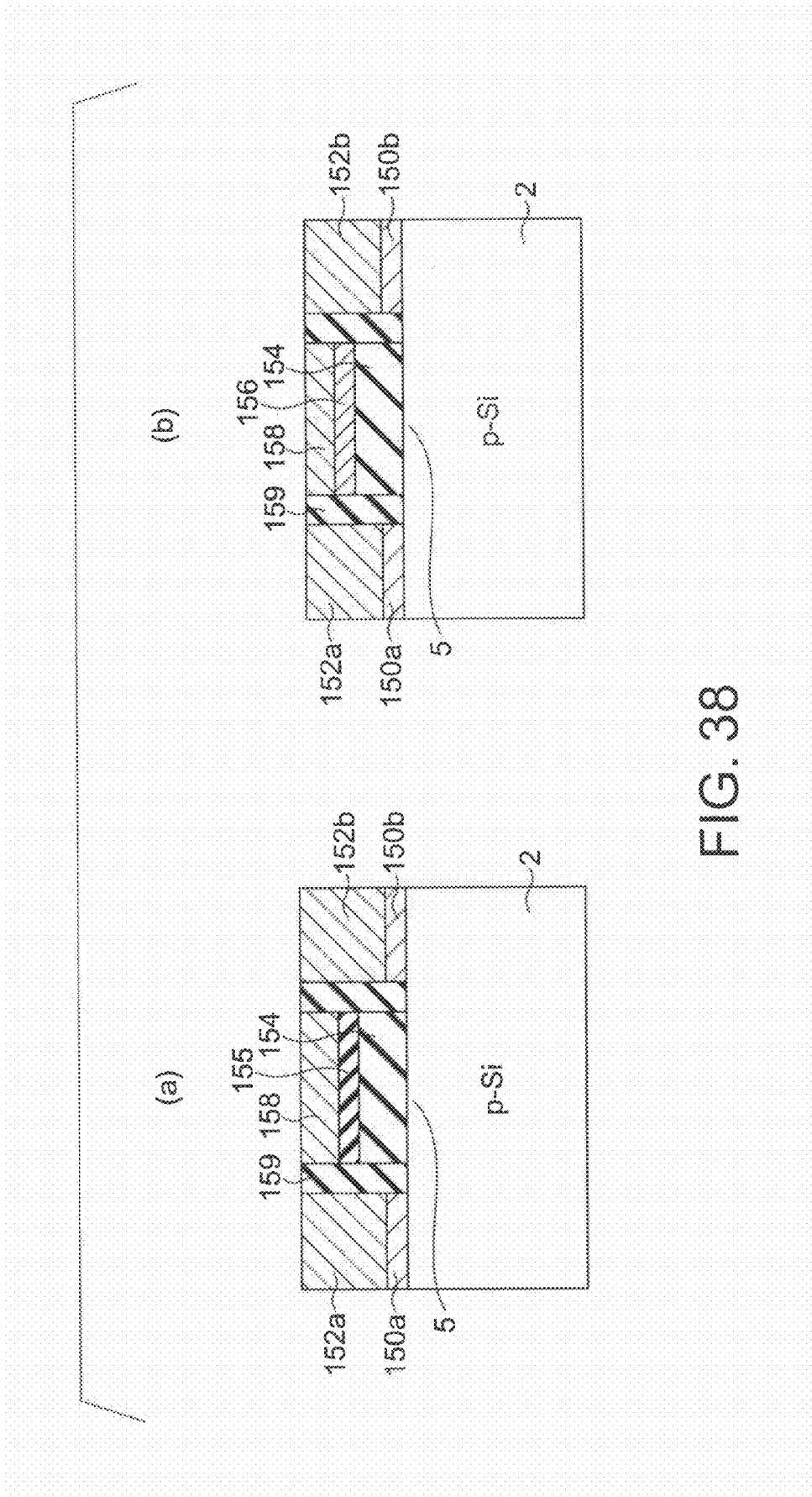
FIGS. 38(a) and 38(b) are cross-sectional views illustrating a procedure for manufacturing a semiconductor device according to Modification 2 of Example 5.

Referring now to FIGS. 38(a) and 38(b), an n-MISFET according to Modification 2 of Example 5 is described. The n-MISFET of this modification has W-added $TiO_2$ films (interfacial control oxide films) 150a and 150b inserted between a channel region 5 formed in the surface of a p-type Si substrate 2 and the source/drain (source/drain electrodes) 152a and 152b made of TiN, as shown in FIG. 38(b). A gate insulating film 154 made of HfSiON is formed on the channel region 5 located between the W-added TiO$_2$ films 150a and 150b, and a W-added TiON film (an interfacial control oxide film) 156 is formed on the gate insulating film 154. A gate electrode 158 made of TiN is formed on the interfacial control oxide film 156. By sidewalls 159 made of an insulating material, the stacked structure formed with the gate insulating film 154, the interfacial control oxide film 156, and the gate electrode 158 is insulated from the source/drain electrodes 152a and 152b.

Next, a method for manufacturing the n-MISFET of this modification is described.

First, the gate insulating film 154 made of HfSiON is formed on the p-type silicon channel 5. A W-added TiO$_2$ film is then formed on the entire surface. This W-added TiO$_2$ film is formed by simultaneously performing sputtering on the two targets of a TiO$_2$ target and a W target. After that, a photoresist is applied onto the entire surface, for example, and exposure and development are performed to form a dummy gate electrode (not shown) and dummy source/drain electrodes (not shown). At this point, patterning is also performed on the W-added TiO$_2$ film. As a result, the portions of the W-added TiO$_2$ film located under the dummy source/drain electrodes turn into the W-added TiO$_2$ films 150a and 150b, and the portion located between the gate insulating film 154 and the dummy gate electrode turns into a W-added TiO$_2$ film 155 (FIG. 38(a)). At this point, isolation grooves are formed between the dummy gate electrode and the dummy source/drain electrodes. The sidewalls 159 are then formed by filling the isolation grooves with an insulating material. After the dummy gate electrode and the dummy source/drain electrodes are removed, TiN is deposited on the entire surface, and CMP is performed on the TiN, to form the source/drain electrodes 152a and 152b made of TiN on the W-added TiO$_2$ films 150a and 150b, and the gate electrode 158 made of TiN on the W-added TiO$_2$ film 155 (FIG. 38(a)).

After that, 1050° C. annealing is performed in vacuum, and 450° C. FGA (Foaming Gas Annealing) is performed in a H$_2$ atmosphere. Through this thermal process, a level in the gap in TiO$_2$ in the W-added TiO$_2$ films 150a and 150b is formed in the neighborhood of 3.9 eV in work function. The gate insulating film 154 made of HfSiON reacts with the W-added TiO$_2$ film 155 at the interface, and the W-added TiO$_2$ film 155 turns into the W-added TiON film 156 (FIG. 38(b)). Through the addition of nitrogen, the work function of the TiON film 156 becomes as large as 4.1 eV. In the W-added TiO$_2$ films 150a and 150b that connect the source/drain regions 152a and 152b to the channel 5, the work function can be 3.9 eV. However, at the interfacial control oxide film 156 between the gate insulating film 154 and the gate electrode 158, the work function needs to be optimized by the technique according to the above described embodiment of the present invention. Prior to the formation of the gate electrode 158, the interfacial control oxide film 156 may be formed by ion implantation of an electron-accepting material such as N, or by introducing nitrogen through plasma nitridation. Even at the TiO$_2$ films 150a and 150b between the channel 5 and the source/drain electrodes 152a and 152b, nitrogen or the like can be effectively introduced to move them toward the conduction band edge of silicon. This is because it is considered that both can be optimized without a significant adjustment made on the interface between the gate insulating film and the gate electrode.

Meanwhile, in reducing the leakage in a channel-off state, a small work function is also effective in the n-MISFET. Even if Nb-added TiO$_2$ is used instead, the work function is 3.9 eV, and a high hole barrier can be formed.

The following are examples of combinations of materials of the interfacial control oxide films in this modification. With the base material being TiO$_2$, SrTiO$_3$, or Ti silicate, a level in the gap is formed by adding at least one element selected from the group consisting of Ta, W, and Nb, and the level is effectively used. By further introducing at least one of the electron-accepting materials such as N, oxide films having the optimized work function can be used as the interfacial control oxide films.

Alternatively, with the base material being TiO$_2$, SrTiO$_3$, or Ti silicate, a level in the gap is formed by adding at least one element selected from the group consisting of V, Cr, Mn, Fe, Co, Ni, Mo, Tc, Ru, Rh, Pd, Re, Os, Ir, and Pt. By further introducing at least one element selected from the group consisting of Ta, F, and H, oxide films having the optimized work function can be used as the interfacial control oxide films. Those elements can be introduced not only by the simultaneous sputtering technique, but some of the elements can be introduced from a film forming atmosphere after film formation. Also, some of the elements can be introduced by ion implantation or plasma nitridation after film formation. For example, in a case where Cr and Ta are introduced, it does not matter which one of them is introduced first. A TiTaO film may be formed first, and a Cr film is then formed on the TiTaO film, followed by thermal diffusion. The simultaneous sputtering with the use of the three targets of a Cr target, a Ta target, and a TiO$_2$ target may be performed in an Ar/O$_2$ atmosphere.

Although TiO$_2$-based films are used as the Ti oxide films inserted at the interfaces, the same effects as above can be achieved with the use of SrTiO$_3$-based films.

(Modification 3) Memory Cell

Referring now to FIGS. 39 through 42, four examples of memory cells according to Modification 3 of Example 5 are described.

Instead of the gate insulating film of a MISFET, a charge storage structure that is formed with a tunnel insulating film, a charge storage film, an insulating film, and a control electrode in this order from the substrate side can be used to form a memory cell that can store charges. With this structure, the threshold value is controlled by storing charges, and the structure can function as a memory by determining whether the channel is on or off. In this case, the power consumption can be restrained, and advantageous memory functions can be achieved by controlling the work function between the metal source/drain electrodes and the semiconductor channel and forming ohmic junctions. In the structure of the gate insulating film, the charge storage film may be a floating electrode (FG) made of n-type polycrystalline silicon, for example, or may be a trap insulating film made of silicon nitride or Ru-added SrTiO$_3$ that can store charges. The charge storage film may be interposed between a tunnel film (a film for causing charge tunneling) made of SiO$_2$ or the like and a block insulating film (or an interelectrode insulating film if the charge storage film is a FG) made of a material having a high dielectric constant, such as LaAlO$_3$, HfO$_2$, or Al$_2$O$_3$. The block insulating film should be designed to prevent the charges from escaping from the charge storage film to the electrode. Each of those films may have a stacked structure, so as to fulfill the respective roles. Particularly, with interdiffusion being taken into consideration, it is essential to form a structure resistant to diffusion between each two films. Basically, charges are introduced and released by virtue of the tunneling effect of the tunnel insulating film from the channel side. Especially, unwanted injection of charges from the control electrode made of W should be avoided. Therefore, the interface of the block insulating film on the side of the control electrode is nitrided, and a $TiO_2$ oxide film is inserted into the interface with the control electrode in this modification. A thermal process is then performed, so that the $TiO_2$ film formed at the interface turns into the TiON film having W added thereto, and has a large work function (approximately 5.7 eV, for example). In this manner, an unwanted injection of charges from the control electrode can be prevented. Also, W diffuses in the $TiO_2$ films between the p-type channel Si and the metal source/drain electrodes, and the $TiO_2$ films turn into contacts having the work function of 3.9 eV.

In a channel-off state, a large barrier of 1.27 eV (=5.17–3.9) is felt by holes. In other words, it may be considered that hole current does not flow at all in an off state. In a channel-on state, on the other hand, electrons do not feel a barrier, and flow freely. In other words, ohmic junctions are formed.

Such a structure is very effective in a memory cell of NOR type or the like that performs control operations through the contacts with the source/drain regions. In a NAND string having memory cells connected in series, contacts with the source/drain regions are only partially formed. In this structure, however, no p/n junctions exist in the cell, and there are only the metal/oxide/channel junctions. With this arrangement, a highly-functional NAND string in which current freely flows without resistance in a channel-on state but does not flow at all in a channel-off state can be obtained. Since unnecessary contact resistance is eliminated, the number of series-connected memory cells in a NAND string can be made larger than in conventional cases. By increasing the number of series-connected memory cells in each NAND string, collective erasing can be performed by a large amount accordingly. NAND strings can be stacked in a vertical direction, and the bottom one can be connected to an adjacent NAND string to form a U-shaped stacked structure. In this manner, a MOSFET for control can be formed only on one side. This is a structure that can be formed only when the number of series-connected memory cells is large. With this structure, the control region for a MOSFET or the like can be isolated from the region for storage, and various applications become possible. By conventional techniques, voltage decreases are large, and approximately 64 cells can be connected in series at a maximum. By the technique according to the embodiment of the present invention, on the other hand, there are basically no restrictions. For example, even if 1024 cells are connected in series, not a problem is caused. High-speed collective erasing becomes possible, and the power consumption is dramatically reduced.

Figure 39:
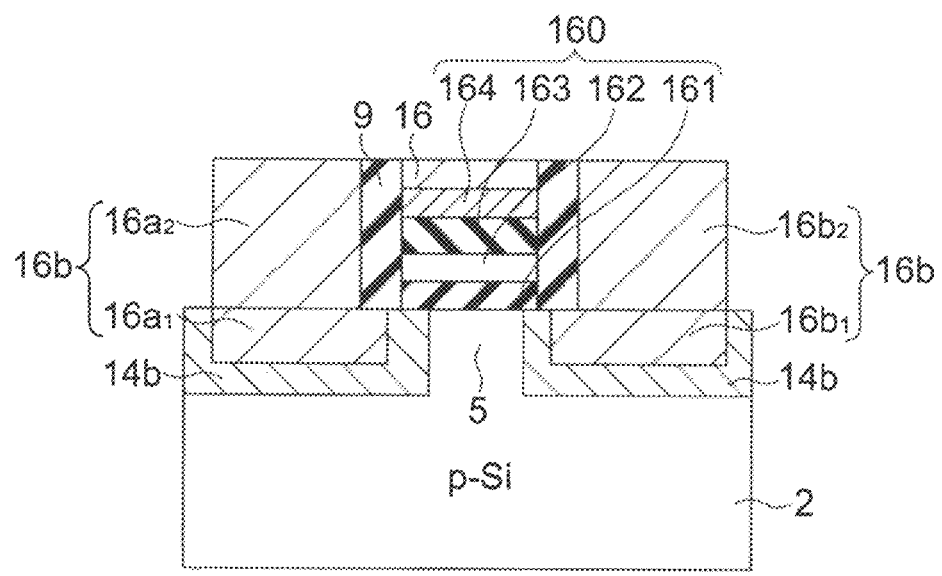
FIG. 39 is a cross-sectional view of a first example of a memory cell according to Modification 3 of Example 5.

Referring now to FIG. 39, a first example of a memory cell according to this modification is first described. The memory cell of the first example is a memory cell of a NOR flash memory, and is the same as the n-MISFET illustrated in FIG. 10(a), except that the gate insulating film 13 is replaced with a stacked film 160 formed with a tunnel insulating film 161, a charge storage film 162, a block insulating film 163, and an interfacial control oxide film 164 stacked in this order. The interfacial control oxide film 164 provided between the control electrode 16 made of W and the block insulating film 163 is a W-added TiON film. In the example illustrated in FIG. 39, W-added $TiO_2$ films 14a and 14b are provided between the source and drain $16a_1$ and $16b_1$ made of W and the p-type Si channel 5. With this arrangement, a high barrier against holes appears between the source and drain $16a_1$ and $16b_1$ and the p-type Si channel 5 in a channel-off state. Accordingly, holes do not flow in the direction of the memory cells being connected in series. In a channel-off state, ohmic junctions are formed, and electrons freely flow.

Figure 40:
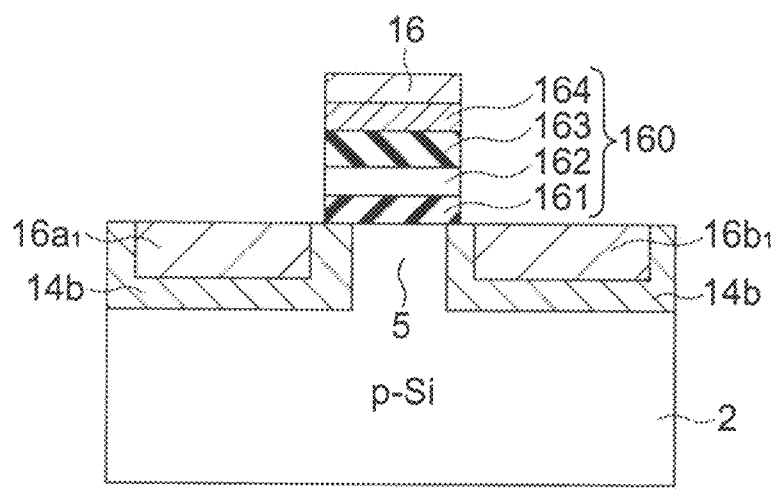
FIG. 40 is a cross-sectional view of a second example of a memory cell according to Modification 3 of Example 5.

Referring now to FIG. 40, a memory cell according to a second example of this modification is described. This memory cell of the second example is the same as the memory cell of the first example illustrated in FIG. 39, except that the source and drain $16a_2$ and $16b_2$ made of W and the sidewalls 9 are removed. This memory cell is used as a memory cell of a NAND string.

Figure 41:
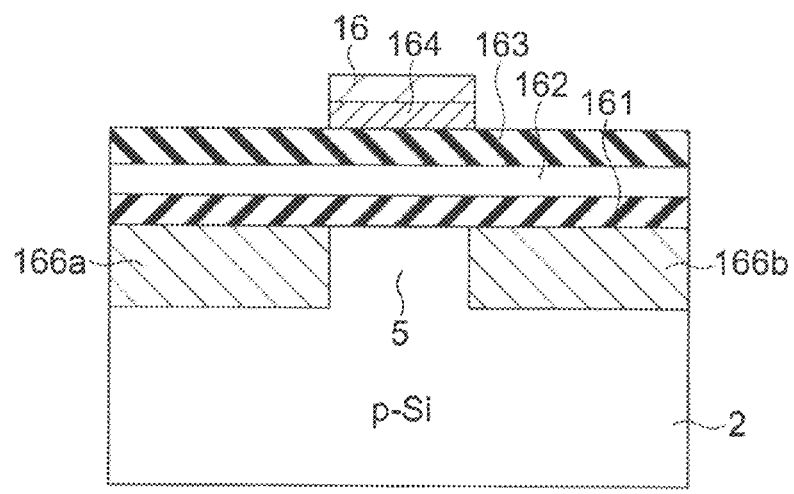
FIG. 41 is a cross-sectional view of a third example of a memory cell according to Modification 3 of Example 5.

Referring now to FIG. 41, a memory cell according to a third example of this modification is described. In this memory cell of the third example, the tunnel insulating film 161, the charge storage film 162, and the block insulating film 163 may be formed to lie on metal source/drain regions 166a and 166b. In the third example, the interfacial control oxide film 164 provided between the control electrode 16 made of W and the block insulating film 163 is a Mo-added TiON film. In this case, the effective work function of the control electrode 16 can be pinned to a position in the neighborhood of 5.6 eV as the work function. In FIG. 41, the metal source/drain regions 166a and 166b are made of W-added $TiO_2$.

The series-connected memory cells forming a NAND string are arranged so as to share the adjacent source regions or drain regions. Therefore, contacts are formed at the end portions of the NAND string, and large current flows. In view of this, to reduce the power consumption, lower contact resistance (or ohmic resistance) is essential. At the end portions, however, regular MISFETs may be used, and in such a case, the MISFETs of Example 5 should be used. Regardless of whether it is of NOR type or NAND type, the contacts with the source/drain regions should be ohmic contacts. As long as the contacts are ohmic contacts, memories of various types can be used, without concern for the power consumption at the contacts. In that sense, controlling the contact resistance is very effective.

Figure 42:
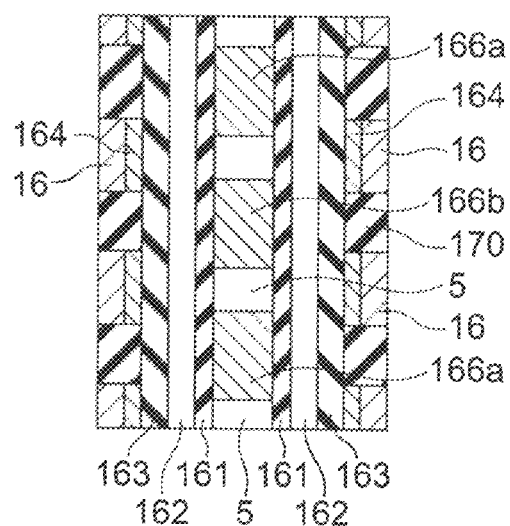
FIG. 42 is a cross-sectional view of a fourth example of a memory cell according to Modification 3 of Example 5.

NAND strings are normally formed on a substrate, but may also be stacked in a vertical direction. Referring now to FIG. 42, such arrangement is described as a fourth example of this modification. In the structure of the fourth example, the same memory cells as the memory cell illustrated in FIG. 41 are stacked in a vertical direction.

A stacked film is formed by alternately stacking p-type Si channels 5 and W-added $TiO_2$ films 166a and 166b serving as sources and drains. Patterning is then performed on the stacked film, to form a pillar-like stacked film. A tunnel insulating film 161, a charge storage film 162, and a block insulating film 163 are formed in this order, so as to surround the pillar-like stacked film. After that, Mo-added TiON films (interfacial control oxide film) 164 and control electrodes 16 made of W are formed on the block insulating film 163. Each two adjacent control electrodes 16 are insulated from each other by an insulating film 170 made of a material such as $SiO_2$. In this vertical stacked structure, NAND strings are connected in a vertical direction. When each channel is opened, the barriers against electrons (the barriers between metal and channel) become zero. Accordingly, the power consumption becomes very small, and the number of layers stacked in the vertical direction can be dramatically increased. Although 8 to 16 layers have been used conventionally, such restrictions are lifted. With the use of a vertical stacked structure having no restrictions on the number of stacked layers according to the fourth example, memories can be three-dimensionally formed freely, and the memory capacity can be dramatically increased.

Although $TiO_2$-based films are used as the Ti oxide films inserted at the interfaces, the same effects as above can be achieved with the use of $SrTiO_3$-based films.

(Modification 4) p-MISFET

Figure 43:
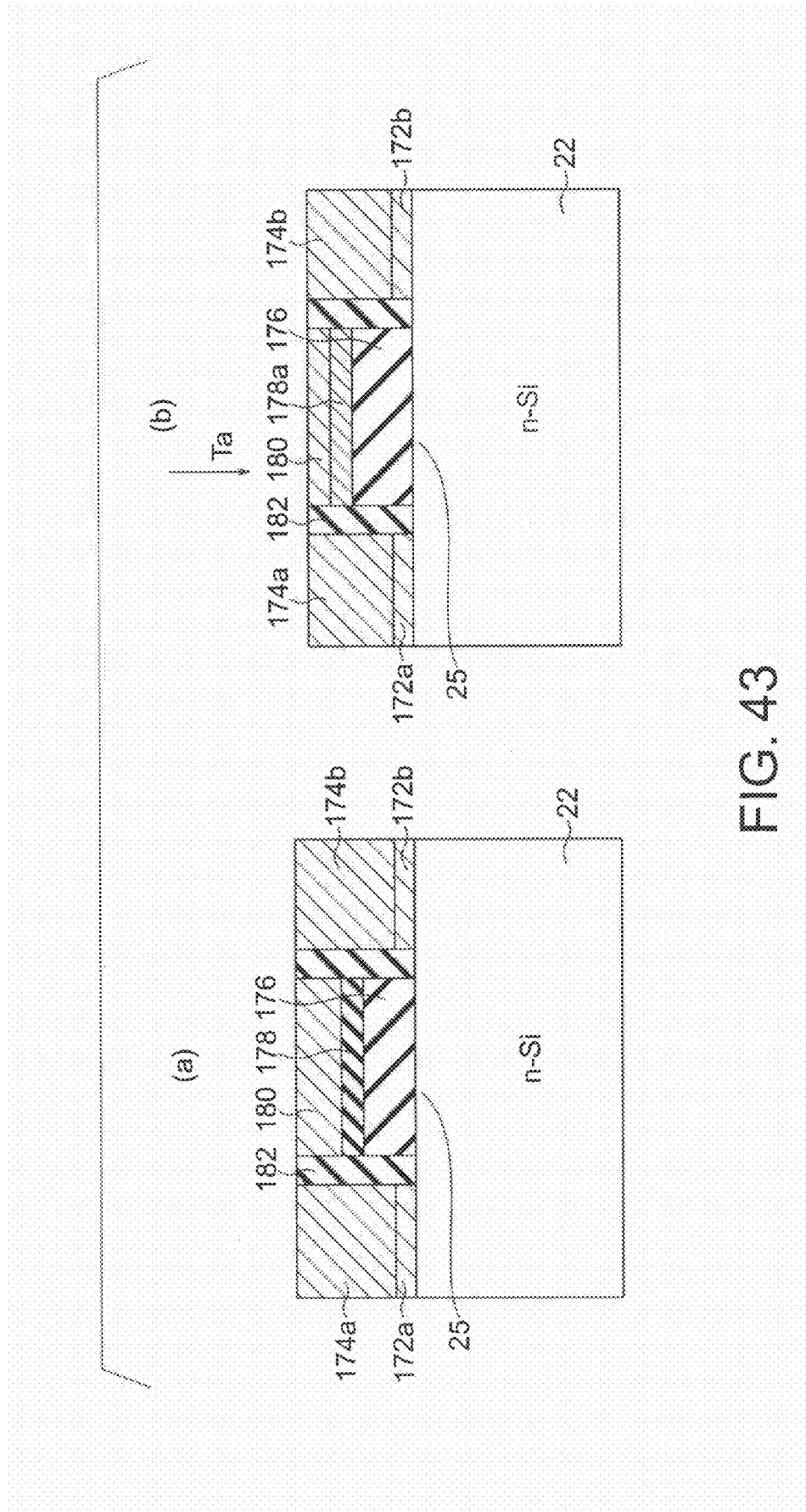
FIG. 43 is a cross-sectional view illustrating a procedure for manufacturing a semiconductor device according to Modification 4 of Example 5.

Referring now to FIGS. 43(a) and 43(b), a semiconductor device according to Modification 4 of Example 5 is described. The semiconductor device of this modification is a p-MISFET, and the procedures for manufacturing the p-MISFET are illustrated in FIGS. 43(a) and 43(b).

First, a gate insulating film 176 is formed on an n-type Si channel 25, as shown in FIG. 43(a). A V-added $TiO_2$ film is then formed on the entire surface. This V-added $TiO_2$ film is formed by simultaneously performing sputtering on the two targets of a $TiO_2$ target and a V target. After that, a photoresist is applied onto the entire surface, for example, and exposure and development are performed to form a dummy gate electrode (not shown) and dummy source/drain electrodes (not shown). At this point, patterning is also performed on the V-added $TiO_2$ film. As a result, the portions of the V-added $TiO_2$ film located under the dummy source/drain electrodes turn into V-added $TiO_2$ films 172a and 172b, and the portion located between the gate insulating film 176 and the dummy gate electrode turns into a V-added $TiO_2$ film 178 (FIG. 43(a)). At this point, isolation grooves are formed between the dummy gate electrode and the dummy source/drain electrodes. Sidewalls 182 are then formed by filling the isolation grooves with an insulating material. After the dummy gate electrode and the dummy source/drain electrodes are removed, TiN is deposited on the entire surface, and CMP is performed on the TiN, to form source/drain electrodes 174a and 174b made of TiN on the V-added $TiO_2$ films 172a and 172b, and a gate electrode 180 made of TiN on the V-added $TiO_2$ film 178 (FIG. 43(a)).

After that, 1050-° C. annealing is performed in vacuum, and 450° C. FGA (Foaming Gas Annealing) is performed in a $H_2$ atmosphere. A window (not shown) is then formed in the gate electrode 180, and Ta ions are implanted (FIG. 43(b)). Since the TiN film of the gate electrode 180 is thin, the Ta reaches the interface with the V-added $TiO_2$ film 178, and the V-added $TiO_2$ film 178 turns into a V- and Ta-added $TiO_2$ film 178a. The V-added $TiO_2$ films 172a and 172b form a level in the gap in $TiO_2$ in the neighborhood of 5.3 eV in work function. The work function of the V- and Ta-added $TiO_2$ film (interfacial control oxide film) 178a at the interface between the gate insulating film 176 made of HfSiON and the gate electrode 180 made of TiN becomes as small as 5.1 eV. At the junctions with the source/drain electrodes, the work function can be 5.3 eV. However, at the junctions between the gate insulating film 176 and the gate electrode 180, the work function should preferably be optimized by the technique according to the above-described embodiment of the present invention.

Although Ta ion implantation is performed to form the interfacial control oxide film 178a in this modification, the interfacial control oxide film 178a may be formed by ion implantation of F or H, or by introducing H through plasma hydrogenation. Even at the junctions between the channel and the source/drain electrodes, Ta or the like can be effectively introduced in the beginning, to move them toward the conduction band edge of silicon. This is because it is considered that both can be optimized without a significant adjustment made on the interface between the gate insulating film and the gate electrode.

Meanwhile, in reducing the leakage in a channel-off state, a large work function is also effective in the p-MISFET. Even if V-added $TiO_2$ is used instead, the work function is 5.3 eV, and a high electron barrier can be formed. Thus, the off-leakage does not need to be taken into consideration.

The following are examples of combinations of materials in Modification 4. With the base material being $TiO_2$, $SrTiO_3$, or Ti silicate, a level in the gap is formed by adding Nb, W, or Mo (Type-A, Type-B). By further introducing at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu, oxide films having the optimized work function can be effectively used.

Alternatively, with the base material being $TiO_2$, $SrTiO_3$, or Ti silicate, a level in the gap is formed by adding at least one element selected from the group consisting of V, Cr, Mn, Fe, Co, Ni, Mo, Tc, Ru, Rh, Pd, Re, Os, Ir, and Pt. Oxide films having the level in the gap can also be used as interfacial control oxide films. The same applies to cases where there are no second additional materials such as F. By further introducing at least one element selected from the group consisting of Ta, F, and H, oxide films having the optimized work function can be used as the interfacial control oxide films. This also applies to cases where there are second additional materials such as F. If there is a second additional material, the work function is small. Therefore, the more effective method should be selected, depending on the relationship with the interfacial control oxide film between the gate insulating film and the gate metal. The above mentioned elements can be introduced not only by the simultaneous sputtering technique, but some of the elements can be introduced from a film forming atmosphere after film formation. Also, some of the elements can be introduced through ion implantation or excited hydrogen after film formation. For example, in a case where V and Ta are introduced, it does not matter which one of them is introduced first. A TiTaO film may be formed first, and a V film is then formed on the TiTaO film, followed by thermal diffusion. The simultaneous sputtering with the use of the three targets of a V target, a Ta target, and a $TiO_2$ target may be performed in an $Ar/O_2$ atmosphere.

Although $TiO_2$-based films are used as the Ti oxide films inserted at the interfaces, the same effects as above can be achieved with the use of $SrTiO_3$-based films.

According to the above-described Examples 1 through 5 and the modifications thereof, an oxide film having its work function adjusted is inserted to each interface between a semiconductor and a metal, so as to flexibly form either a structure with low contact resistance or a structure with high contact resistance. In a structure in which current needs to flow, the resistance is adjusted to the lowest possible value, or the oxide film at each interface is adjusted so as to form an ohmic contact. By doing so, unnecessary power consumption can be avoided. In principle, unnecessary power consumption can be made almost zero. In a structure in which current should not flow, on the other hand, the oxide film at each interface is adjusted so as to form a contact that has the highest possible resistance. If a current flow can be prevented by doing so, unnecessary leakage current in a stand-by state can be restricted. Accordingly, this structure becomes more and more advantageous, as a portable device formed with this structure is used over a longer period of time.

As described so far, the following effects can be achieved by the embodiment of the present invention.

(1) At each interfacial junction between a semiconductor and a metal, the effective work function of the junction metal can be flexibly controlled.

(2) At each junction between a semiconductor (including an insulating material or a dielectric material) and a metal, the barrier can be lowered. As a result, an ohmic junction can be realized, and the power consumption can be dramatically reduced.

(3) At each junction between a semiconductor (including an insulating material or a dielectric material) and a metal, the barrier can also be made higher. By doing so, a semiconductor element having junction leakage suppressed can be realized.

For example, at each junction between the channel and the source/drain made of a metal, the leakage depends on the size of the barrier when the MISFET is in an off state. However, the off-leakage can be suppressed by increasing the size of the barrier. In a MIM capacitor, the leakage current can be dramatically reduced by increasing the size of the barrier at each junction between a semiconductor and a metal.

Although MIS structures have been described as examples in the embodiment of the present invention, the present invention is not limited to those structures, and a CMIS structure can be formed by combining a n-MIS structure and a p-MIS structure.

Although MIS structures each formed on a silicon substrate have been mainly described as examples in the embodiment of the present invention, the present invention is not limited to those structures either. For example, a silicon layer may be formed on a substrate other than a silicon substrate, such as a glass substrate, so as to form a MIS structure according to the embodiment of the present invention.

In the embodiment of the present invention, the examples of the gate insulating films of MIS structures include a stacked structure formed with a first insulating film (also referred to as a tunnel insulating film), a metal (also referred to as a FG), and a second insulating film (also referred to as an IPD), or a stacked structure formed with a first insulating film (also referred to as a tunnel insulating film), a second insulating film (also referred to as a trapping film or a charge storage film), and a third insulating film (also referred to as a blocking film). Although those structures have been described as memory cells, the present invention is not limited to those structures. For example, some of the MIS structures might have memory functions, and the threshold values which each of MIS structures has may vary. In this manner, a circuit that depends on a threshold value can be designed. For example, it is possible to design a circuit that selects a path in the following manner. When the threshold value is a first threshold value, the first path is open, while the second path is closed. When the threshold value is a second threshold value, the first path and the second path are both open. Such a circuit may be reprogrammed in a later stage by a MIS structure having a memory function.

The technique according to the embodiment of the present invention may also be applied to all compound semiconductor substrates such as Ge substrates and GaAs substrates (substrates made of Si, Ge, SiGe, SiC, GaAs, InP, InAs, GaInAs, GaN, GaInN, or the like). In such cases, only the optimum work function varies, and the structure does not change at all. In the case of a Ge substrate, for example, the optimum work function at each junction between an n-type Ge source/drain and a metal is 4.0 eV or smaller, and the optimum work function at each junction between a p-type Ge source/drain and a metal is 4.66 eV or larger. It suffices to form interfacial states should be formed at the optimum positions for the respective substrates by the technique according to the embodiment of the present invention.

At each junction between a p-type source/drain and a metal, a work function of 4.6 eV can be achieved simply by connecting the metal. Therefore, using the structure as it is can be one of the options. In other words, the technique according to the embodiment of the present invention is applied only to the junction between each n-type Ge source/drain and each metal. Likewise, at each junction between an n-type source/drain and a metal, a low contact is formed simply by connecting the metal. Therefore, using the structure as it is can also be one of the options. In other word, the technique according to the embodiment of the present invention is applied only to the junction between each metal and each p-type InP source/drain.

Furthermore, a material such as Ge, SiGe, SiC, GaAs, InP, InAs, GaInAs, GaN, or GaInN may be grown at a portion in a Si substrate, and a MISFET may be formed at the portion. In such a case, the technique according to the embodiment of the present invention may be used, based on the work function of each of the materials. For example, a Ge channel may be used as a p-MISFET, and an InP channel may be used as an n-MISFET. Here, the contact resistance can be made lower, but completely ohmic contacts can be realized by the technique according to the embodiment of the present invention.

Also, to adjust the work function between a semiconductor source/drain and source/drain metal electrodes, a first oxide film according to the embodiment of the present invention may be inserted, and a second oxide film that is equal to the first oxide film may be inserted between the gate insulating film and the gate electrode made of a metal. By doing so, it is possible to optimize both the work function between the gate insulating film and the gate electrode made of a metal, and the work function between the semiconductor source/drain and the source/drain metal electrodes. In the first oxide film, the optimum value is located outside the gap of the semiconductor (such as a Si substrate). In the second oxide film, on the other hand, the optimum value is located inside the gap of the semiconductor (such as the same Si substrate). It is desirable to make adjustments to achieve optimum values. For example, an additional material may be further introduced only to the second oxide film. If the dopant of the channel can be adjusted in the structure, this introduction of an additional material can be applied to the outside of the gap of a semiconductor. In a case where a depleted SOI substrate or the like is used, the position of a work function much closer to the inside of the semiconductor gap is the optimum value, and an adjustment independent of the first oxide film is required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device, comprising:
   a semiconductor film;
   a semiconductor source region and a semiconductor drain region formed at a distance from each other in the semiconductor film, and having a different conductivity type from the semiconductor film;
   a gate insulating film formed on a portion of the semiconductor film, the portion being located between the semiconductor source region and the semiconductor drain region;
   a gate electrode formed on the gate insulating film;
   a first and second Ti oxide films formed on the semiconductor source region and the semiconductor drain region respectively, and including at least one element selected from the group consisting of V, Cr, Mn, Fe, Co, Ni, Nb, Mo, Tc, Ru, Rh, Pd, Ta, W, Re, Os, Ir, and Pt; and
   a metal source and metal drain electrodes formed on the first and second Ti oxide films respectively.

2. The device according to claim 1, wherein
   the element included in the first and second Ti oxide films is Nb, Ta, or W, the semiconductor film is formed with a p-type semiconductor, and at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is further included in the first and second Ti oxide films.

3. The device according to claim 1, wherein the element included in the first and second Ti oxide films is an element selected from the group consisting of V, Cr, Mn, Fe, Co, Ni, Mo, Tc, Ru, Rh, Pd, Re, Os, Ir, and Pt, at least one element selected from the group consisting of F, H, and Ta is further included in the first and second Ti oxide films, and the semiconductor film is formed with a p-type semiconductor.

4. The device according to claim 1, wherein the element included in the first and second Ti oxide films is an element selected from the group consisting of Ta, Nb, W, and Mo, at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is further included in the first and second Ti oxide films, and the semiconductor film is formed with an n-type semiconductor.

5. The device according to claim 1, wherein the element included in the first and second Ti oxide films is an element selected from the group consisting of V, Cr, Mn, Fe, Co, Ni, Tc, Ru, Rh, Pd, Re, Os, Ir, and Pt, the semiconductor film is formed with an n-type semiconductor, and at least one element selected from the group consisting of F, H, and Ta is further included in the first and second Ti oxide films.

6. A semiconductor device, comprising:

a semiconductor film;

a metal source region and a metal drain region formed at a distance from each other in the semiconductor film;

a gate insulating film formed on a portion of the semiconductor film, the portion being located between the metal source region and the metal drain region;

a gate electrode formed on the gate insulating film;

a first Ti oxide film formed between the portion and the metal source region, and including at least one element selected from the group consisting of V, Cr, Mn, Fe, Co, Ni, Nb, Mo, Tc, Ru, Rh, Pd, Ta, W, Re, Os, Ir, and Pt; and a second Ti oxide film formed between the portion and the metal drain region, and including at least one element selected from the group consisting of V, Cr, Mn, Fe, Co, Ni, Nb, Mo, Tc, Ru, Rh, Pd, Ta, W, Re, Os, Ir, and Pt.

7. A semiconductor device comprising:

a semiconductor film;

a Ti oxide film formed on the semiconductor film, and including at least one element selected from the group consisting of V, Cr, Mn, Fe, Co, Ni, Nb, Mo, Tc, Ru, Rh, Pd, Ta, W, Re, Os, Ir, and Pt, the element existing in the Ti oxide film by substituting Ti in the Ti oxide film; and a metal film formed on the Ti oxide film, wherein the element included in the Ti oxide film is Nb, Ta, or W, the semiconductor film is formed with an n-type semiconductor, and at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is further included in the Ti oxide film.

8. A semiconductor device comprising:

a semiconductor film;

a Ti oxide film formed on the semiconductor film, and including at least one element selected from the group consisting of V, Cr, Mn, Fe, Co, Ni, Nb, Mo, Tc, Ru, Rh, Pd, Ta, W, Re, Os, Ir, and Pt, the element existing in the Ti oxide film by substituting Ti in the Ti oxide film; and a metal film formed on the Ti oxide film, wherein the element included in the Ti oxide film is an element selected from the group consisting of V, Cr, Mn, Fe, Co, Ni, Mo, Tc, Ru, Rh, Pd, Re, Os, Ir, and Pt, at least one element selected from the group consisting of F, H, and Ta is further included in the Ti oxide film, and the semiconductor film is formed with an n-type semiconductor.

9. A semiconductor device comprising:

a semiconductor film;

a Ti oxide film formed on the semiconductor film, and including at least one element selected from the group consisting of V, Cr, Mn, Fe, Co, Ni, Nb, Mo, Tc, Ru, Rh, Pd, Ta, W, Re, Os, Ir, and Pt, the element existing in the Ti oxide film by substituting Ti in the Ti oxide film; and a metal film formed on the Ti oxide film, wherein the element included in the Ti oxide film is an element selected from the group consisting of Ta, Nb, W, and Mo, at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is further included in the Ti oxide film, and the semiconductor film is formed with a p-type semiconductor.

10. A semiconductor device comprising:

a semiconductor film;

a Ti oxide film formed on the semiconductor film, and including at least one element selected from the group consisting of V, Cr, Mn, Fe, Co, Ni, Nb, Mo, Tc, Ru, Rh, Pd, Ta, W, Re, Os, Ir, and Pt, the element existing in the Ti oxide film by substituting Ti in the Ti oxide film; and a metal film formed on the Ti oxide film, wherein the element included in the Ti oxide film is an element selected from the group consisting of V, Cr, Mn, Fe, Co, Ni, Tc, Ru, Rh, Pd, Re, Os, Ir, and Pt, the semiconductor film is formed with a p-type semiconductor, and at least one element selected from the group consisting of F, H, and Ta is further included in the Ti oxide films.

11. The device according to claim 6, wherein the element included in the first and second Ti oxide films is Nb, Ta, or W, the semiconductor film is formed with a p-type semiconductor, and at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is further included in the first and second Ti oxide films.

12. The device according to claim 6, wherein the element included in the first and second Ti oxide films is an element selected from the group consisting of V, Cr, Mn, Fe, Co, Ni, Mo, Tc, Ru, Rh, Pd, Re, Os, Ir, and Pt, at least one element selected from the group consisting of F, H, and Ta is further included in the first and second Ti oxide films, and the semiconductor film is formed with a p-type semiconductor.

13. The device according to claim 6, wherein the element included in the first and second Ti oxide films is an element selected from the group consisting of Ta, Nb, W, and Mo, at least one element selected from the group consisting of N, C, B, Mg, Ca, Sr, Ba, Al, Sc, Y, La, Ce, Pr, Nd, Pm, Sm, Eu, Gd, Tb, Dy, Ho, Er, Tm, Yb, and Lu is further included in the first and second Ti oxide films, and the semiconductor film is formed with an n-type semiconductor.

14. The device according to claim 6, wherein the element included in the first and second Ti oxide films is an element selected from the group consisting of V, Cr, Mn, Fe, Co, Ni, Tc, Ru, Rh, Pd, Re, Os, Ir, and Pt, the semiconductor film is formed with an n-type semiconductor, and at least one element selected from the group consisting of F, H, and Ta is further included in the first and second Ti oxide films.

15. A semiconductor device, comprising:

a semiconductor film;

a Ti oxide film formed on the semiconductor film, and including at least one element selected from the group consisting of V, Cr, Mn, Fe, Ni, Nb, Mo, Tc, Ru, Rh, Pd, Ta, W, Re, Os, Ir, and Pt; and a metal film formed on the Ti oxide film.

16. The device according to claim 15, wherein the Ti oxide film includes a $TiO_2$ layer, a $La_2Ti_2O_7$ layer, or a Ti silicate layer.

17. The device according to claim 15, wherein the element included in the Ti oxide film is in the range of $6 \times 10^{12}$ atoms/$cm^2$ to $8 \times 10^{14}$ atoms/$cm^2$ in areal density.

* * * * *